United States Patent
Izawa et al.

(10) Patent No.: US 9,493,701 B2
(45) Date of Patent: *Nov. 15, 2016

(54) RED PHOSPHOR, METHOD FOR PRODUCING RED PHOSPHOR, WHITE LIGHT SOURCE, ILLUMINATING DEVICE, AND LIQUID CRYSTAL DISPLAY DEVICE

(71) Applicant: Dexerials Corporation, Tokyo (JP)

(72) Inventors: Takamasa Izawa, Tochigi (JP); Hiraku Akiho, Tochigi (JP); Tsuneo Kusunoki, Tochigi (JP); Takahiro Igarashi, Tochigi (JP); Masaki Kanno, Tochigi (JP)

(73) Assignee: Dexerials Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/329,793

(22) Filed: Jul. 11, 2014

(65) Prior Publication Data
US 2014/0320787 A1    Oct. 30, 2014

Related U.S. Application Data

(63) Continuation of application No. 13/338,592, filed on Dec. 28, 2011, now Pat. No. 8,808,578.

(30) Foreign Application Priority Data

| Dec. 28, 2010 | (JP) | ................................. 2010-293419 |
| Jan. 4, 2011 | (JP) | ................................. 2011-000264 |
| May 14, 2011 | (JP) | ................................. 2011-108873 |
| May 14, 2011 | (JP) | ................................. 2011-108874 |
| May 14, 2011 | (JP) | ................................. 2011-108876 |

(51) Int. Cl.
*C09K 11/64* (2006.01)
*C09K 11/08* (2006.01)
*C09K 11/77* (2006.01)
*F21K 99/00* (2016.01)
(Continued)

(52) U.S. Cl.
CPC ........ *C09K 11/7728* (2013.01); *C09K 11/0883* (2013.01); *C09K 11/7734* (2013.01);
(Continued)

(58) Field of Classification Search
CPC .......... C09K 11/0883; C09K 11/7734; H01L 33/502; G02F 1/133614
See application file for complete search history.

(56) References Cited

U.S. PATENT DOCUMENTS
6,686,691 B1    2/2004 Mueller et al.
8,148,887 B2    4/2012 Hirosaki et al.
(Continued)

FOREIGN PATENT DOCUMENTS
JP         2002060747 A        2/2002
JP         3931239 B2           6/2007
JP    WO 2010/002015     *    1/2010
WO       2010/002015 A1      1/2010

*Primary Examiner* — Carol M Koslow
(74) *Attorney, Agent, or Firm* — Osha Liang LLP

(57) ABSTRACT

A red phosphor of high efficiency and a method for producing it are provided. A white light source and an illumination device that allow illumination with the pure white color using the red phosphor are also provided. In addition, a liquid crystal display device using the red phosphor and exhibiting good color reproducing performance is provided. The red phosphor contains an element A, europium (Eu), silicon (Si), carbon (C), oxygen (O) and nitrogen (N) in the ratios of the numbers of atoms of the following compositional formula (1):

[Chemical Formula 1]

$[A_{(m-x)}Eu_x][Si_{(9-y)}C_y]O_nN_{[12-2(n-m)/3]}$    compositional formula (1)

where the element A is at least one of magnesium (Mg), calcium (Ca), strontium (Sr) and barium (Ba), and where m, x and n in the compositional formula (1) satisfy the relationships of $3<m<5$, $0<x<1$, $0<y<2$ and $0<n<10$ (FIG. 5A).

8 Claims, 55 Drawing Sheets

(51) Int. Cl.
*G02F 1/1335* (2006.01)
*H01L 33/50* (2010.01)

(52) U.S. Cl.
CPC .......... *F21K 9/56* (2013.01); *G02F 1/133609* (2013.01); *G02F 1/133603* (2013.01); *G02F 2001/133614* (2013.01); *H01L 33/502* (2013.01); *H01L 2224/48091* (2013.01); *H01L 2924/181* (2013.01); *Y02B 20/181* (2013.01)

(56) References Cited

U.S. PATENT DOCUMENTS

| | | | |
|---|---|---|---|
| 8,691,113 B2* | 4/2014 | Akiho | C09K 11/0883 252/301.4 F |
| 8,808,578 B2* | 8/2014 | Izawa | C09K 11/0883 252/301.4 F |
| 2011/0176084 A1 | 7/2011 | Akiho et al. | |

* cited by examiner

RED PHOSPHOR, METHOD FOR PRODUCING RED PHOSPHOR, WHITE LIGHT SOURCE, ILLUMINATING DEVICE, AND LIQUID CRYSTAL DISPLAY DEVICE

BACKGROUND OF THE INVENTION

1. Field of the Invention

This invention relates to a red phosphor and a method for producing the red phosphor. It also relates to a white light source, an illumination device and a liquid crystal display that make use of the red phosphor.

2. Description of Related Art

A white light source, formed by a plurality of light emitting diodes, is used as an illumination device and as a backlight of a liquid crystal display. Such white light source is known in which a phosphor of cerium-containing yttrium-aluminum-garnet, referred to below as YAG:Ce, is arranged on a light emitting surface of a blue light emitting diode, sometimes abbreviated herein to blue LED.

There is also known such a white light source in which green and red sulfide phosphors are arranged on a light emitting side of a blue LED. See for example a Patent Document 1. In addition, such an arrangement is proposed in which a combination of fluorescent substances is arranged on a light emitting surface of an LED radiating blue to purple color or blue color. The combination of the fluorescent substances is a mixture at preset proportions of a phosphorescent material composed of a crystal of $CaAlSiN_3$ that forms a solid solution with Mn or Eu and another phosphorescent material. See for example Patent Document 2.

RELATED TECHNICAL DOCUMENTS

Patent Documents

[Patent Document 1] Japanese laid-Open Patent Publication 2002-60747

[Patent Document 2] Japanese Patent 3931239

SUMMARY OF THE INVENTION

Problem to be Solved by the Invention

However, the while light source, in which the YAG-Ce phosphor is arranged on the light emitting surface of the blue LED, is narrow in color gamut, with the light emitted being bluish white light. It is because the emission spectrum of the YAG:Ce phosphor is devoid of a red color component. Thus, with an illumination device, formed using the white light source, it is difficult to make illumination with pure white color. On the other hand, it is difficult with this liquid crystal display that uses the white light source as a backlight to make display with good color reproducing performance.

On the other hand, with the white light source in which the green and red sulfide phosphors are arranged on the light emitting side of the blue LED, luminance is deteriorated with lapse of time because of hydrolysis of the sulfide red phosphor. Hence, it is difficult with the illumination device or the liquid crystal display formed using this white light source to make illumination or display to high quality in a manner free from deterioration in luminance.

With the white light source, making use of phosphorescent material composed of a crystal of $CaAlSiN_3$ with Mn or Eu dissolved therein as a solid solution, a labor-consuming operation is required in mixing the two sorts of the phosphorescent materials.

In view of the above depicted status of the art, it is an object of the present invention to provide a high efficiency red phosphor and a method for producing the red phosphor. It is also aimed at by the present invention to provide a liquid crystal device, a white light source and an illumination device that make use of the red phosphor to provide for pure white illumination. It is likewise aimed at by the present invention to provide a liquid crystal display making use of the red phosphor to provide for good color reproducing performance.

Means to Solve the Problem

To accomplish the above object, the present invention provides a red phosphor containing an element A, europium (Eu), silicon (Si), carbon (C), oxygen (O) and nitrogen (N) in the ratios of the numbers of atoms of the following compositional formula (1):

[Chemical Formula 1]

$$[A_{(m-x)}Eu_x][Si_{(9-y)}C_y]O_nN_{[12-2(n-m)/3]} \quad \text{compositional formula (1)}$$

where the element A is at least one of magnesium (Mg), calcium (Ca), strontium (Sr) and barium (Ba), and where m, x, y and n in the compositional formula (1) satisfy the relationships of $3<m<5$, $0<x<1$, $0<y<9$ and $0<n<10$.

The present invention also provides a method for producing a red phosphor including mixing a carbonate of the element A, europium nitride, silicon nitride and melamine to form a mixture so that the element A, europium (Eu), silicon (Si) and carbon (C) will have the ratios of the numbers of atoms according to the compositional formula (1), sintering the mixture to a sintered product, and pulverizing the sintered product.

The present invention also provides a white light source including a blue light emitting diode provided on a device substrate, and a kneaded mass arranged on the blue light emitting diode. The kneaded mass is a mass of a transparent resin obtained on kneading a red phosphor and a green phosphor together. The red phosphor contains an element A, europium (Eu), silicon (Si), carbon (C), oxygen (O) and nitrogen (N) in the ratios of the numbers of atoms according to the compositional formula (1).

The present invention provides an illumination device including a plurality of white light sources arranged on an illumination substrate. Each white light source includes a blue light emitting diode provided on a device substrate and a kneaded mass arranged on the blue light emitting diode. The kneaded mass is a mass of a transparent resin obtained on kneading a red phosphor and a green phosphor together. The red phosphor contains an element A, europium (Eu), silicon (Si), carbon (C), oxygen (O) and nitrogen (N) in the ratios of the numbers of atoms according to the compositional formula (1).

The present invention likewise provides a liquid crystal display including a liquid crystal display panel and a backlight obtained using a plurality of white light sources, in which the backlight illuminates the liquid crystal display panel. Each white light source includes a blue light emitting diode provided on a device substrate and a kneaded mass arranged on the blue light emitting diode. The kneaded mass is a mass of a transparent resin obtained on kneading a red phosphor and a green phosphor together. The red phosphor contains an element A, europium (Eu), silicon (Si), carbon (C), oxygen (O) and nitrogen (N) in the ratios of the numbers of atoms according to the compositional formula (1).

Effect of the Invention

Because of the above mentioned characteristics, the red phosphor of the present invention has an emission peak in a red wavelength band, such as in a wavelength band of 620 nm to 770 nm, and is capable of emitting red color at high efficiency.

The white light source of the present invention uses a high efficiency red phosphor. It is thus possible to generate bright white light of a broad color gamut because of three prime colors of red light of the red phosphor, green light of the green phosphor and blue light of the blue phosphor.

The illumination device of the present invention uses a white light source of high brightness and a broad color gamut. It is thus possible to make illumination of pure white color to high brightness.

The liquid crystal display of the present invention uses a white light source of high brightness and a broad color gamut as a backlight to illuminate the liquid crystal display panel. It is thus possible to obtain a pure white color of high brightness on a display picture surface of the liquid crystal display panel to render it possible to make display to high picture quality and high color representing performance.

DESCRIPTION OF PREFERRED EMBODIMENTS

Figure 1:
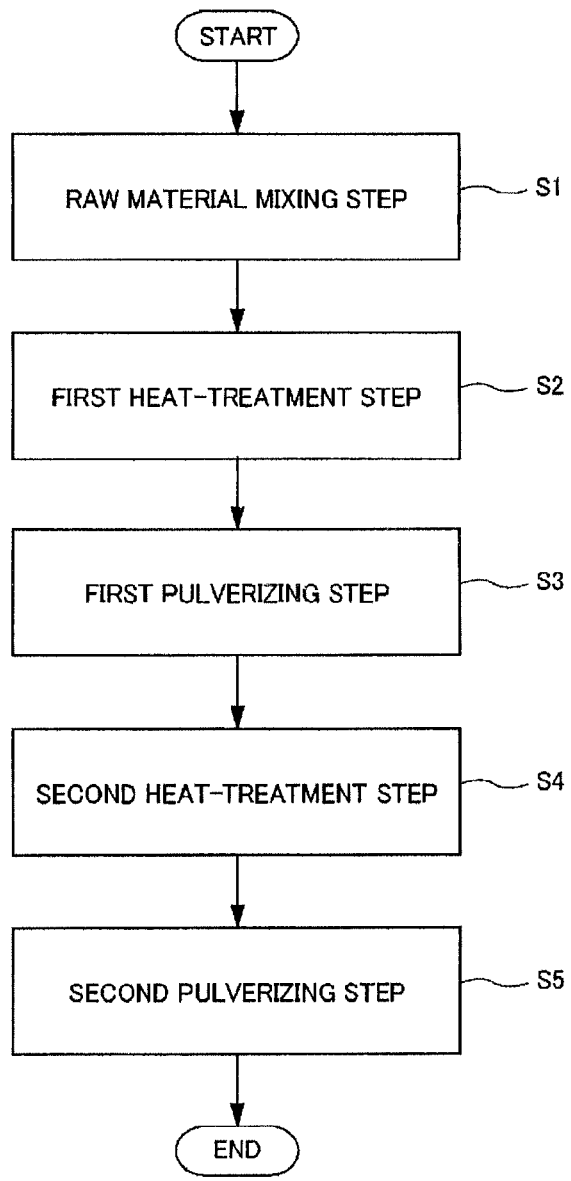
FIG. 1 is a flowchart for illustrating a method of producing a red phosphor according to an embodiment of the present invention.

Preferred embodiments of the present invention will now be described in detail, in the following order, with reference to the drawings.
1. Constitution of a red phosphor
2. Method for producing the red phosphor
3. Example constitution of a white light source
4. Example constitution of an illumination device
5. Example constitution of a liquid crystal device
6. Examples <1. Constitution of a Red Phosphor>

A red phosphor according to Example 1 of the present invention is a compound containing an element(s) A, europium (Eu), silicon (Si), carbon (C), oxygen (O) and nitrogen (N) so that these elements will have values of the ratios of the numbers of atoms as indicated by the following compositional formula:

[Chemical Formula 2]

$$[A_{(m-x)}Eu_x][Si_{(9-y)}C_y]O_nN_{[12-2(n-m)/3]} \quad \text{compositional formula (1)}$$

where the value of the ratio of the sum of the numbers of silicon and carbon atoms is fixed at 9.

In the above compositional formula (1), the element(s) A denotes at least one of magnesium (Mg), calcium (Ca), strontium (Sr) and barium (Ba), that is, the element(s) A may denote a plurality of the above elements.

In the above compositional formula (1), m, x, y and n satisfy the relationships: $3<m<5$, $0<x<1$, $0<y<9$ and $0<n<10$.

It is observed that the value of the ratio of the number of atoms $[12-2(n-m)/3]$ for nitrogen in the above compositional formula (1) has been calculated so that the sum of the values of the ratios of the numbers of atoms of the respective elements in the compositional formula (1) will be neutral. In short, given that the value of the number of atoms for nitrogen (N) in the compositional formula (1) is $\delta$ and charges of the respective elements composing the formula (1) are compensated, $2(m-x)+2x+4\times9-2n-3\delta=0$ holds. From this, the number of atoms $\delta$ for nitrogen (N) may be calculated by: $\delta=12-2(n-m)/3$.

The red phosphor, represented by the compositional formula (1), is formed by a crystal structure belonging to the orthorhombic space point group Pmn21, and contains carbon (C) as one of its constituent elements. The content of carbon performs the role of eliminating excess oxygen (O) in the process of generation thereof to control the oxygen content.

In a red phosphor according to a second embodiment of the present invention, a peak existing at a position of the angle of diffraction of 36.0° to 36.6° in an X-ray diffraction pattern of the red phosphor represented by the compositional formula (1) desirably exhibits an intensity ratio not less than 0.58 against a peak existing at a position of the angle of diffraction of 35.0° to 36.0°. With a crystal structure exhibiting such range of a peak intensity ratio, it is possible to obtain the external quantum efficiency exceeding 60%. It is observed that the difference in the peak intensity ratio means the difference in the crystal structure of the red phosphor.

The red phosphor of the second embodiment of the present invention is founded upon the information that a high quantum efficiency may be obtained if the crystal structure of the red phosphor is such that, in an X-ray diffraction pattern, the ratio of the intensity of a peak existing at a position of the angle of diffraction of 36.0° to 36.6° to that of a peak existing at a position of the angle of diffraction of 35.0° to 36.0° is of a larger value.

In the red phosphor of the second embodiment of the present invention, it is preferred that the element A contains at least calcium (Ca) and strontium (Sr), and that, with the ratio of the numbers of atoms of Ca being $\alpha$, that of the numbers of atoms of Sr being $\beta$ and that of the numbers of atoms of another element of the group II being $\gamma$, the relationships ($m=\alpha+\beta+\gamma$) and $0\leq\alpha/(\alpha+\beta)\leq0.3$ are met. The quantum efficiency may be improved in case the above relationships are met. If the content of calcium ($\alpha/(\alpha+\beta)$) exceeds 0.3, it becomes difficult to obtain a high quantum efficiency.

Also, in the red phosphor of the second embodiment of the present invention, the content (x) of europium (Eu) in the compositional formula (1) preferably satisfies a formula $0.05\leq x\leq0.15$. In the red phosphor of the second embodiment of the present invention, such range of the concentration (x) of europium (Eu) may yield a higher value of the quantum efficiency even though the peak of emission intensity of the phosphor is changed with such concentration (x) of europium (Eu).

In a red phosphor of a third embodiment of the present invention, in case the emission intensity at an excitation wavelength of 400 nm is set at 1 in a PLE (Photoluminescence Excitation) spectrum of a red phosphor represented by the compositional formula (1), a relative value of the emission intensity at an excitation wavelength of 550 nm is preferably 0.85 or less and 0.55 or more. This is founded on the information that a preset emission characteristic of the PLE spectrum has to do with the amount of carbon (C) that is required in order to obtain a satisfactory value of the emission efficiency. The high quantum efficiency may be obtained in case the relative value is in such range.

In the red phosphor of a third embodiment of the present invention, the relative value at the emission intensity at an excitation wavelength of 550 nm in case the emission intensity at an excitation wavelength of 400 nm is set at 1 in the PLE spectrum is preferably not less than 0.80 and not greater than 0.65. For such range, it is possible to obtain the external quantum efficiency exceeding 65%.

Also, in the red phosphor of the third embodiment of the present invention, the content (x) of europium (Eu) in the compositional formula (1) preferably satisfies the relationship of $0.045 \leq x \leq 0.180$. If the content (x) of europium (Eu) is less than 0.045 or exceeds 0.180, higher values of the quantum efficiency may not be obtained for the range of the relative values of 0.87 or less to 0.55 or more of the emission intensity at the excitation wavelength of 550 nm in case the emission intensity at the excitation wavelength of 400 nm in the PLE spectrum is set at 1.

In a red phosphor of a fourth embodiment of the present invention, it is preferred that the element(s) A in the compositional formula (1) are group II elements including at least calcium (Ca) and strontium (Sr). It is also preferred that, with the ratio of the numbers of atoms of Ca being $\alpha$, that of Sr being $\beta$ and that of other elements of the group II (magnesium (Mg) and barium (Ba)) being $\gamma$, $m=\alpha+\beta+\gamma$ and $0<\alpha/(\alpha+\beta)<1$ are met. With such red phosphor, the quantum efficiency may be higher than the red phosphor not containing calcium (Ca) and containing strontium (Sr) as the element A.

In a red phosphor of a fourth embodiment of the present invention, calcium $\alpha/(\alpha+\beta)$ and y are preferably such that, if $\alpha/(\alpha+\beta)$ is plotted on the abscissa and the integrated emission is plotted on the ordinate, an approximate straight line interconnecting measured values of the content of calcium and the integrated emission has a tilt positive (+) in sign. In more concrete terms, the content (y) of carbon (C) is increased with increase in the content of calcium (Ca) ($\alpha/(\alpha+\beta)$). The integrated emission may then be increased with increase in the content of calcium (Ca) ($\alpha/(\alpha+\beta)$) to provide for the positive tilt of the above mentioned approximate straight line. It may be contemplated that, with increase in the content of calcium (Ca), the amount of carbon (C) required to be contained in the phosphor to obtain the satisfactory emission efficiency is increased.

In the red phosphor of the fourth embodiment of the present invention, the relationship of $0<\alpha/(\alpha+\beta)\leq 0.2$ in the compositional formula (1) is desirably met. If the content of calcium $\alpha/(\alpha+\beta)$ exceeds 20%, it becomes necessary to increase the content of carbon (C) to arrive at high integrated emission, with the result that it becomes difficult to obtain high integrated emission.

In the red phosphor of the fourth embodiment of the present invention, the relationship of $0.012 \leq y \leq 0.10$ in the compositional formula (1) is desirably met. If the content (y) of carbon (C) exceeds 0.10, it becomes difficult to obtain high integrated emission. On the other hand, if the content (y) of carbon (C) exceeds 0.012, which is larger than a reference detection threshold of ca. 0.007 used in measuring the carbon content in the red phosphor, the effect proper to carbon, that is, the effect of improving the emission efficiency, may be achieved if adjustment is made of the ratio of carbon against that of other elements.

Also, in the red phosphor of the fourth embodiment of the present invention, the relative value of the emission intensity at an excitation wavelength of 550 nm in the PLE (Photoluminescence Excitation) spectrum, with the emission intensity at an excitation wavelength of 400 nm set at 1, is desirably 0.82 or less. The relative value of the emission intensity at the excitation wavelength of 550 nm in the PLE spectrum, with the emission intensity at the excitation wavelength of 400 nm set at 1, has to do with the amount of carbon (C) to be contained in the phosphor to obtain the satisfactory emission efficiency. A high value of integrated emission may be obtained in case the relative value is 0.82 or less and preferably 0.82 or less and 0.70 or more.

<2. Method for Producing the Red Phosphor>

The method for producing a red phosphor according to an embodiment of the present invention will now be explained with reference to a flowchart of FIG. 1.

Initially, a 'raw material mixing step' S1 is carried out, as shown in FIG. 1. In this raw material mixing step, melamine ($C_3H_6N_6$) as one of raw materials is mixed along with the raw materials containing the elements of the compositional formula (1).

As the compounds of the raw materials, inclusive of the elements that make up the compositional formula (1), carbonates of the element A, such as strontium carbonate ($SrCO_3$) or calcium carbonate ($CaCO_3$), europium nitride (EuN) and silicon nitride ($Si_3N_4$), are readied. The respective compounds are weighed out to preset molar ratios so that the elements of the compositional formula (1) contained in the raw materials readied will satisfy the ratios of the numbers of atoms of the compositional formula (1). The so weighed out compounds are mixed together to a mixture. As a flux, melamine is added at a preset ratio to the sum total of mols of strontium carbonate, europium nitride and silicon nitride.

To generate the mixture, the raw materials are mixed in an agate mortar in a glove box maintained in a nitrogen atmosphere.

A 'first heat-treatment step S2' is then carried out. In this first heat-treatment step, the above mixture is sintered to a first sintered product which is to be a precursor of the red phosphor. For example, the above mixture is charged into a crucible formed of boron nitride and heat-treated under a hydrogen ($H_2$) atmosphere. In this first heat treatment step, the heat-treatment temperature is set at, for example, 1400° C. to carry out the heat treatment for two hours. The temperature as well as the duration of heat treatment may properly be changed as long as they allow for sintering of the above mixture.

In the first heat treatment step, melamine melting at 250° C. or lower is thermally decomposed to yield carbon (C) and hydrogen (H) which are then combined with part of oxygen (O) contained in strontium carbonate to yield a carbonic gas (CO or $CO_2$) and $H_2O$. Since the carbonic gas and $H_2O$ are vaporized, part of oxygen is removed from strontium carbonate in the first sintered product. Nitrogen (N) contained in melamine decomposed prompts reduction as well as nitriding.

A 'first pulverizing step S3' is then carried out. In this first pulverizing step, the above mentioned first sintered product is pulverized to first powders. For example, the first sintered product is pulverized in the glove box, maintained in the nitrogen atmosphere, using an agate mortar. The resulting powders are passed through e.g., a #100 mesh screen, with each opening measuring ca. 200 μm, to yield the sintered product with the average particle size of 3 μm or less. By so doing, a second sintered product, generated in a second heat treatment of the next following step, tends to suffer variations in the composition only to a lesser extent.

A 'second heat-treatment step S4' then is carried out. In this second heat-treatment step, the first powders are heat-treated to a second sintered product. For example, the above mentioned first powders are charged into a crucible formed of boron nitride and heat-treated in a nitrogen ($N_2$) atmosphere. In the second heat-treatment step, the nitrogen atmosphere is pressurized at e.g., 0.85 MPa, while the heat treatment temperature is set at 1800° C., in order to carry out the heat treatment for two hours. The heat treatment temperature and time may be changed as desired as long as they allow for sintering of the first powders.

As a result of the second heat-treatment step, the red phosphor, represented by the compositional formula (1), may be obtained. The red phosphor, obtained as the second sintered product in the second heat-treatment step, is a homogeneous product represented by the compositional formula (1).

A 'second pulverizing step S5' then is carried out. In this second pulverizing step S5, the second sintered product is pulverized, using an agate mortar in a glove box maintained in a nitrogen atmosphere. The second sintered product is pulverized to an average particle size of ca. 3.5 µm, using e.g., a #420 mesh screen with an opening size of ca. 26 µm.

With the above described method for producing the red phosphor, a red phosphor in the form of fine particles with an average particle size of ca. 3.5 µm is obtained. The red phosphor is pulverized in this manner so that it may be kneaded evenly with, for example, the green phosphor to a transparent resin.

The above process may yield a red phosphor of the compositional formula (1) composed of the respective elements in accordance with the mixing ratios of the numbers of atoms in the raw material mixing step S1. This red phosphor has a peak emission wavelength in the red wavelength band, for example, the wavelength band of 620 nm to 770 nm, as may be seen from the Examples to follow.

<3. Example Constitution of a White Light Source>

A white light source according to an embodiment of the present invention will be described with reference to a schematic cross-sectional view of FIG. 2.

Figure 2:
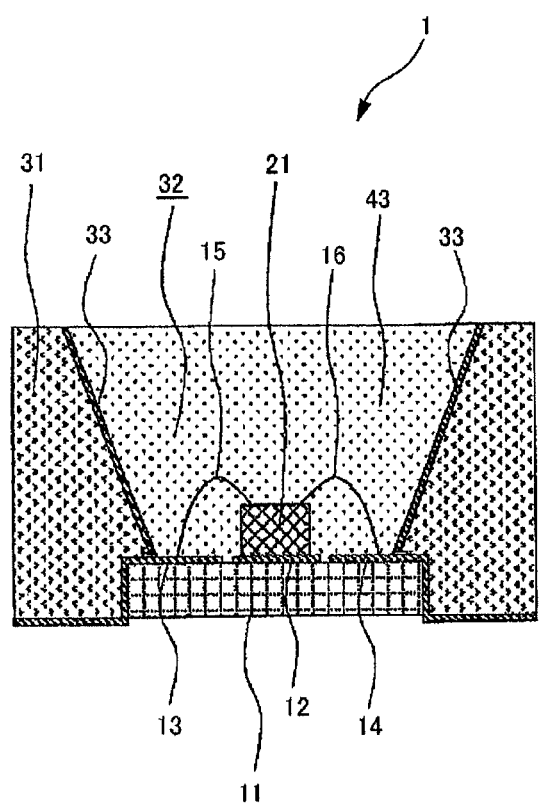
FIG. 2 is a schematic cross-sectional view showing a white light source embodying the present invention.

Referring to FIG. 2, a white light source 1 includes a blue light emitting diode 21 on a pad 12 formed on a device substrate 11. A pair of electrodes 13, 14, designed to supply power for driving the blue light emitting diode 21, are provided insulated on the device substrate 11. The electrodes 13, 14 are connected via e.g., lead wires 15, 16 to the blue light emitting diode 21.

A resin layer 31, for example, is provided around the blue light emitting diode 21, and an opening 32 to expose a region overlying the blue light emitting diode 21 is opened in the light emitting diode resin layer. The opening 32 is flared in the light emitting direction of the blue light emitting diode 21 to form an inclined surface on which there is provided a reflection film 33. In short, the resin layer 31 has the opening 32 in the form of an earthenware mortar, and a wall surface of the opening 32 is covered with the reflection film 33. The blue light emitting diode 21 is arranged on the bottom surface of the opening 32. A kneaded mass 43, a transparent resin obtained on kneading the red phosphor and the green phosphor, is embedded in the opening 32 to encapsulate the blue light emitting diode 21 to form the white light source 1.

As this red phosphor, the red phosphor represented by the above mentioned compositional formula (1) is used. This red phosphor, exhibiting the peak emission wavelength in a red color wavelength band, such as a wavelength band of 620 nm to 770 nm, has high emission intensity and high brightness. As a result, there may be obtained bright white light with a wide color gamut composed of the blue light of the blue light emitting diode, green light of the green phosphor and the red light of the red phosphor.

<4. Example Constitution of an Illumination Device>

An illumination device according to an embodiment of the present invention will now be explained with reference to a schematic plan view of FIG. 3.

Figure 3A:
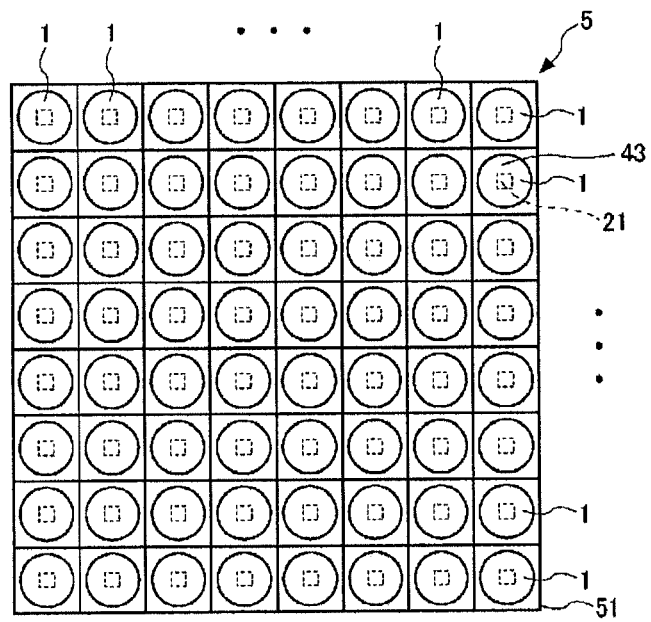
FIG. 3A is a schematic plan view showing an example illumination device having a square-shaped lattice array.
Figure 3B:
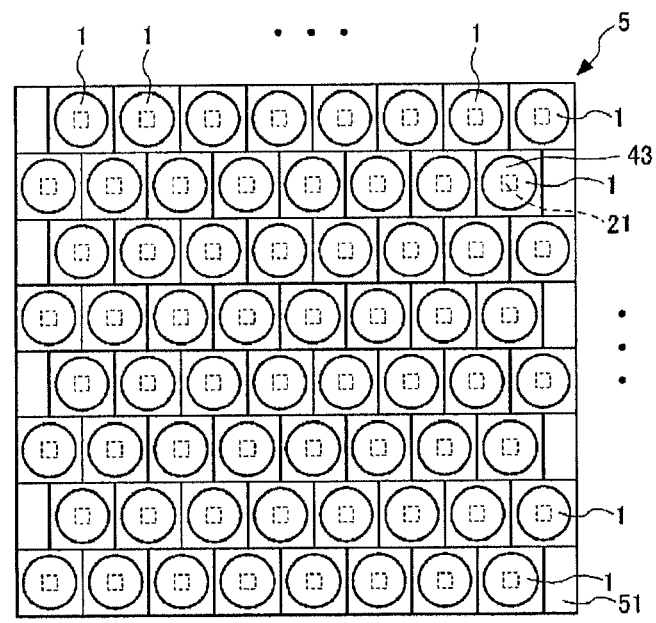
FIG. 3B is a schematic plan view showing another example illumination device having an array offset every other row.

An illumination device 5 is made up of a plurality of white light sources 1 arranged on an illumination substrate 51. Each individual white light source 1 has already been explained with reference to FIG. 2. These white light sources 1 may be arranged in a square cell configuration as shown in FIG. 3(A) or arranged with a shift of ½ pitch every other row, as shown in FIG. 3(B). The shift pitch is not limited to ½ and may also be ⅓ or ¼. The white light sources 1 may be shifted with this shift pitch every other row or every multiple rows, such as every three rows.

The white light sources 1 may also be shifted by e.g., a ½ pitch every other column, in a manner not shown. The shift pitch is not limited to ½ and may also be ⅓ or ¼. The white light sources 1 may be shifted with this shift pitch every other column or every multiple columns, such as every three columns. That is, there is no limitation to the manner of shifting the white light sources 1.

The white light source 1 is configured similarly to that described with reference to FIG. 2. That is, the white light source 1 includes the kneaded mass 43 on top of the blue light emitting diode 21, in which the kneaded mass 43 is a transparent resin obtained on kneading the red phosphor and the green phosphor. For the red phosphor, the red phosphor represented by the above mentioned compositional formula (1) may be used.

The illumination device 5 is made up of a plurality of the white light sources 1 arrayed in a matrix on the illumination substrate 51, in which each white light source is about equivalent to point emission. Hence, the illumination device is equivalent to a planar emission device, so that it may be used e.g., as a backlight of a liquid crystal display. Moreover, the illumination device 5 may be used as an ordinary illumination device, an illumination device for image pickup or as an illumination device for a site of construction works.

Since the illumination device 5 uses the white light source 1, it is possible to obtain bright white light with a broad color gamut. If the illumination device 5 is used as a backlight for a liquid crystal display, the pure white color with high brightness may be obtained on a display surface, thus improving the quality of the display surface.

<5. Example Constitution of a Liquid Crystal Device>

A liquid crystal display according to an embodiment of the present invention will now be explained with reference to a schematic view of FIG. 4.

Figure 4:
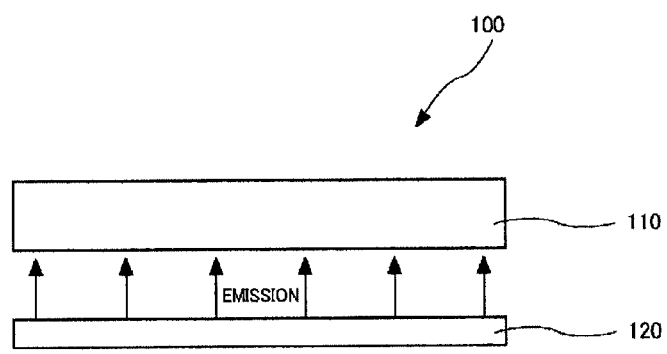
FIG. 4 is a schematic side view showing a liquid crystal display embodying the present invention.

Referring to FIG. 4, a liquid crystal device 100 includes a liquid crystal display panel 110, having a transparent display part, and a backlight 120 arranged on a back side (side opposite to the display surface) of the liquid crystal display panel 110. For this backlight 120, the illumination device 5 already described with reference to FIGS. 3A and 3B is used.

Since the liquid crystal device 100 uses the above mentioned illumination device 5 as the backlight 120, it is possible to obtain the pure white light of high brightness and a broad color gamut derived from the three prime colors of light on the display surface of the liquid crystal device 100, thus improving the color reproduction performance as well as the quality of the display surface.

EXAMPLES

Certain Examples of the present invention will now be described. In these Examples, a plurality of red phosphor samples with different compositions were prepared, and evaluation was made of their quantum efficiency, integrated emission, emission intensity, peak wavelengths, luminance and PLE (Photoluminescence Excitation) spectra, provided that the present invention is not limited to these Examples.

6.1 Example 1

Preparation of Red Phosphor Samples

A red phosphor sample containing the element A, europium (Eu), silicon (Si), carbon (C), oxygen (O) and nitrogen (N) in the following ratios of the numbers of atoms was prepared in accordance with the sequence explained using the flowchart shown in FIG. 1:

[Chemical Formula 3]

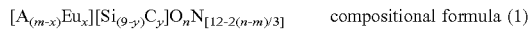

$$[A_{(m-x)}Eu_x][Si_{(9-y)}C_y]O_nN_{[12-2(n-m)/3]} \quad \text{compositional formula (1)}$$

In the above chemical formula (1), the element A is strontium (Sr), and m, x, y and n satisfy the relationships: $3<m<5$, $0<x<1$, $0<y<9$ and $0<n<10$.

Initially, the 'raw material mixing step' S1 was carried out. Here, strontium carbonate ($SrCO_3$), europium nitride (EuN), silicon nitride ($Si_3N_4$) and melamine ($C_3H_6N_6$) were readied. The raw compounds, thus readied, were weighed and mixed together in an agate mortar in a glove box maintained in a nitrogen atmosphere.

The 'first heat-treatment step' S2 was then carried out. Here, the above mentioned mixture was charged into a crucible of boron nitride and heat-treated at 1400° C. for two hours in a hydrogen ($H_2$) atmosphere to a first sintered product.

The 'first pulverizing step" S3 was then carried out. Here, the above mentioned first sintered product was pulverized in the glove box, maintained in the nitrogen atmosphere, using an agate mortar. The resulting pulverized mass was then passed through a #100 mesh screen, with an opening of ca. 200 μm, to powders of the first sintered product with an average particle size not greater than 3 μm.

The 'second heat-treatment step' S4 was then carried out. Here, the powders of the first sintered product were charged into a crucible of boron nitride and heat-treated at 1800° C. for two hours in an atmosphere of nitrogen ($N_2$) at 0.85 MPa to a second sintered product.

The 'second pulverizing step" S5 was then carried out. Here, the above mentioned second sintered product was pulverized in the glove box, maintained in the nitrogen atmosphere, using an agate mortar. The resulting pulverized mass was then passed through a #420 mesh screen, with an opening of ca. 26 μm, to fine powders with an average particle size of ca. 3.5 μm.

A red phosphor sample in the form of fine powders with an average particle size of ca. 3.5 μm could be obtained by the above process. The red phosphor sample was analyzed by an ICP (Inductively Coupled Plasma) emission analyzer. It was found that the elements of the compositional formula (1), contained in the compounds as the raw materials, were present in the red phosphor sample in approximately the same molar ratios (ratios of the numbers of atoms).

Figure 5A:
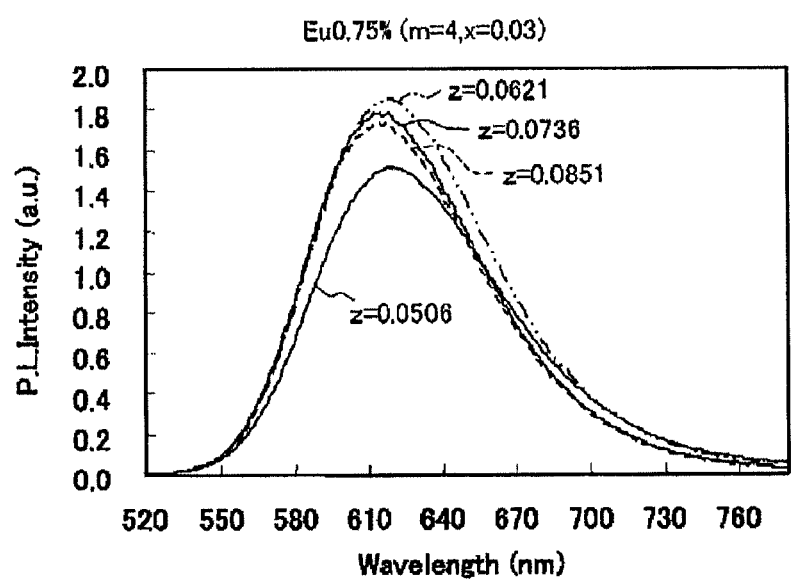
FIG. 5A is a graph showing emission spectra as measured of red phosphor samples with the content of europium (Eu) of 0.75% (m=4, x=0.03).
Figure 5B:
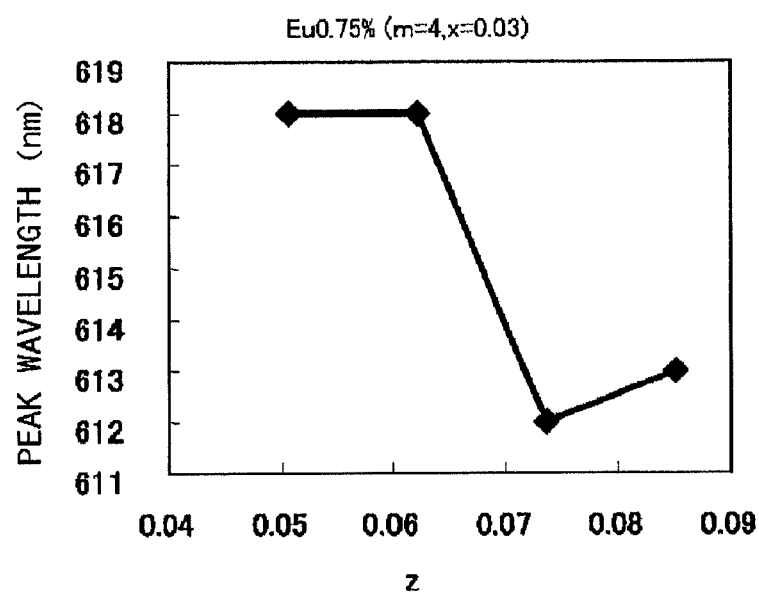
FIG. 5B is a graph showing a peak wavelength as read out from the emission spectrum of each red phosphor sample.
Figure 6A:
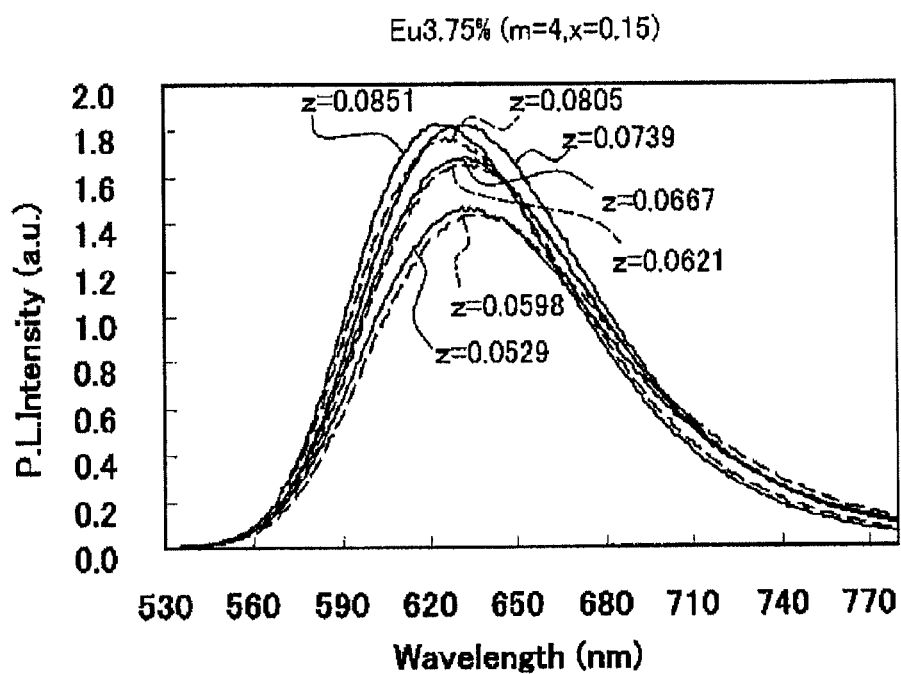
FIG. 6A is a graph showing emission spectra as measured of red phosphor samples with the content of europium (Eu) of 3.75% (m=4, x=0.15).
Figure 6B:
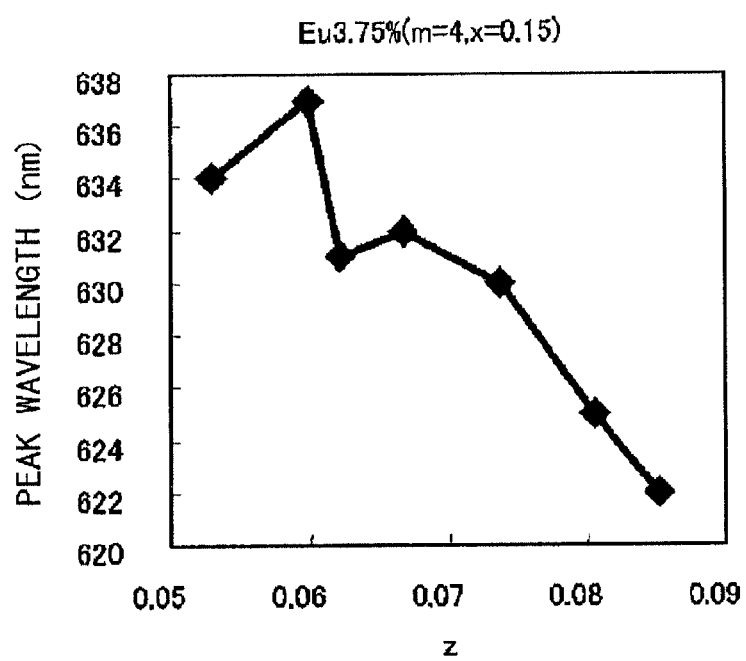
FIG. 6B is a graph showing peak wavelengths as read out from the emission spectrum of each red phosphor sample.

FIG. 5A shows emission spectra as measured of the red phosphor samples with the europium (Eu) contents of 0.75% (m=4, x=0.03). FIG. 5B shows peak wavelengths as read out from the emission spectra of the red phosphor samples with the contents of europium (Eu) of 0.75%. FIG. 6A shows emission spectra as measured of the red phosphor samples with the europium (Eu) contents of 3.75% (m=4, x=0.15). FIG. 6B shows peak wavelengths as read out from the emission spectra of the red phosphor samples with the contents of europium (Eu) of 3.75%. In the red phosphor samples of the compositional formula (1), as measured, strontium (Sr) was used as the element A, the contents of europium (Eu) were fixed at the values stated and the contents of carbon were at the values stated. Measurement was conducted using SPEC Fuorolog-3 manufactured by JOBIN YVON as excitation light at 450 nm was irradiated.

It is seen from FIGS. 5A, 5B, 6A and 6B that, with the red phosphor samples within the range of the compositional formula (1), the emission spectra are varied with the contents of the carbon (C), even though the content of europium (Eu) relevant with the emission intensity is fixed. The variation of the emission spectra is approximately such that the peak wavelength tends to become shorter the larger the contents of carbon (C). It may thus be confirmed that the emission wavelength may be controlled with the content of carbon (C). Hence, the emission wavelength of each red phosphor sample of the compositional formula (1) may be controlled as the emission intensity is maintained without decreasing the europium content.

Figure 7A:
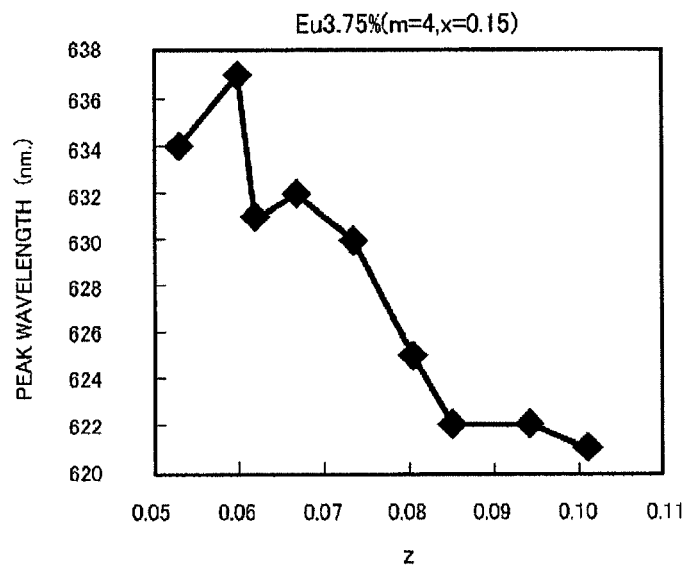
FIG. 7A is a graph showing peak wavelengths of the emission spectra as measured of red phosphor samples with the content of europium (Eu) of 3.75% (m=4, x=0.15).
Figure 7B:
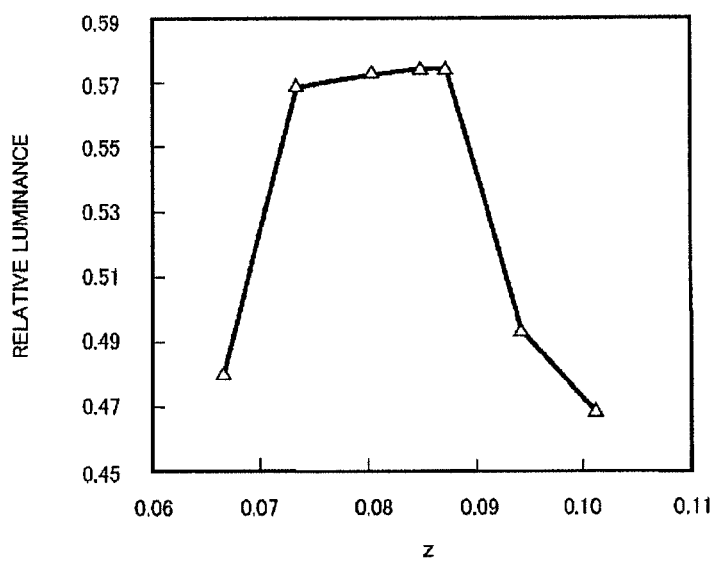
FIG. 7B is a graph showing the luminance as read out from the peak intensity of the emission spectrum of each red phosphor sample.

FIG. 7A shows the peak wavelengths of the emission spectra as measured with the red phosphor samples with the content of europium (Eu) of 3.75% (m=4, x=0.15). FIG. 7B shows the luminance as calculated from the peak intensity of the light emission spectrum of each red phosphor sample with the content of europium (Eu) of 3.75% (m=4, x=0.15). In the red phosphor samples of the compositional formula (1), as measured, strontium (Sr) was used as the element A, the contents of europium (Eu) were fixed at the values stated and the contents of carbon were at the values stated. Measurement was conducted using SPEC Fuorolog-3 manufactured by JOBIN YVON as excitation light at 450 nm was irradiated.

It is seen from the graph of FIGS. 7A and B that, if, with the red phosphor samples within the range of the compositional formula (1) [m=4, x=0.15], the relative luminance to YAG can be maintained at ca. 0.57 if the range of the ratio of the numbers of atoms (z) of carbon (C) is such that $0.073<z<0.088$.

Figure 8:
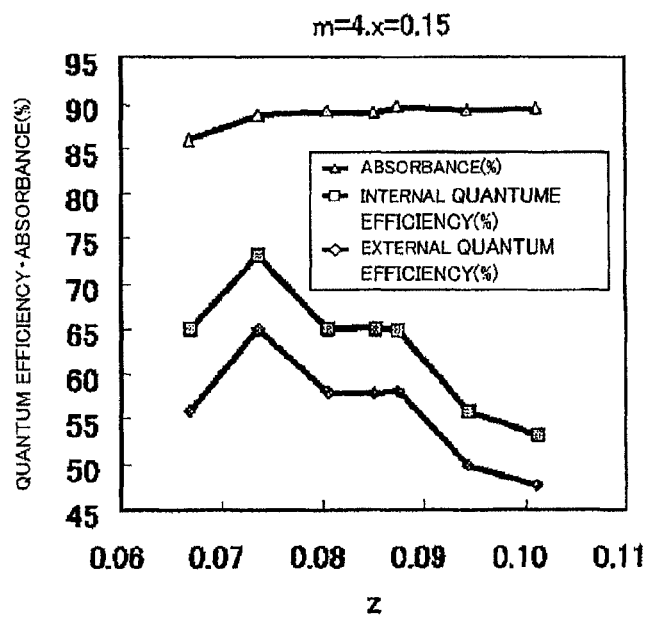
FIG. 8 is a graph showing the relationship between the absorbance and the quantum efficiency at a wavelength of 450 nm of each red phosphor sample of the compositional formula (1).

FIG. 8 shows the absorbance, the internal quantum efficiency and the external quantum efficiency for blue excitation light of the wavelength of 450 nm of red phosphor samples of the compositional formula (1) that use strontium (Sr) as the element A.

It is seen from the graph of FIG. 8 that the quantum efficiency of each red phosphor sample within the range of the compositional formula (1) undergoes variations with the content of carbon (C) even though the absorbance to the blue excitation light is of approximately the same level. These variations are such that the internal quantum efficiency and the external quantum efficiency tend to be lowered as the content of carbon (C) increases beyond a peak value of the carbon content as the boundary. With the red phosphor samples within the range of the compositional formula (1) shown in FIG. 8 [m=4, x=0.15], emission with the internal quantum efficiency not lower than 60% and with the external quantum efficiency not lower than 55% could be obtained for the range of the ratio (z) of the numbers of atoms of $0.065<z<0.09$.

Figure 9:
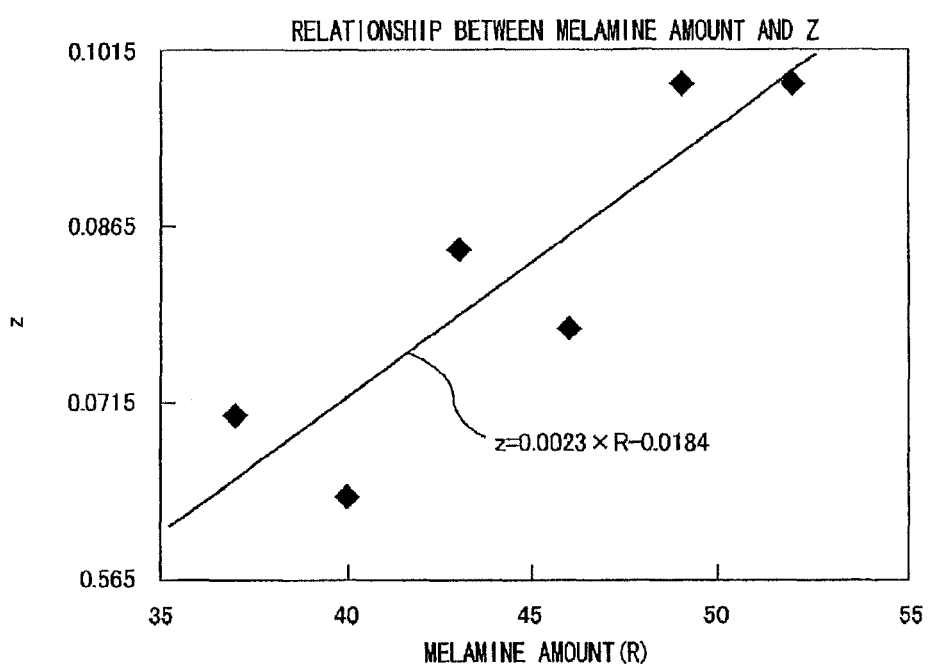
FIG. 9 is a graph showing the relationship between the amount of addition of melamine used at the time of preparation of each red phosphor sample of the compositional formula (1) and the content of carbon (C) in the red phosphor sample prepared.

FIG. 9 shows the result of ICP analysis of the content of carbon (C) (ratio z of the numbers of atoms) of each red phosphor sample in relation to the amounts R of melamine addition at the time of preparation. FIG. 9 also shows, along with measured values, a straight regression line as obtained from the measured values. It is seen from FIG. 9 that the ratio z of the numbers of atoms of carbon (C) in each red phosphor sample of the compositional formula (1) is approximately proportionate to the amounts R of melamine addition at the time of preparation. Meanwhile, the measured values of carbon concentration, obtained with the ICP analysis, may not be said to be sufficiently high. Hence, the 'ratio z of the numbers of atoms' of carbon (C) shown in FIGS. 5-8 has been obtained by fitting the amounts of addition R of melamine used at the time of preparation of each red phosphor sample to the straight regression line of FIG. 9.

[Structure of the Red Phosphor Sample]

Figure 10:
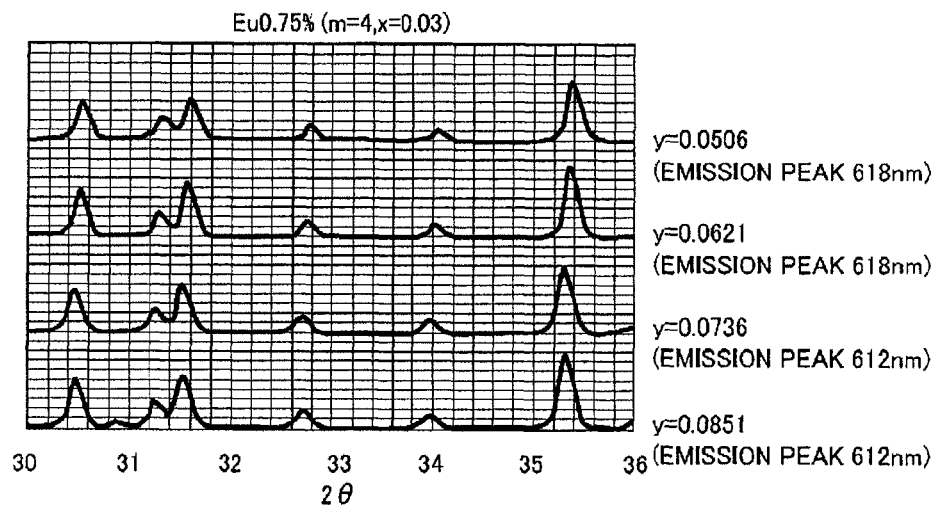
FIG. 10 is a graph showing spectra of XDR analysis of red phosphor samples of the compositional formula (1).
Figure 11:
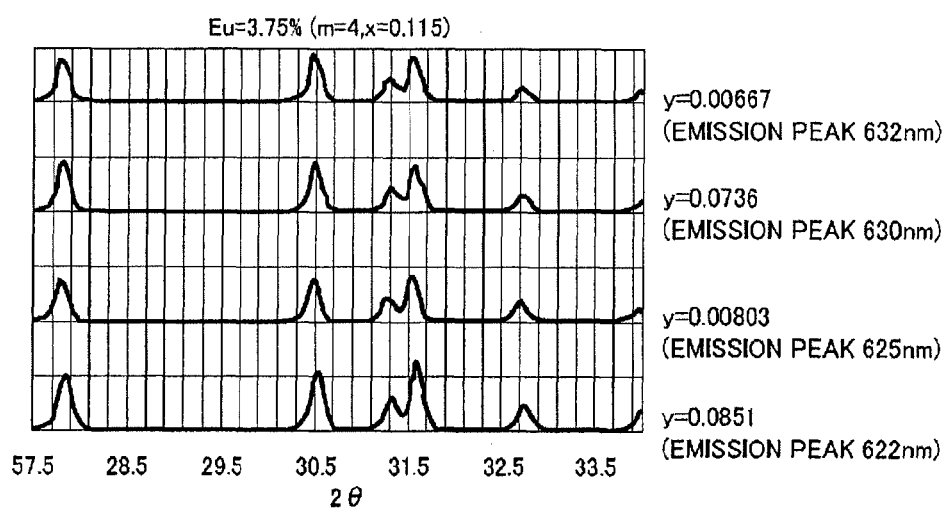
FIG. 11 is a graph showing spectra bis of XDR analysis of red phosphor samples of the compositional formula (1).

FIGS. 10 and 11 show the result of XDR analysis of each red phosphor sample of the compositional formula (1). It is seen from these figures that the peak position appearing at each angle of diffraction (2θ) is shifted with the content of carbon (C) (ratio of the numbers of atoms z). For example, the peak in the vicinity of the diffraction angle 2θ=35.3 shifts in the direction of the decreasing diffraction angle of (2θ) with increase in the content of carbon (C) (ratio of the numbers of atoms z), after which the peak shifts in the direction of the increasing angle of diffraction (2θ).

From the results shown in FIGS. 10 and 11, it has been shown that, with each red phosphor sample of the compositional formula (1), the axis (a) and the axis (c) in the orthorhombic space point group PM21 are expanded and contracted with the content of carbon (C) (ratio of the numbers of atoms z), thus producing expansion and contraction of the cell volume. It is observed however that the axis (b) is scarcely changed.

From this it may be seen that carbon (C) present in the red phosphor sample constitutes a portion of the above mentioned single crystal such as to change the cell or lattice interval in a single crystal. In short, it has been confirmed that, in the red phosphor sample composed of the single crystal, carbon (C) exists such as to constitute part of the single crystal. On the other hand, the red phosphor sample prepared showed good coincidence with a model of the orthorhombic space point group Pmn21 established by Rietveld analysis.

It is observed that these results are obtained with the red phosphor sample (α=0) not containing calcium (Ca) in the compositional formula (1). However, similar results could be obtained with a calcium (Ca) containing red phosphor sample (α>0).

Figure 12:
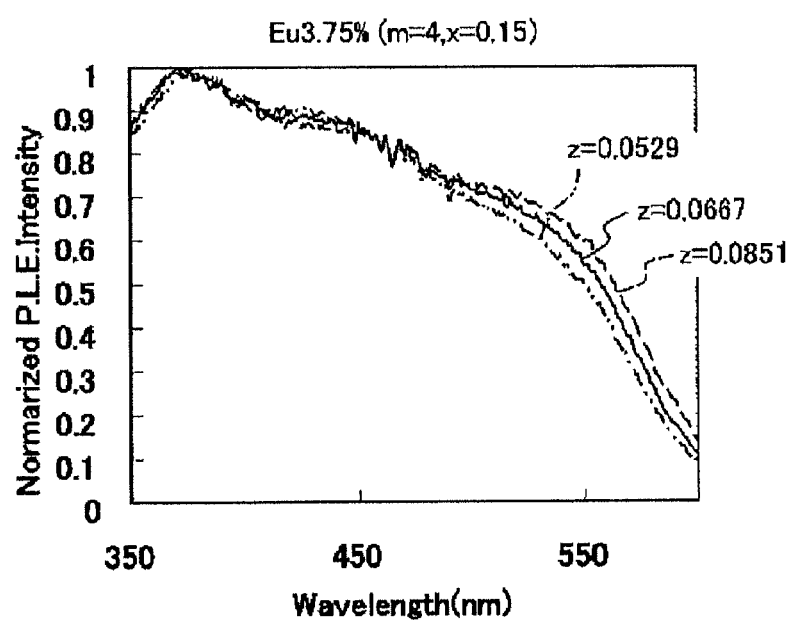
FIG. 12 is a graph showing emission peaks against the excitation wavelength of red phosphor samples of the compositional formula (1).

FIG. 12 shows emission peaks for excitation wavelengths of the red phosphor samples of the compositional formula (1). These emission peaks are shown as relative values in which the maximum peak value for each red phosphor sample is set at 1. It is seen from the figure that the emission peak for an excitation wavelength is varied with changes in the content of carbon (C). By such changes in the emission characteristic, it has been confirmed that carbon (C) present in the red phosphor sample forms a portion of the single crystal such that the cell or lattice interval in the single crystal is changed.

6.2 Example 2

Preparation of Red Phosphor Samples

A red phosphor sample containing the element A, europium (Eu), silicon (Si), carbon (C), oxygen (O) and nitrogen (N) in the following ratios of the numbers of atoms of the following compositional formula (1):

[Chemical formula 4]

$[A_{(m-x)}Eu_x][Si_{(9-y)}C_y]O_nN_{[12-2(n-m)/3]}$    compositional formula (1)

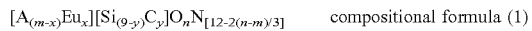

was prepared in the following manner in accordance with a sequence of operations explained using the flowchart shown in FIG. 1.

It is observed that, in the compositional formula (1), the element A is the element(s) of the group II at least containing calcium (Ca) and strontium (Sr). Also, in the compositional formula (1), m, x, y and n satisfy the relationship: $3 \leq m \leq 5$, $0 < x < 1$, $0 < y < 1$ and $0 < n < 10$. Also, with a ratio α of the numbers of atoms of Ca, a ratio β of the numbers of atoms of Sr and with a ratio γ of the numbers of atoms of another atom of the group II, $m=\alpha+\beta+\gamma$ is to be satisfied.

Initially, the 'raw material mixing step' S1 was carried out. Here, calcium carbonate (CaCO$_3$), strontium carbonate (SrCO$_3$), europium nitride (EuN), silicon nitride (Si$_3$N$_4$) and melamine (C$_3$H$_6$N$_6$) were readied. The raw compounds, thus readied, were weighed and mixed together in an agate mortar in a glove box maintained in a nitrogen atmosphere.

The 'first heat-treatment step' S2 was then carried out. Here, the above mentioned mixture was charged into a crucible of boron nitride and heat-treated at 1400° C. for two hours in a hydrogen (H$_2$) atmosphere to a first sintered product.

The 'first pulverizing step" S3 was then carried out. Here, the above mentioned first sintered product was pulverized in the glove box, maintained in the nitrogen atmosphere, using an agate mortar. The resulting pulverized mass was then passed through a #100 mesh screen, with an opening of ca. 200 μm to powders of the first sintered product with an average particle size not greater than 3 μm.

The 'second heat-treatment step' S4 was then carried out. Here, the powders of the first sintered product were charged into a crucible of boron nitride and heat-treated at 1800° C. for two hours in an atmosphere of nitrogen (N$_2$) at 0.85 MPa to a second sintered product.

The 'second pulverizing step' S5 was then carried out. Here, the above mentioned second sintered product was pulverized in the glove box, maintained in the nitrogen atmosphere, using an agate mortar. The resulting pulverized mass was then passed through a #420 mesh screen, with an opening of ca. 26 μm, to fine powders with an average particle size of ca. 3.5 μm.

A red phosphor sample in the form of fine powders with an average particle size of ca. 3.5 μm could be obtained by the above process. In the red phosphor sample, analysis of the element A, Eu and Si was made by an ICP (Inductively Coupled Plasma) emission analyzer, while analysis of C was made by an ICP emission analyzer and by an in-oxygen-stream combustion-NDIR detection system (a device EMIA-U511 manufactured by HORIBA, Ltd.).

This red phosphor sample was analyzed by the ICP emission analyzer. It was confirmed that the element A, Eu, Si and Al were contained in about the same molar ratios (the ratios of the numbers of atoms) in the red phosphor.

The content (y) of carbon in the red phosphor was analyzed by the ICP emission analyzer and by the in-oxygen-stream combustion-NDIR detection system. It was thus found that the relationship $0<y<1$ was met and that the content (y) increased with the amount of melamine added. The minimum value of the content (y) of carbon was 0.012.

[Evaluation of an X-Ray Diffraction Pattern and the Quantum Efficiency Against the Amount of Addition of Melamine and Calcium Content]

For each red phosphor sample, the X-ray diffraction pattern and the quantum efficiency were measured for varying values of the amount of melamine added and the calcium content. As for the X-ray diffraction pattern, an X-ray diffraction pattern of Cu—K α-rays was checked using a powder X-ray analyzer manufactured by Rigaku Corporation. The quantum efficiency was measured using a spectrofluorometer manufactured by JASCO Corporation under the trade name of EP-6500. The spectrum of fluorescent light was measured as the blue excitation light with a wavelength of 450 nm was illuminated to phosphor powders charged in a dedicated vessel. From the measured results, the quantum efficiency for red light was calculated using the quantum efficiency measurement software annexed to the spectrofluorometer. The efficiency of the phosphor is expressed in three ways, that is, in terms of the efficiency in absorbing the excitation light (absorbance), the efficiency of converting the excitation light absorbed into phosphorescent light (internal quantum efficiency) and the efficiency which is the product of the above two efficiencies, that is, the efficiency of converting the excitation light into phosphorescent light (external quantum efficiency). Of these, the external quantum efficiency is of utmost importance. Here, the external quantum efficiency, as the efficiency of utmost importance, was calculated.

<In Case the Calcium Content ($\alpha/(\alpha+\beta)$)=0>

Figure 13:
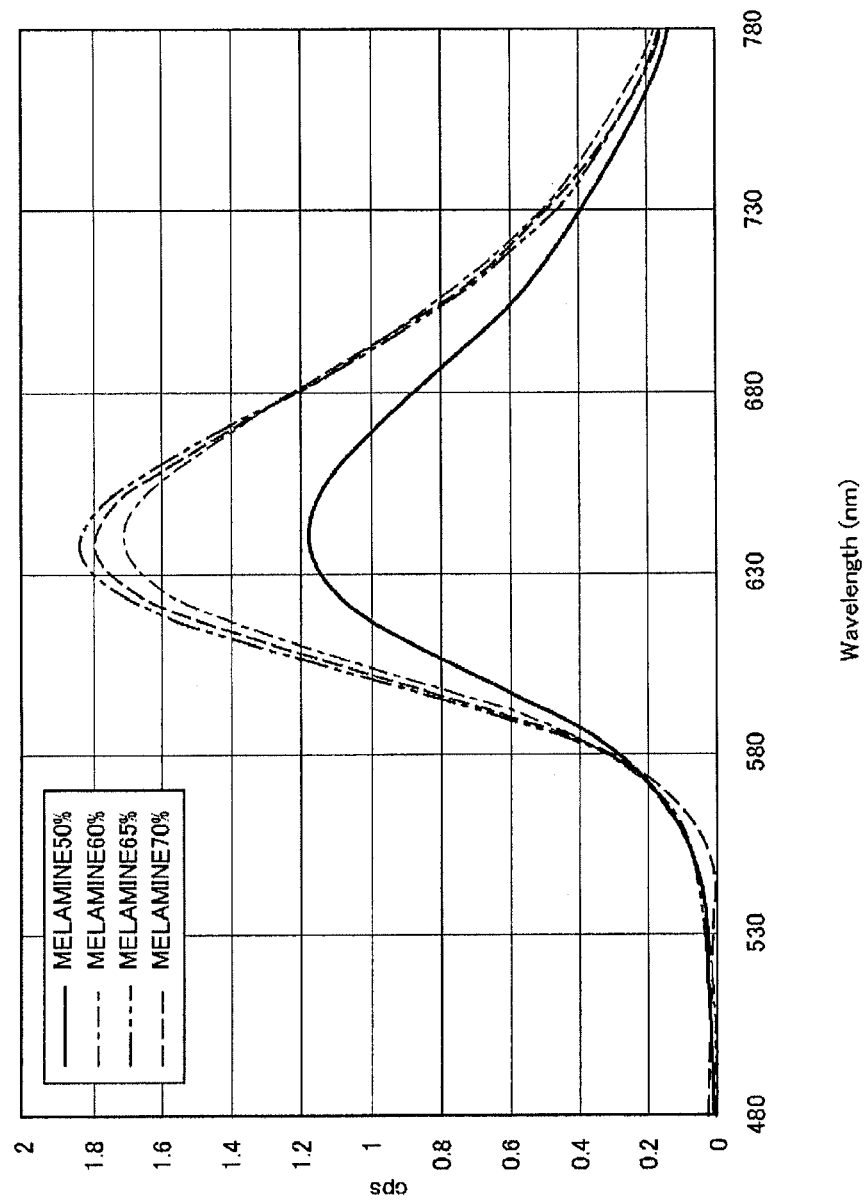
FIG. 13 is a graph showing emission spectra of red phosphor samples with varying amounts of addition of melamine.

FIG. 13 shows changes in the emission spectrum of the red phosphor in case the amount of addition of melamine is changed. Specifically, FIG. 13 shows the results obtained from each red phosphor sample (m=3.6, Eu concentration (x)=0.135, $\gamma$=0), with the calcium content ($\alpha/(\alpha+\beta)$) being zero. As may be seen from FIG. 13, the emission intensity increases with increase in the amount of melamine added, with the emission shifting towards right.

Figure 14:
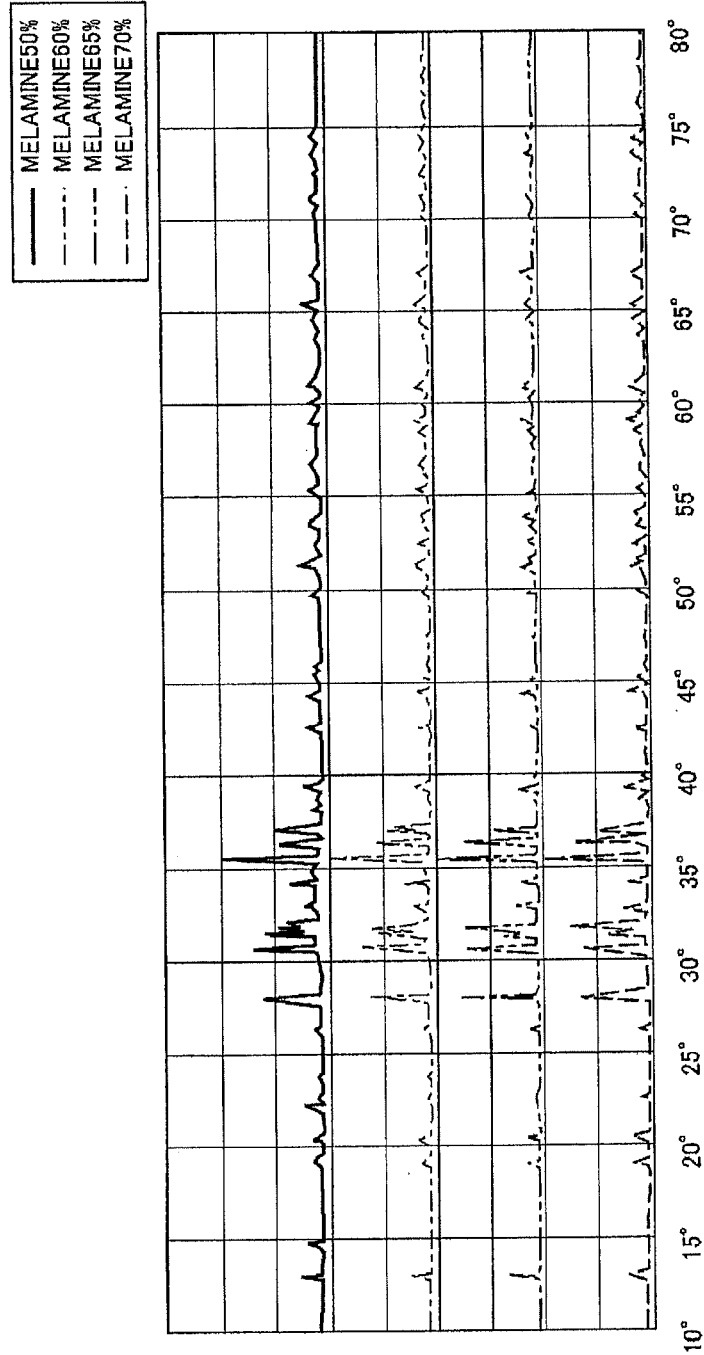
FIG. 14 is a graph showing XDR spectra of red phosphor samples.
Figure 15:
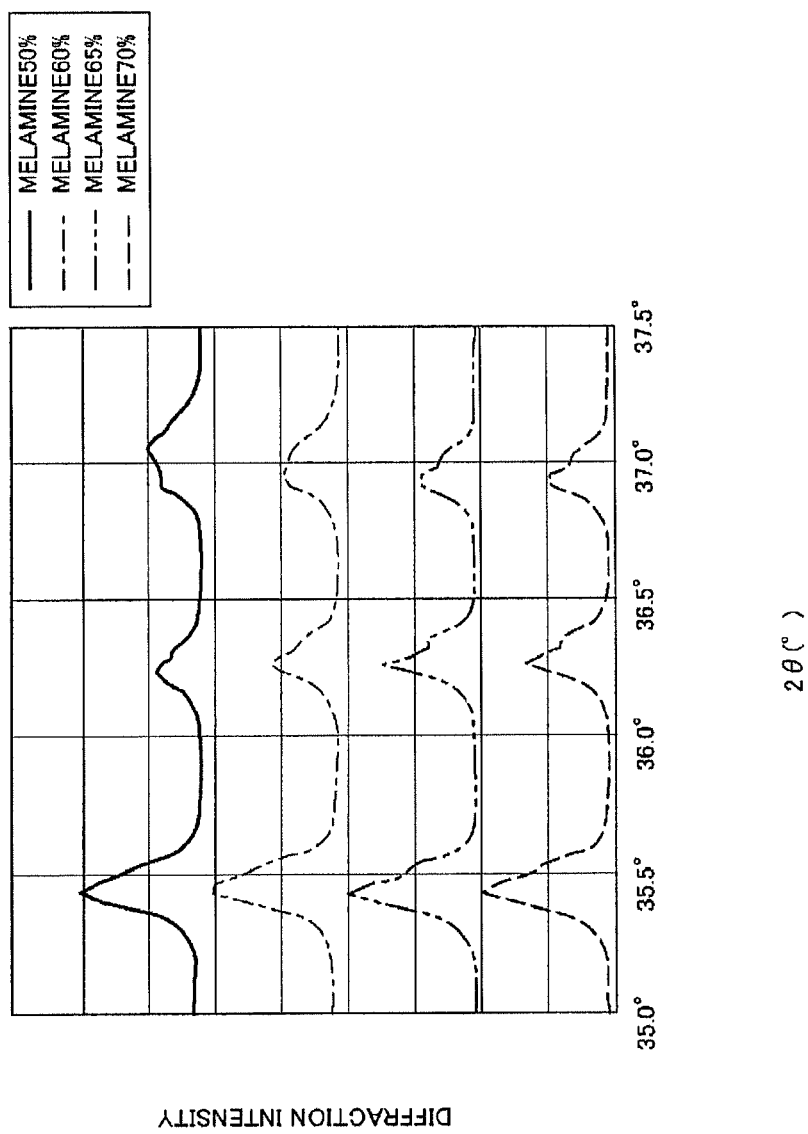
FIG. 15 is a graph showing XDR spectra his of red phosphor samples.
Figure 16:
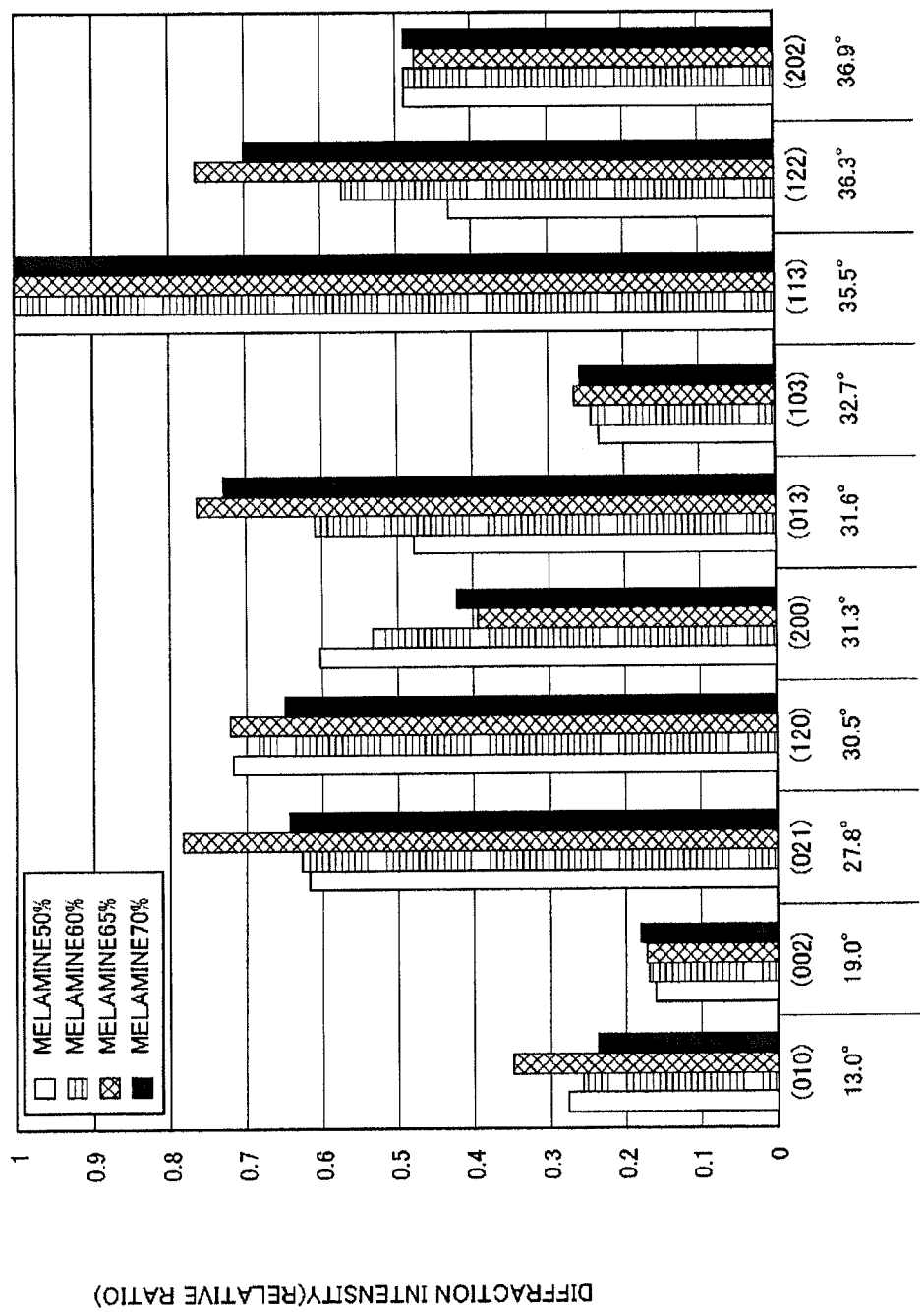
FIG. 16 is a bar graph showing the ratios of peak intensities at different diffraction angles to that at a position of the diffraction angle of 35.0° to 36.0°.

FIGS. 14 and 15 show XRD spectra of red phosphor samples. FIG. 16 is a bar graph showing the ratios to the intensity of a peak at the diffraction angle of 35.0° to 36.0° of the peak intensities at other diffraction angles. Table 1 shows the amounts of melamine added and the normalized (relative) values of the ratios of the diffraction intensities, and Table 2 shows the amounts of melamine added and the angles for which the diffraction intensities were actually obtained.

TABLE 1

|  |  | sample 1 | sample 2 | sample 3 | sample 4 |
|---|---|---|---|---|---|
| amounts of melamine charged (mol %) |  | 50 | 60 | 65 | 70 |
| 13.0° and near 13.0° | (010) | 0.276402 | 0.261248 | 0.351182 | 0.238749 |
| 19.0° and near 19.0° | (002) | 0.165355 | 0.177122 | 0.175586 | 0.178841 |
| 27.8° and near 27.8° | (021) | 0.618891 | 0.628259 | 0.779169 | 0.642805 |
| 30.5° and near 30.5° | (120) | 0.713273 | 0.682568 | 0.718162 | 0.644423 |
| 31.3° and near 31.3° | (200) | 0.595893 | 0.532699 | 0.387091 | 0.419434 |
| 31.6° and near 31.6° | (013) | 0.477901 | 0.608118 | 0.757809 | 0.725001 |
| 32.7° and near 32.7° | (103) | 0.236731 | 0.243752 | 0.257672 | 0.257126 |
| 35.5° and near 35.5° | (113) | 1 | 1 | 1 | 1 |
| 36.3° and near 36.3° | (122) | 0.428234 | 0.568893 | 0.759724 | 0.695407 |
| 36.9° and near 36.9° | (202) | 0.484627 | 0.483315 | 0.471047 | 0.483021 |

TABLE 2

|  | sample 1 | sample 2 | sample 3 | sample 4 |
|---|---|---|---|---|
| amounts of melamine charged (mol %) | 50 | 60 | 65 | 70 |
| 13.0° and near 13.0° | 12.9337° | 13.0327° | 13.0327° | 13.0327° |
| 19.0° and near 19.0° | 19.0387° | 19.0717° | 19.0717° | 19.0717° |
| 27.8° and near 27.8° | 27.8167° | 27.9157° | 27.9157° | 27.9157° |
| 30.5° and near 30.5° | 30.5557° | 30.5887° | 30.5887° | 30.5887° |

TABLE 2-continued

|  | sample 1 | sample 2 | sample 3 | sample 4 |
|---|---|---|---|---|
| 31.3° and near 31.3° | 31.3477° | 31.3807° | 31.3807° | 31.3807° |
| 31.6° and near 31.6° | 31.6447° | 31.6447° | 31.6447° | 31.6447° |
| 32.7° and near 32.7° | 32.7997° | 32.8327° | 32.7997° | 32.8327° |
| 35.5° and near 35.5° | 35.4397° | 35.4397° | 35.4397° | 35.4397° |
| 36.3° and near 36.3° | 36.2317° | 36.2647° | 36.2647° | 36.2647° |
| 36.9° and near 36.9° | 37.0567° | 36.9577° | 36.9247° | 36.9577° |

From FIGS. 14 to 16, it may be seen that a peak corresponding to the (113) plane exists at a diffraction angle of 35.0° to 36.0°, that is, near 2θ=35.5°, and a peak corresponding to the (122) plane exists at a diffraction angle of 36.0° to 36.6°, that is, near 2θ=35.5°. It may also be seen that the intensity of the peak near 2θ=36.3° becomes stronger in direct proportion to the amount of melamine addition.

Figure 17:
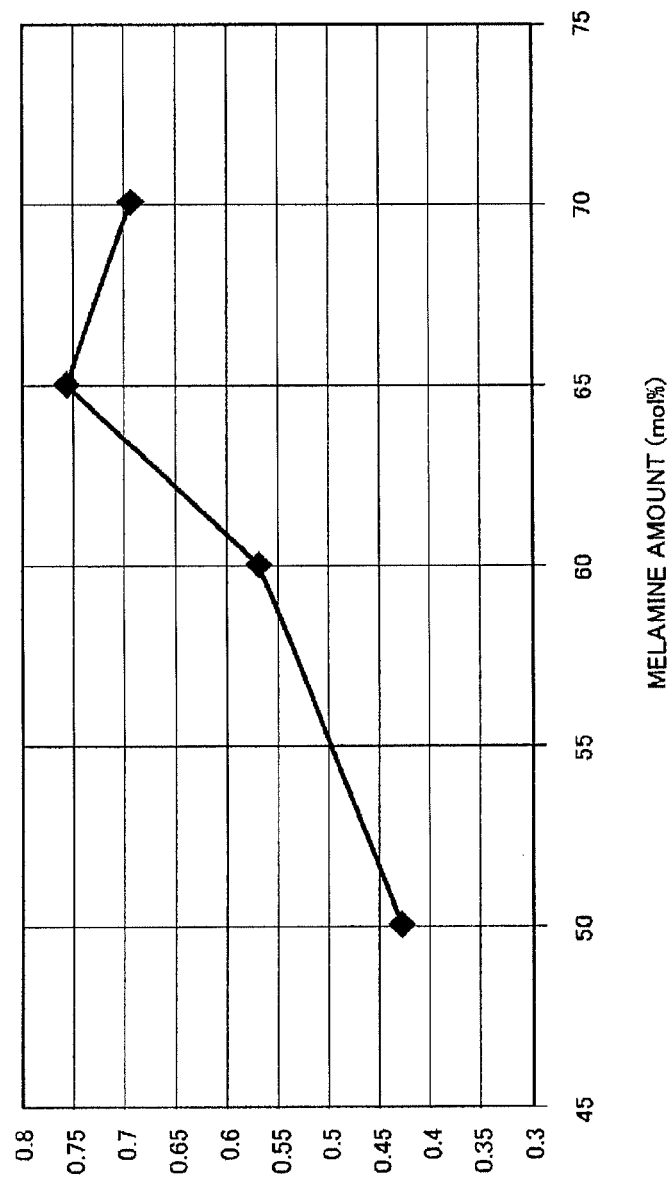
FIG. 17 is a graph showing the relationship between the amounts of addition of melamine and the ratios of the peak intensities at positions of diffraction angles of 36.0° to 36.6° to that at a position of the diffraction angle of 35.0° to 36.0°.

FIG. 17 shows a graph showing the relationship between the ratio of the intensity of a peak existing at the position of the angle of diffraction of 36.0° to 36.6° to that of a peak existing at the position of the angle of diffraction of 35.0° to 36.0° and the amount of the melamine addition. It may be seen that the ratio of the intensity of the peak existing at the position of the angle of diffraction of 36.0° to 36.6° to that of the peak existing at the position of the angle of diffraction of 35.0° to 36.0° increases approximately in direct proportion to the amount of the melamine addition. It may also be seen that the ratio of the intensity of the peak existing at the position of the angle of diffraction of 36.0° to 36.6° to that of the peak existing at the position of the angle of diffraction of 35.0° to 36.0° becomes maximum for the amount of melamine addition of 65 mol %.

Figure 18:
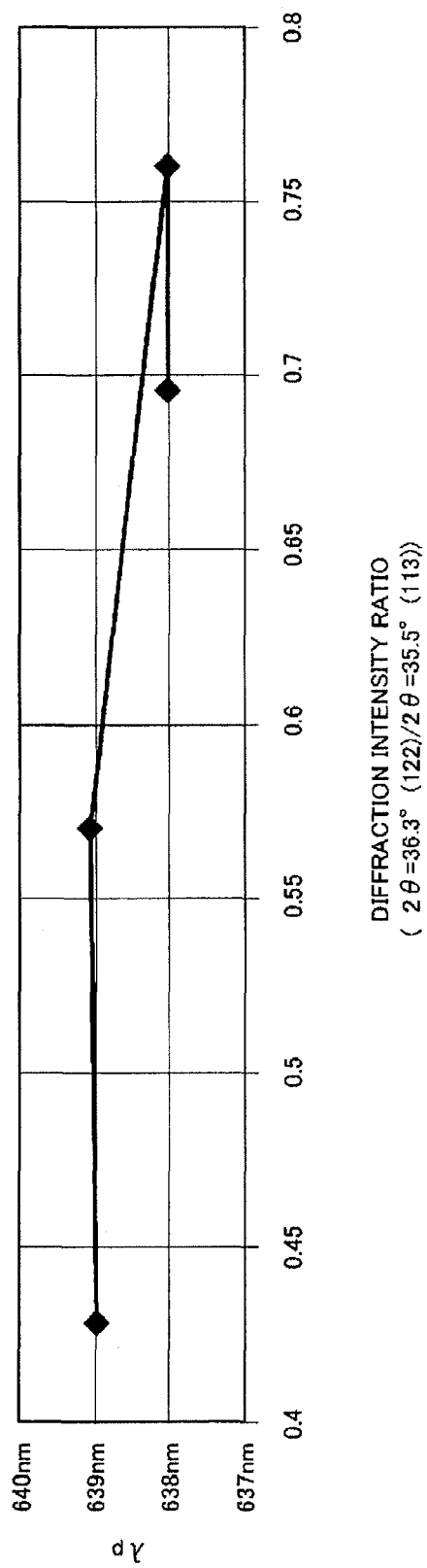
FIG. 18 is a graph showing the relationship between the ratios of the peak intensities at positions of diffraction angles of 36.0° to 36.6° to that at a position of the diffraction angle of 35.0° to 36.0° and the peak wavelength.

FIG. 18 shows the relationship between the ratio of the intensity of the peak existing at the position of the angle of diffraction of 36.0° to 36.6° to that of the peak existing at the position of the angle of diffraction of 35.0° to 36.0° and the peak wavelength. It is seen from FIG. 18 that the peak wavelength shifts to the short wavelength side approximately in direct proportion to the ratio of the intensity of the peak existing at the position of the angle of diffraction of 36.0° to 36.6° to that of the peak existing at the position of the angle of diffraction of 35.0° to 36.0°.

Figure 19:
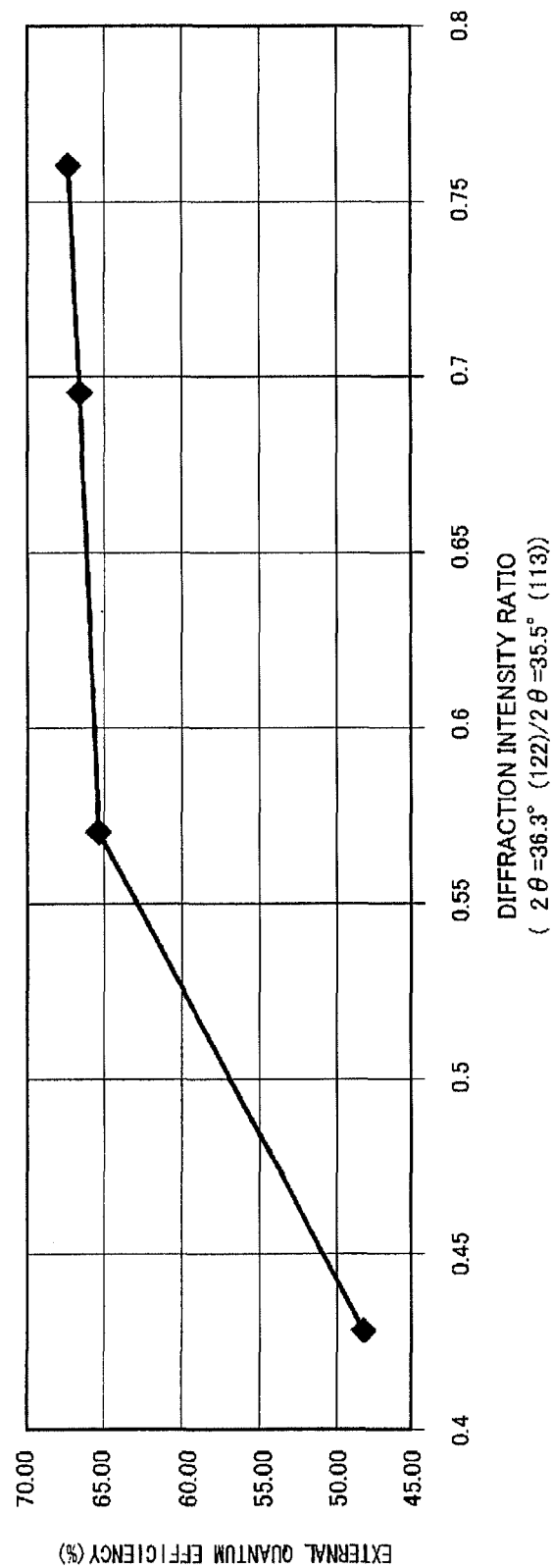
FIG. 19 is a graph showing the relationship between the ratios of the peak intensities at positions of diffraction angles of 36.0° to 36.6° to that at a position of diffraction angle of 35.0° to 36.0° and the external quantum efficiency.

FIG. 19 shows the relationship between the ratio of the intensity of the peak existing at the position of the angle of diffraction of 36.0° to 36.6° to that of the peak existing at the position of the angle of diffraction of 35.0° to 36.0° and the external quantum efficiency. It is seen that the external quantum efficiency is improved in direct proportion to the ratio of the intensity of the peak existing at the position of the angle of diffraction of 36.0° to 36.6° to that of the peak existing at the position of the angle of diffraction of 35.0° to 36.0°. It is also seen that, for a range of ca. 0.52 or higher of the ratio of the intensity of the peak existing at the position of the angle of diffraction of 36.0° to 36.6° to that of the peak existing at the position of the angle of diffraction of 35.0° to 36.0° g, the external quantum efficiency exceeds 60%.

Figure 20:
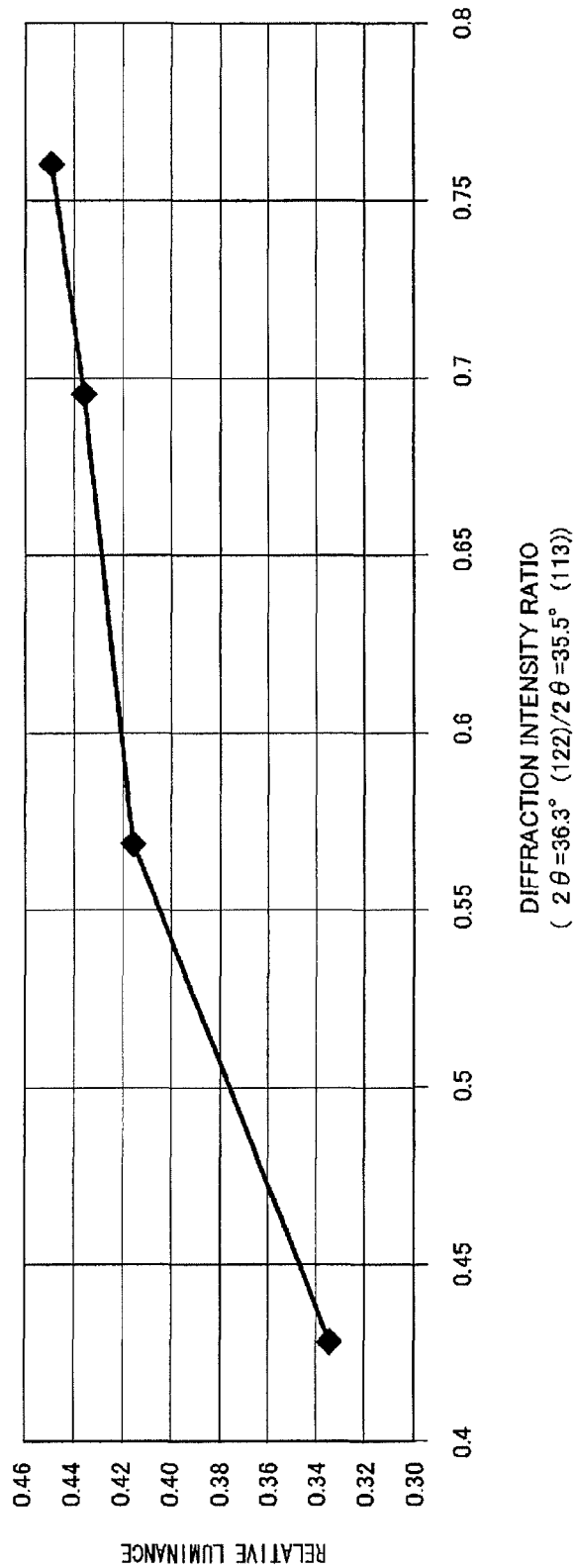
FIG. 20 is a graph showing the relationship between the ratios of the peak intensities at positions of diffraction angles of 36.0° to 36.6° to that at a position of the diffraction angle of 35.0° to 36.0° and the relative luminance.

FIG. 20 shows the relationship between the ratio of the intensity of the peak existing at the position of the angle of diffraction of 36.0° to 36.6° to that of the peak existing at the position of the angle of diffraction of 35.0° to 36.0° and relative luminance. It is seen that relative luminance is improved in direct proportion to the ratio of the intensity of the peak existing at the position of the angle of diffraction of 36.0° to 36.6° to the intensity of the peak existing at the position of the angle of diffraction of 35.0° to 36.0°.

<In Case the Calcium Content ($\alpha/(\alpha+\beta)$)=0.1>

Figure 21:
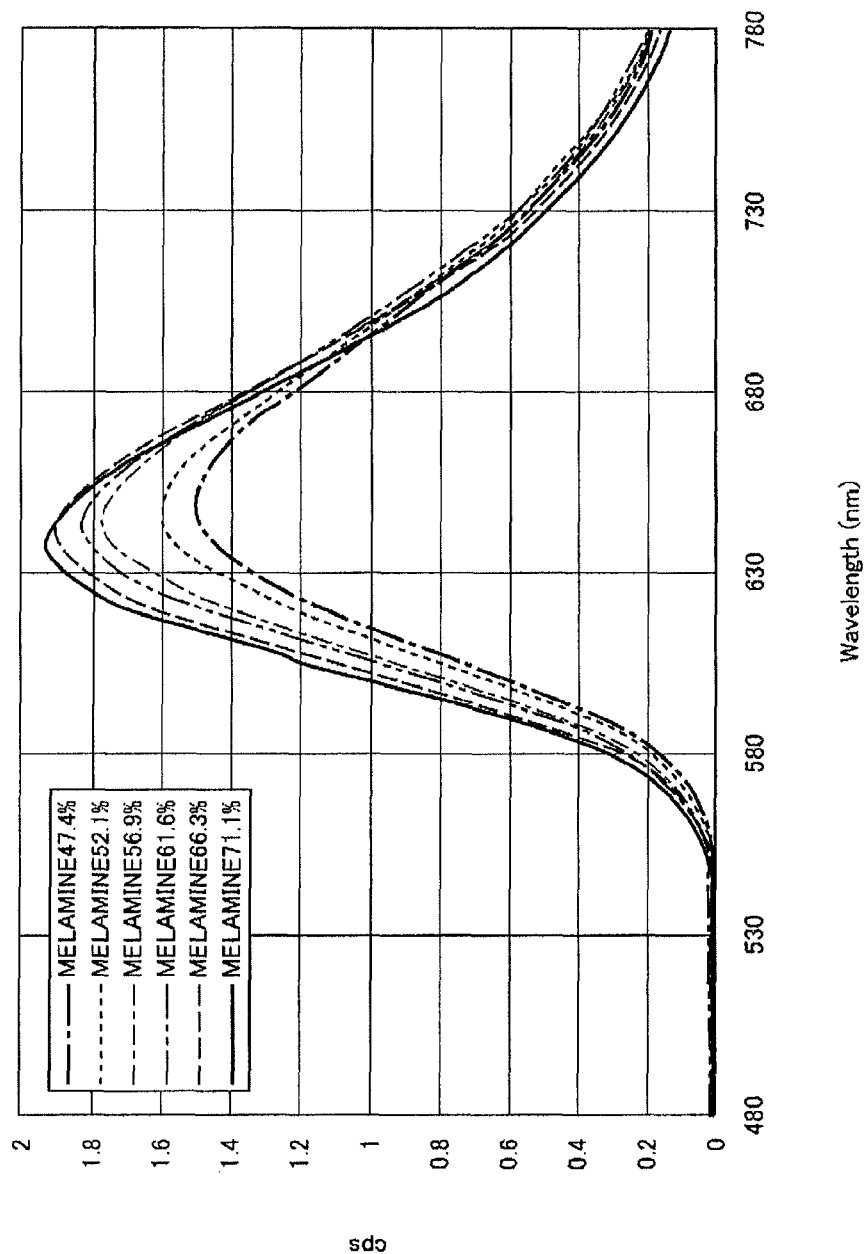
FIG. 21 is a graph showing emission spectra of red phosphor samples in case of changing the amounts of addition of melamine.

FIG. 21 shows changes in the emission spectra of red phosphor samples against changes in the amount of addition of melamine. Specifically, FIG. 21 shows the results obtained with the red phosphor samples (m=3.6, Eu concentration (x)=0.135 and γ=0), with the calcium content (α/(α+β) being 0.1. It is seen from FIG. 21 that, with increase in the amount of melamine added, the emission intensity increases, with the emission shifting towards right.

Figure 22:
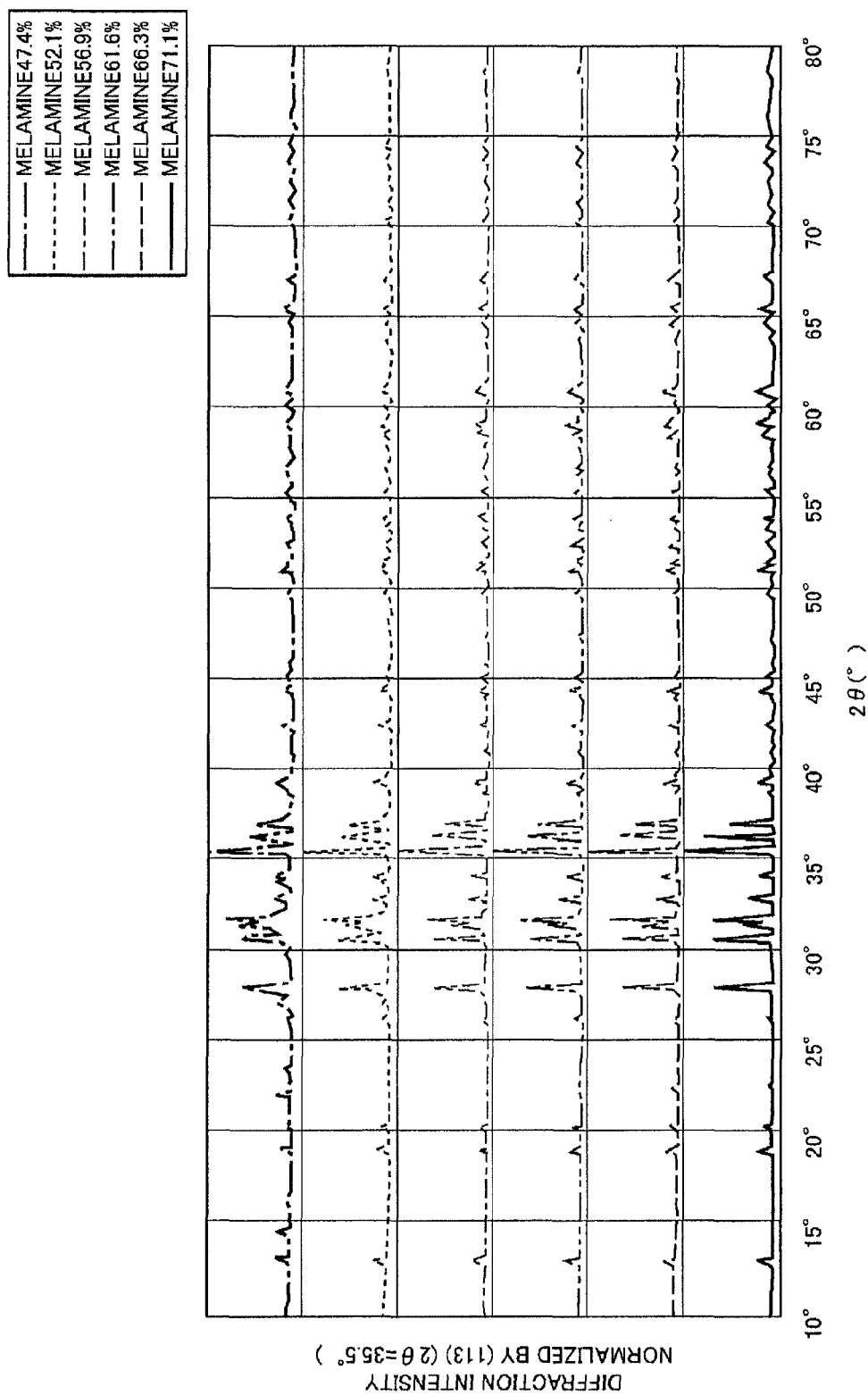
FIG. 22 is a graph showing XRD spectra of red phosphor samples.
Figure 23:
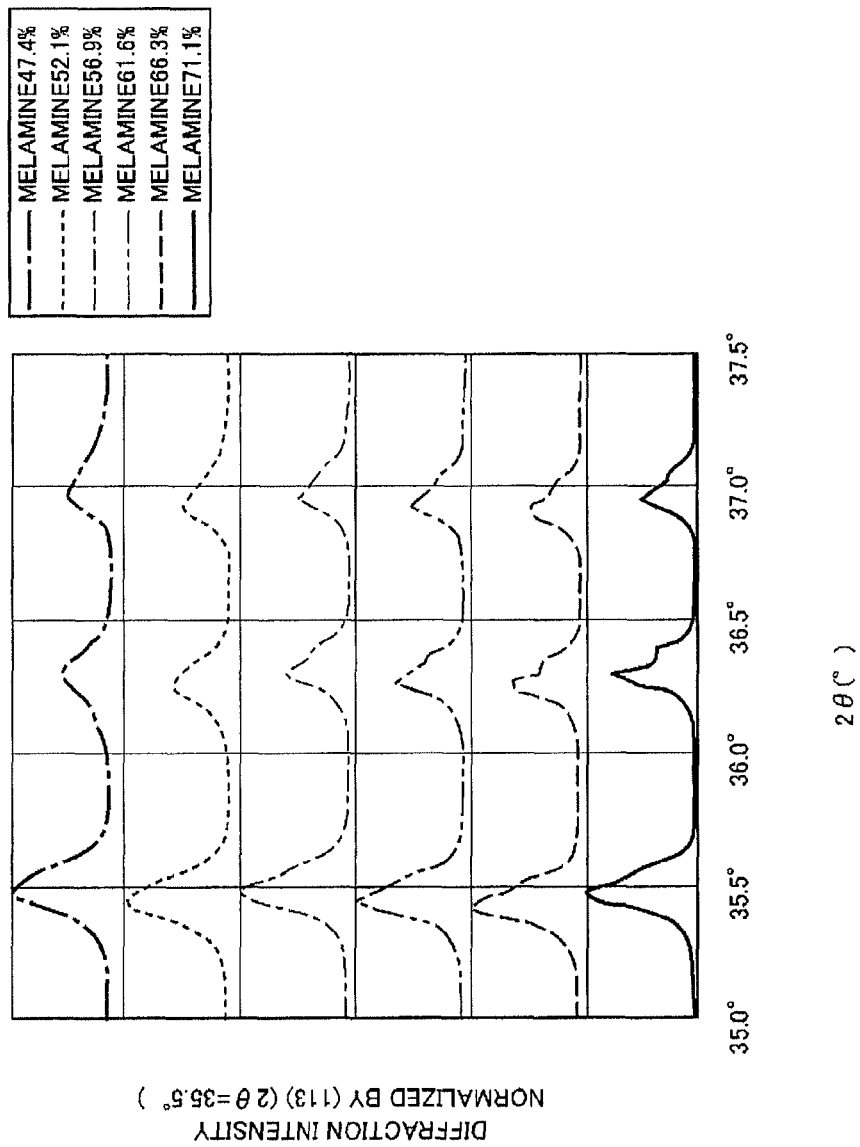
FIG. 23 is similarly a graph showing XRD spectra of red phosphor samples.
Figure 24:
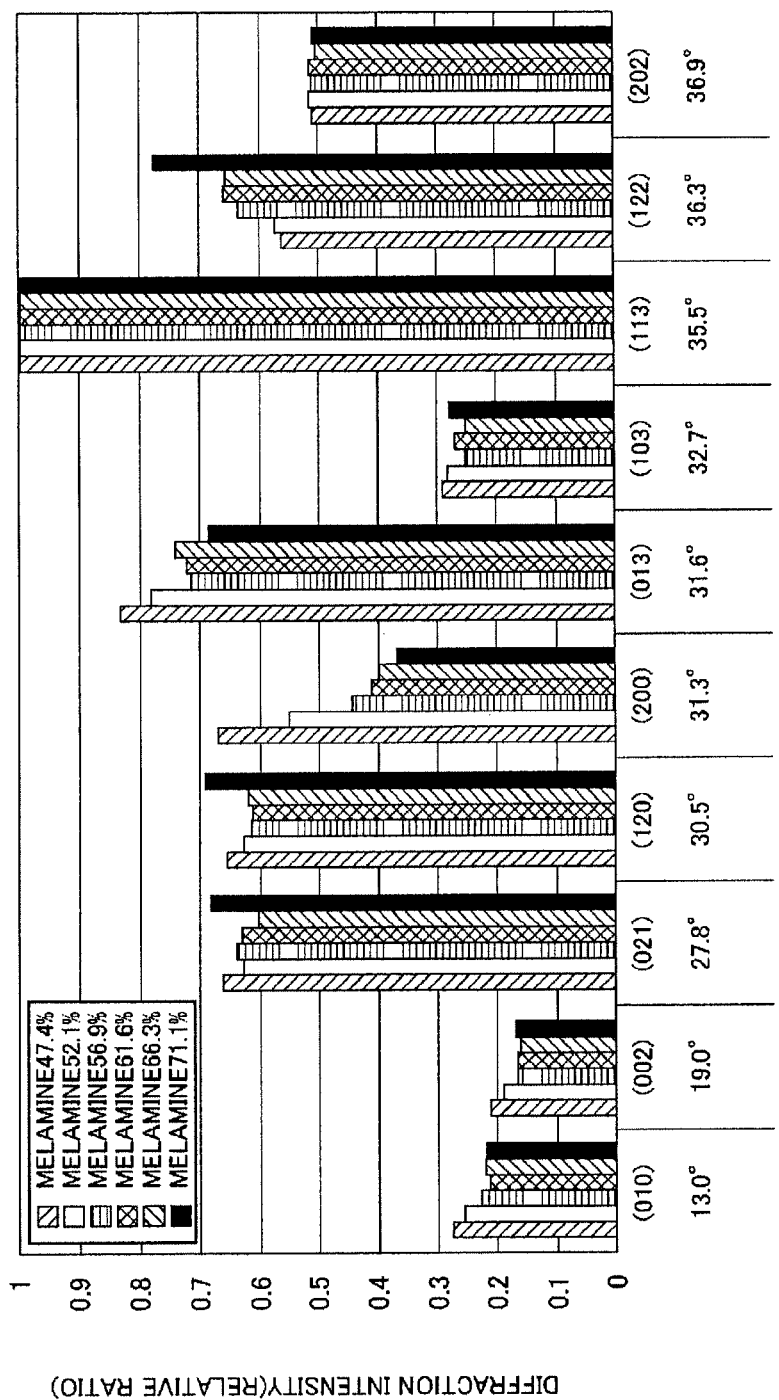
FIG. 24 is a bar graph showing the ratios to the peak intensity at a position of diffraction angle of 35.0° to 36.0° of peak intensities at different diffraction angles.

FIGS. 22 and 23 show XRD spectra of red phosphor samples. FIG. 24 is a bar graph showing the ratio to the intensity of a peak at the diffraction angle of 35.0° to 36.0° of the peak intensities at other diffraction angles.

Table 3 shows the amounts of melamine added and the normalized values (relative values) of the ratios of the diffraction intensities, and Table 4 shows the amounts of melamine added and the angles for which the diffraction intensities were actually obtained.

TABLE 3

|  |  | sample 5 | sample 6 | sample 7 | sample 8 | sample 9 | sample 10 |
|---|---|---|---|---|---|---|---|
| amounts of melamine charged (mol %) |  | 47.4 | 52.1 | 56.9 | 61.6 | 66.3 | 71.1 |
| 13.0° and near 13.0° | (010) | 0.274483 | 0.255147 | 0.229099 | 0.215831 | 0.223671 | 0.215623 |
| 19.0° and near 19.0° | (002) | 0.20877 | 0.191341 | 0.169436 | 0.168009 | 0.165684 | 0.169267 |
| 27.8° and near 27.8° | (021) | 0.660.31 | 0.629402 | 0.635968 | 0.626597 | 0.606106 | 0.6748 |
| 30.5° and near 30.5° | (120) | 0.650852 | 0.625859 | 0.614855 | 0.611001 | 0.61813 | 0.687816 |
| 31.3° and near 31.3° | (200) | 0.667022 | 0.550346 | 0.438793 | 0.410896 | 0.402897 | 0.364998 |
| 31.6° and near 31.6° | (013) | 0.831203 | 0.780672 | 0.713692 | 0.722874 | 0.745744 | 0.683708 |
| 32.7° and near 32.7° | (103) | 0.289564 | 0.281472 | 0.255432 | 0.267526 | 0.250519 | 0.279217 |
| 35.5° and near 35.5° | (113) | 1 | 1 | 1 | 1 | 1 | 1 |
| 36.3° and near 36.3° | (122) | 0.560533 | 0.570475 | 0.633916 | 0.650064 | 0.653346 | 0.773691 |
| 36.9° and near 36.9° | (202) | 0.507904 | 0.513259 | 0.509544 | 0.511366 | 0.505166 | 0.509729 |

TABLE 4

|  | sample 5 | sample 6 | sample 7 | sample 8 | sample 9 | sample 10 |
|---|---|---|---|---|---|---|
| amounts of melamine charged (mol %) | 47.4 | 52.1 | 56.9 | 61.6 | 66.3 | 71.1 |
| 13.0° and near 13.0° | 13.0327° | 12.9997° | 13.0327° | 13.0327° | 12.9997° | 13.0657° |
| 19.0° and near 19.0° | 19.0.387° | 19.0057° | 19.0717° | 19.0.387° | 19.0057° | 19.0717° |
| 27.8° and near 27.8° | 27.9157° | 27.8827° | 27.9487° | 27.9157° | 27.9157° | 27.9487° |
| 30.5° and near 30.5° | 30.6217° | 30.5557° | 30.6217° | 30.5887° | 30.5887° | 30.6217° |
| 31.3° and near 31.3° | 31.3807° | 31.3477° | 31.3807° | 31.3477° | 31.3477° | 31.3807° |
| 31.6° and near 31.6° | 31.6777° | 31.6117° | 31.6777° | 31.6447° | 31.6117° | 31.6447° |
| 32.7° and near 32.7° | 32.8327° | 32.7997° | 32.8327° | 32.7997° | 32.7997° | 32.8327° |
| 35.5° and near 35.5° | 35.4727° | 35.4397° | 35.4727° | 35.4397° | 35.4067° | 35.4727° |
| 36.3° and near 36.3° | 36.2977° | 36.2647° | 36.2977° | 36.2647° | 36.2647° | 36.2977° |
| 36.9° and near 36.9° | 36.9577° | 36.9247° | 36.9577° | 36.9247° | 36.9247° | 36.9577° |

From FIGS. 22 to 24, it may be seen that a peak corresponding to the (113) plane exists at the diffraction angle of 35.0° to 36.0°, that is, near 2θ=35.5°, and a peak corresponding to the (122) plane exists at the diffraction angle of 36.0° to 36.6°, that is, near 2θ=36.3°. It may also be seen that the intensity of the peak near 2θ=36.3° becomes stronger in direct proportion to the amount of melamine addition. It may likewise be seen that, near 2θ=31.3°, the peak corresponding to the (200) plane becomes smaller, and that, near 2θ=31.6°, the peak corresponding to the (013) plane becomes smaller.

Figure 25:
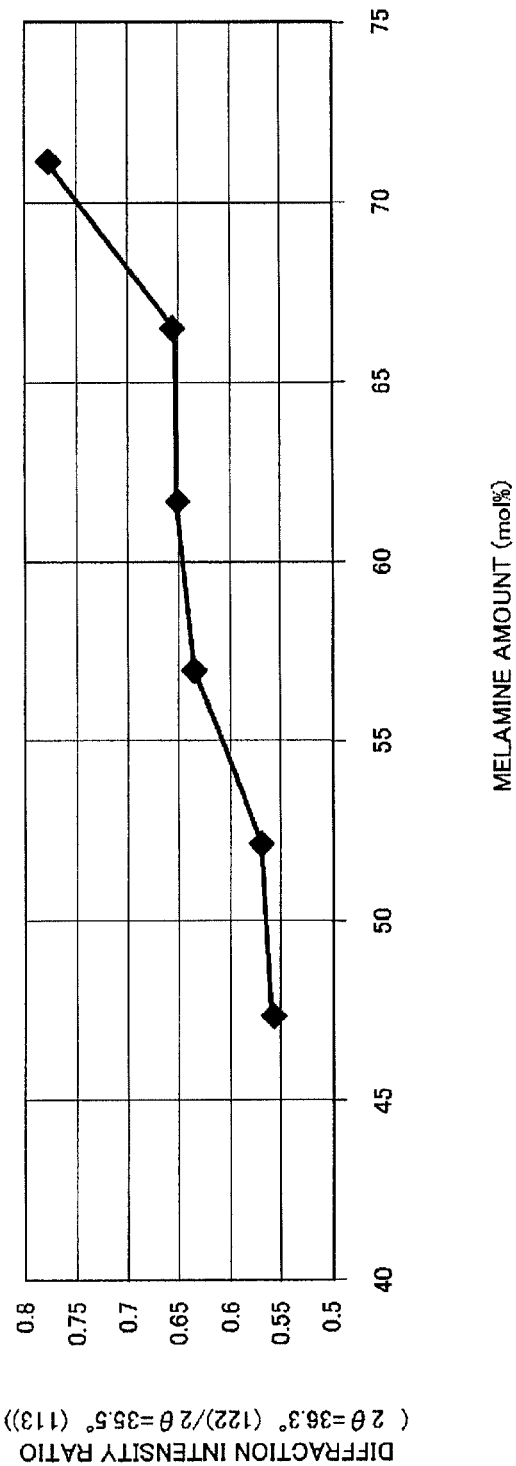
FIG. 25 is a graph showing the relationship between the amounts of addition of melamine and the ratios of the peak intensities at positions of diffraction angles of 36.0° to 36.6° to that at a position of the diffraction angle of 35.0° to 36.0°.

FIG. 25 shows a graph showing the relationship between the ratio of the intensity of a peak existing at the position of the angle of diffraction of 36.0° to 36.6° to that of a peak existing at the position of the angle of diffraction of 35.0° to 36.0° and the amount of the melamine addition. It may be seen that the ratio of the intensity of the peak existing at the angle of diffraction of 36.0° to 36.6° to that of the peak existing at the angle of diffraction of 35.0° to 36.0° becomes stronger approximately in direct proportion to the amount of the melamine addition.

Figure 26:
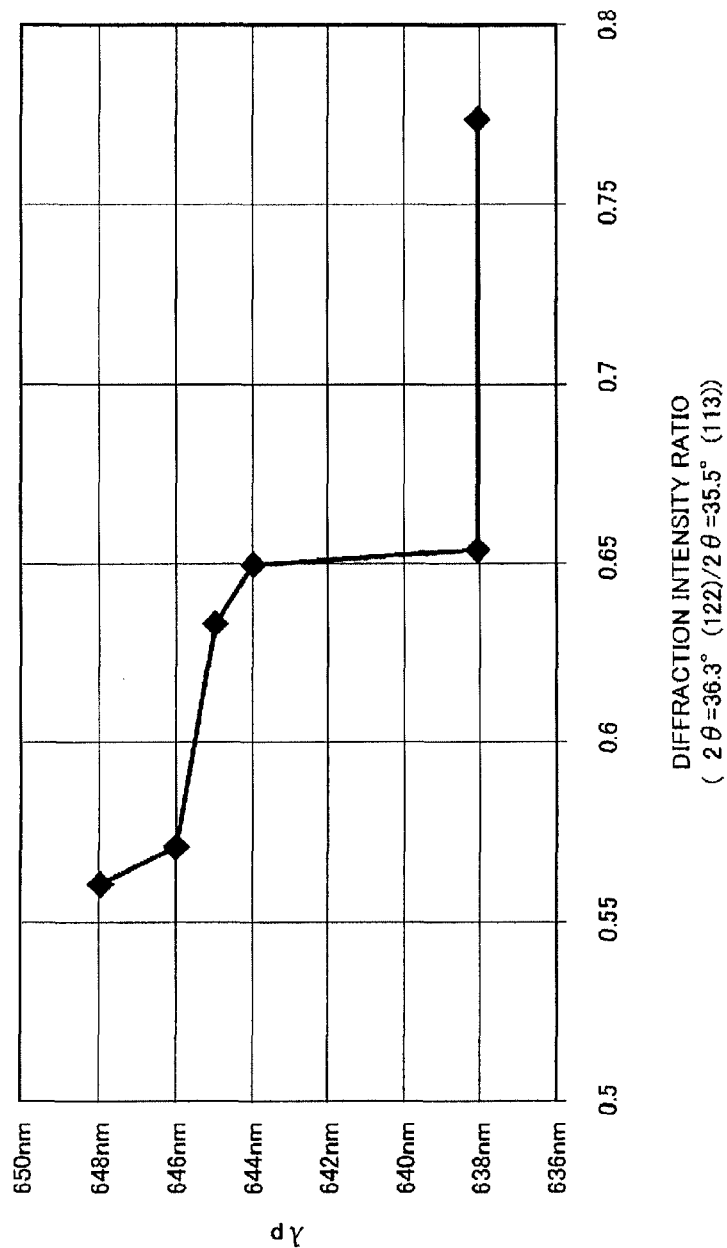
FIG. 26 is a graph showing the relationship between the ratios of the peak intensities at positions of diffraction angles of 36.0° to 36.6° to that at a position of the diffraction angle of 35.0° to 36.0° and the peak wavelength.

FIG. 26 shows a graph showing the relationship between the ratio of the intensity of a peak existing at the position of the angle of diffraction of 36.0° to 36.6° to that of a peak existing at the position of the angle of diffraction of 35.0° to 36.0° and the peak wavelength. It is seen from FIG. 26 that the peak wavelength shifts to the short wavelength side approximately in direct proportion to the ratio of the intensity of the peak existing at the position of the angle of diffraction of 36.0° to 36.6° to that of the peak existing at the position of the angle of diffraction of 35.0° to 36.0°.

Figure 27:
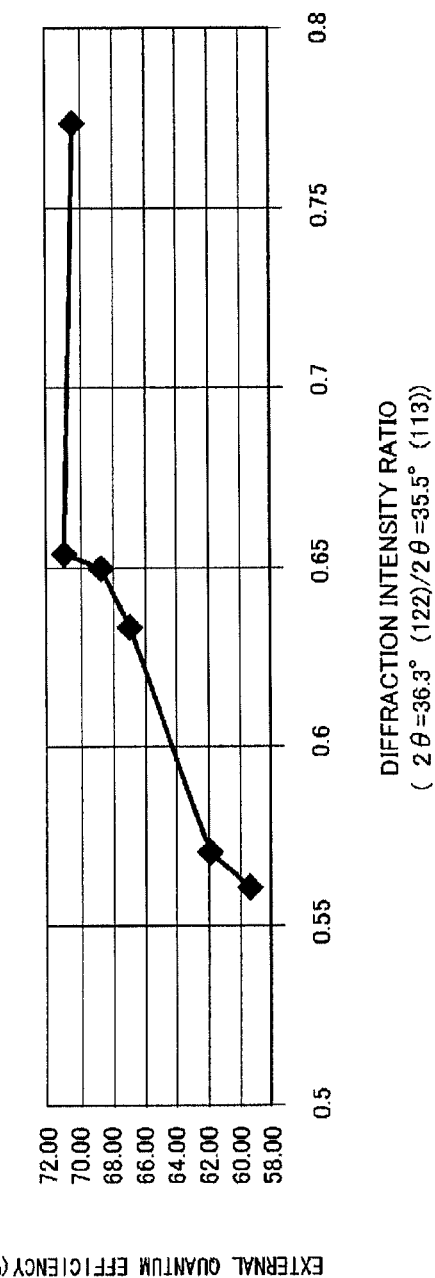
FIG. 27 is a graph showing the relationship between the ratios of the peak intensities at positions of diffraction angles of 36.0° to 36.6° to that at a position of the diffraction angle of 35.0° to 36.0° and the external quantum efficiency.

FIG. 27 shows the relationship between the ratio of the intensity of the peak existing at the position of the angle of diffraction of 36.0° to 36.6° to that of the peak existing at the position of the angle of diffraction of 35.0° to 36.0° and the external quantum efficiency. It is seen that, up to the ratio of 0.65 of the intensity of the peak existing at the position of the angle of diffraction of 36.0° to 36.6° to that of the peak existing at the position of the angle of diffraction of 35.0° to 36.0°, the external quantum efficiency is improved in direct proportion to the ratio value. It is also seen that, for a range of the ratio of ca. 0.57 or higher of the intensity of the peak existing at the position of the angle of diffraction of 36.0° to 36.6° to that of the peak existing at the position of the angle of diffraction of 35.0° to 36.0°, the external quantum efficiency exceeds 60%.

Figure 28:
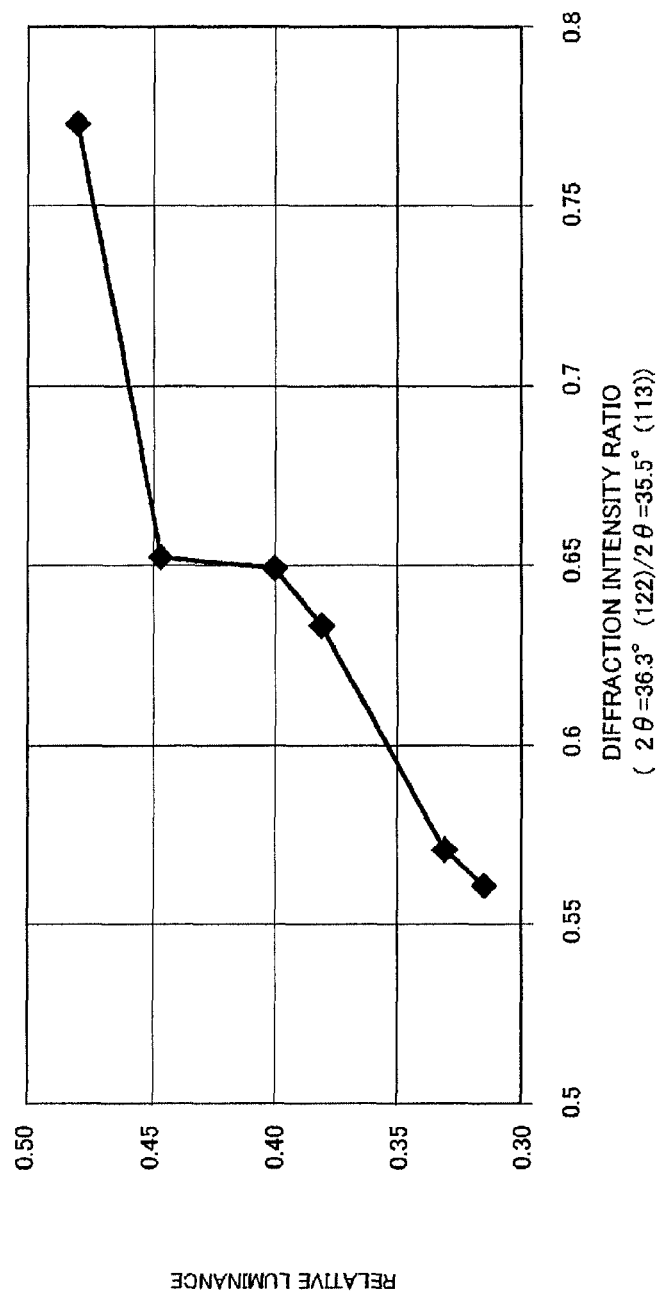
FIG. 28 is a graph showing the relationship between the ratios of the peak intensities at positions of diffraction angles of 36.0° to 36.6° to that at a position of the diffraction angle of 35.0° to 36.0° and the relative luminance.

FIG. 28 shows the relationship between the ratio of the intensity of the peak existing at the position of the angle of diffraction of 36.0° to 36.6° to that of the peak existing at the position of the angles of diffraction of 35.0° to 36.0° and relative luminance. It is seen that relative luminance is improved approximately in direct proportion to the ratio of the intensity of the peak existing at the position of the angle of diffraction of 36.0° to 36.6° to that of the peak existing at the position of the angle of diffraction of 35.0° to 36.0°.

<In Case the Calcium Content ($\alpha/(\alpha+\beta)$)=0.2>

Figure 29:
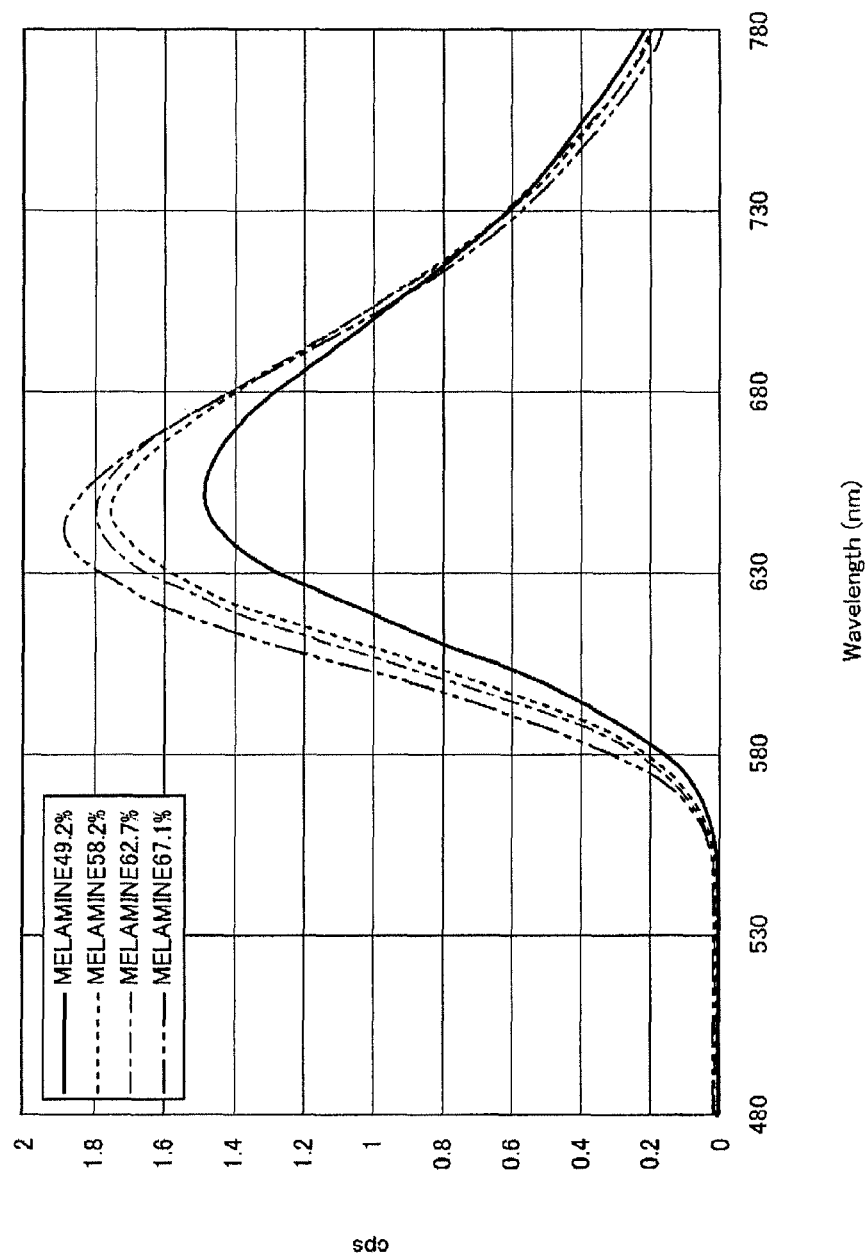
FIG. 29 is a graph showing emission spectra of red phosphor samples in case of changing the amounts of addition of melamine.

FIG. 29 shows changes in emission spectra of red phosphor samples in case of changing the amount of addition of melamine. Specifically, FIG. 29 shows the results obtained with the red phosphor samples (m=3.6, Eu concentration (x)=0.135 and γ=0), with the calcium content ($\alpha/(\alpha+\beta)$) being 0.2. It is seen from FIG. 29 that, with increase in the amount of melamine addition, the emission intensity increases, with the emission shifting towards right.

Figure 30:
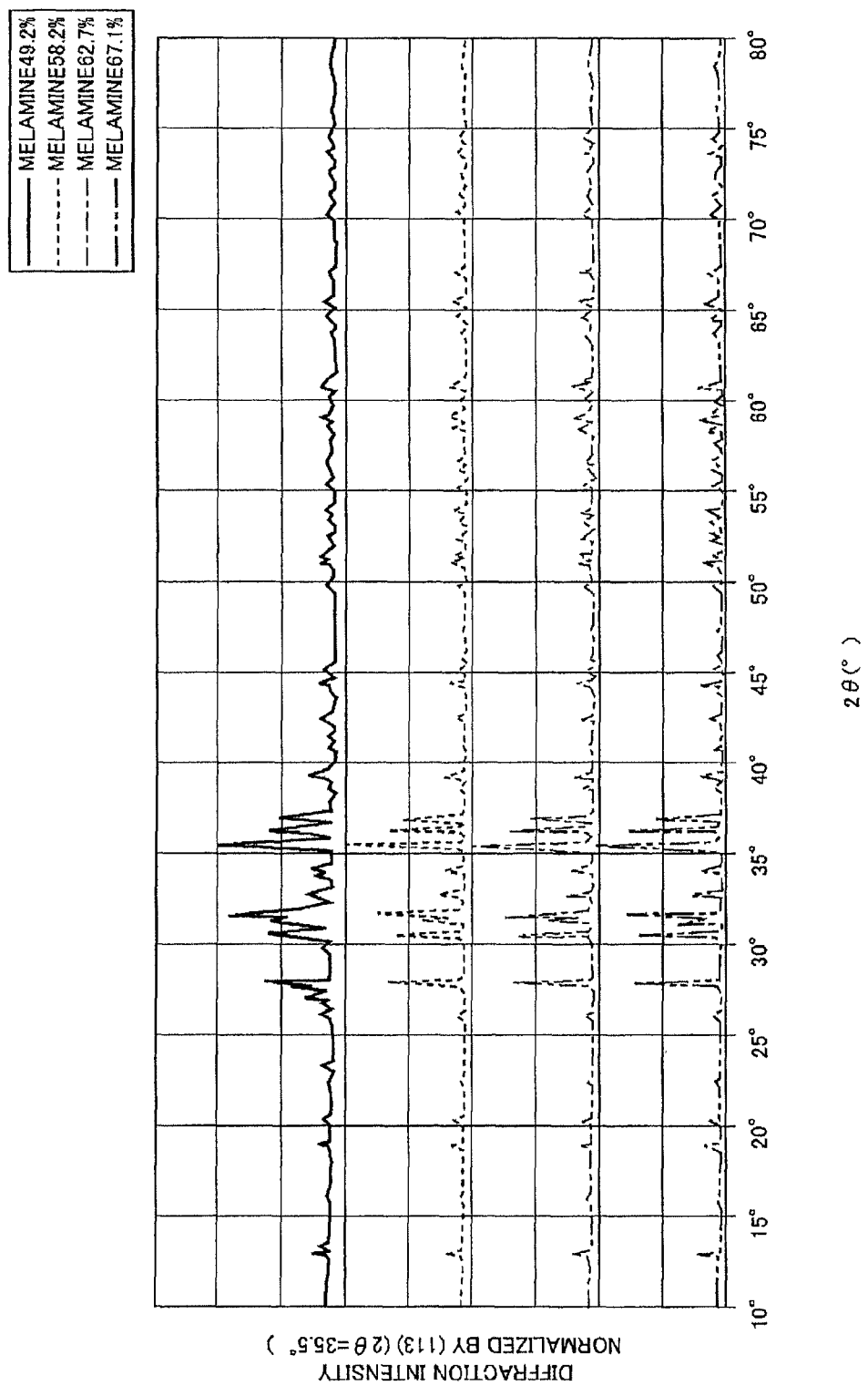
FIG. 30 is a graph showing XRD spectra of red phosphor samples.
Figure 31:
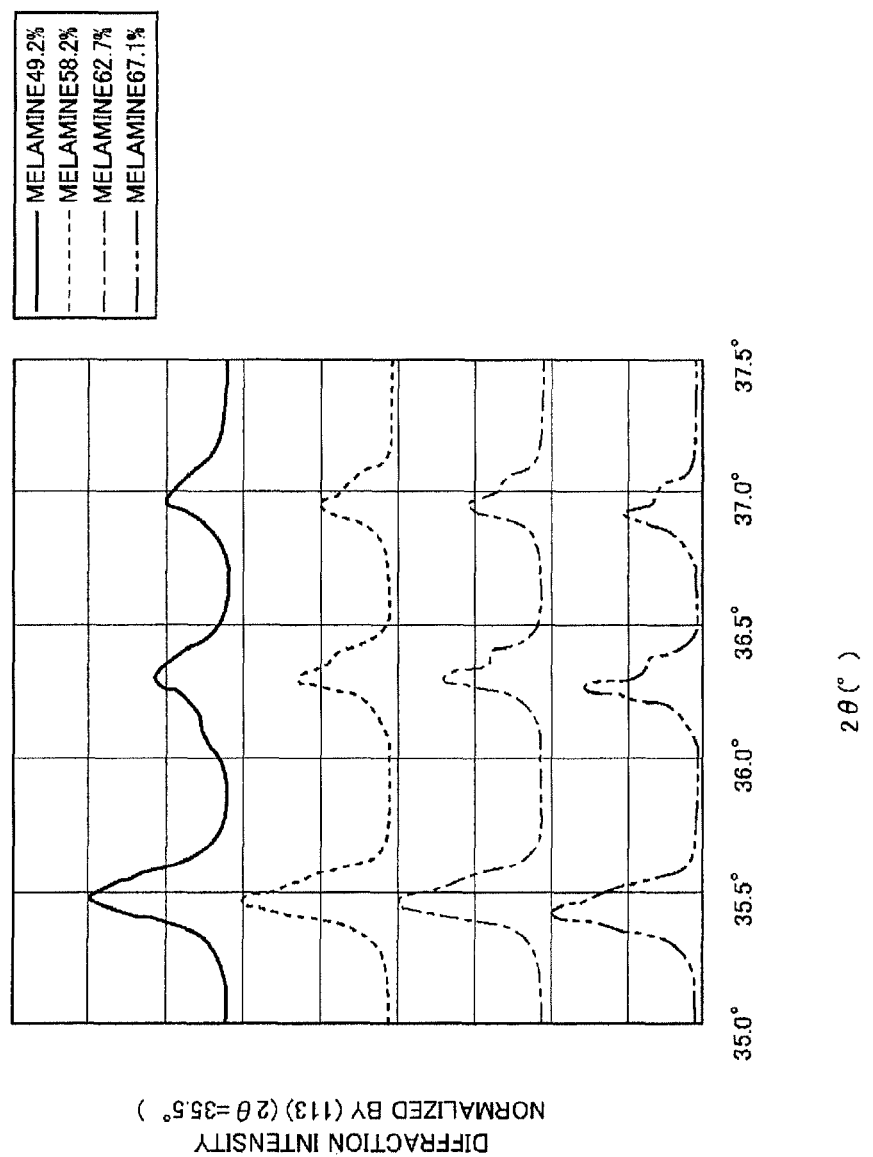
FIG. 31 is similarly a graph showing XRD spectra of red phosphor samples.
Figure 32:
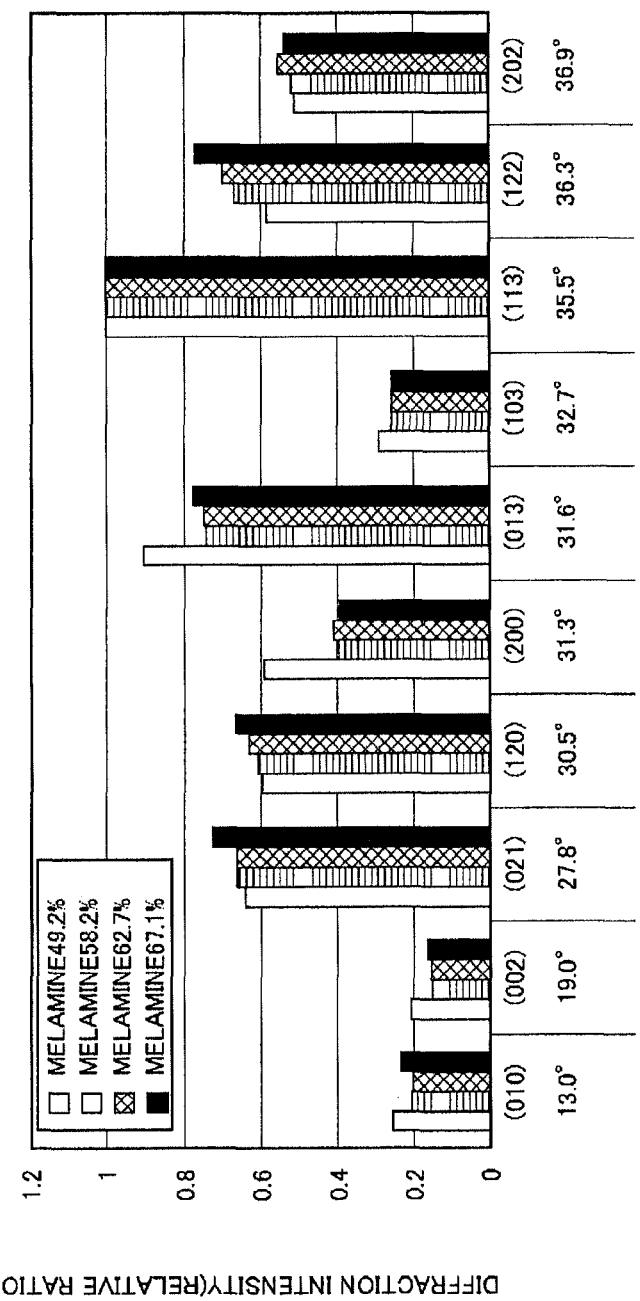
FIG. 32 is a bar graph showing the ratios to the peak intensity at a position of the diffraction angle of 35.0° to 36.0° of the peak intensities at different diffraction angles.

FIGS. 30 and 31 show XRD spectra of red phosphor samples. FIG. 32 is a bar graph showing the ratios to the intensity of a peak present at the diffraction angle of 35.0° to 36.0° of peak intensities at other diffraction angles.

Table 5 shows the amounts of addition of melamine and the normalized values of the ratios of the diffraction intensities (relative ratios), and Table 6 shows the amounts of addition of melamine and the angles for which the diffraction intensities were actually obtained.

TABLE 5

|  |  | sample 11 | sample 12 | sample 13 | sample 14 |
|---|---|---|---|---|---|
| amounts of melamine charged (mol %) |  | 49.2 | 58.2 | 62.7 | 67.1 |
| 13.0° and near 13.0° | (010) | 0.25874 | 0.209365 | 0.201711 | 0.234274 |
| 19.0° and near 19.0° | (002) | 0.209402 | 0.157028 | 0.1599 | 0.166687 |
| 27.8° and near 27.8° | (021) | 0.642339 | 0.669209 | 0.665441 | 0.731591 |
| 30.5° and near 30.5° | (120) | 0.604536 | 0.612766 | 0.641749 | 0.66802 |
| 31.3° and near 31.3° | (200) | 0.595568 | 0.40625 | 0.417433 | 0.397188 |
| 31.6° and near 31.6° | (013) | 0.910396 | 0.745077 | 0.757868 | 0.779229 |
| 32.7° and near 32.7° | (103) | 0.290664 | 0.256252 | 0.256197 | 0.254763 |
| 35.5° and near 35.5° | (113) | 1 | 1 | 1 | 1 |
| 36.3° and near 36.3° | (122) | 0.59056 | 0.673294 | 0.70436 | 0.775729 |
| 36.9° and near 36.9° | (202) | 0.512179 | 0.52309 | 0.554989 | 0.538986 |

TABLE 6

|  | sample 11 | sample 12 | sample 13 | sample 14 |
|---|---|---|---|---|
| amounts of melamine charged (mol %) | 49.2 | 58.2 | 62.7 | 67.1 |
| 13.0° and near 13.0° | 13.0327° | 13.0327° | 13.0327° | 12.9997° |
| 19.0° and near 19.0° | 19.0387° | 19.0387° | 19.0387° | 19.0057° |
| 27.8° and near 27.8° | 27.9487° | 27.9487° | 27.9487° | 27.9157° |
| 30.5° and near 30.5° | 30.6217° | 30.6217° | 30.6217° | 30.5887° |
| 31.3° and near 31.3° | 31.3807° | 31.3807° | 31.3807° | 31.3477° |
| 31.6° and near 31.6° | 31.6777° | 31.6447° | 31.6447° | 31.6117° |
| 32.7° and near 32.7° | 32.8327° | 32.7997° | 32.8327° | 32.7667° |
| 35.5° and near 35.5° | 35.4727° | 35.4397° | 35.4727° | 35.4067 |
| 36.3° and near 36.3° | 36.2977° | 36.2977° | 36.2977° | 36.2647° |
| 36.9° and near 36.9° | 36.9577° | 36.9577° | 36.9577° | 36.9247° |

From FIGS. 30 to 32, it may be seen that a peak corresponding to the (113) plane exists at a position of the angle of diffraction of 35.0° to 36.0°, that is, near 2θ=35.5°. It may also be seen that a peak correlated with the (122) plane exists at a position of the angle of diffraction of 36.0° to 36.6°, that is, near 2θ=36.3°, with the intensity of the peak near 2θ=36.3° becoming stronger in direct proportion to the amount of melamine addition.

Figure 33:
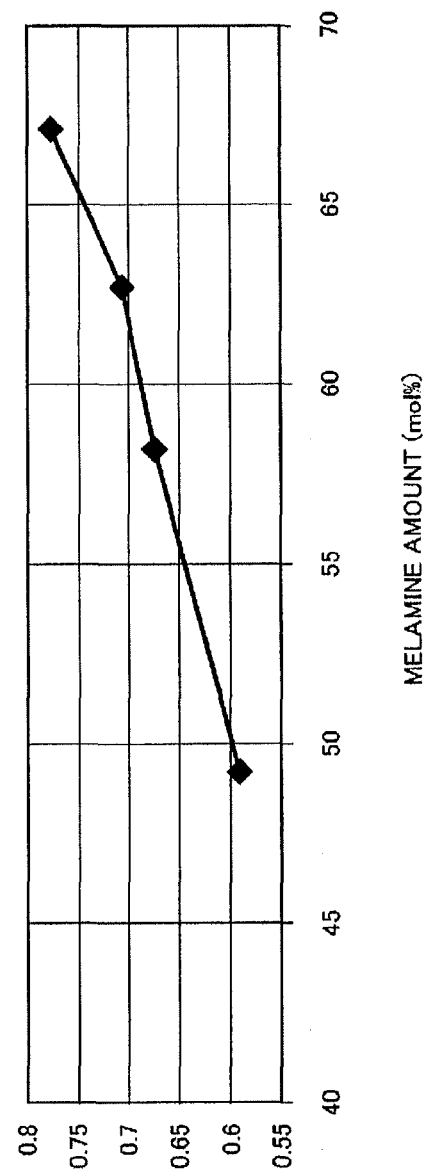
FIG. 33 is a graph showing the relationship between the amounts of addition of melamine and the ratios of the peak intensities at positions of diffraction angles of 36.0° to 36.6° to that at a position of the diffraction angle of 35.0° to 36.0°.

FIG. 33 shows a graph showing the relationship between the ratio of the intensity of a peak existing at the position of the angle of diffraction of 36.0° to 36.6° to that of a peak existing at the position of the angle of diffraction of 35.0° to 36.0° and the amount of melamine addition. It may be seen that the ratio of the intensity of the peak existing at the angle of diffraction of 36.0° to 36.6° to that of the peak existing at the angle of diffraction of 35.0° to 36.0° becomes stronger approximately in direct proportion to the amount of melamine addition.

Figure 34:
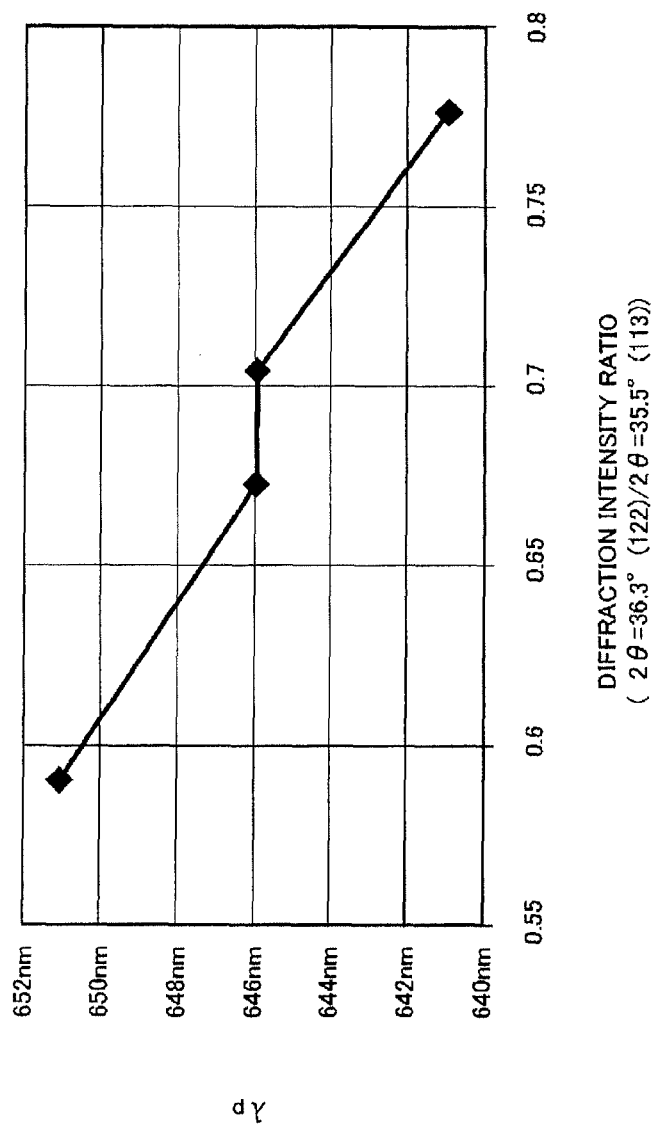
FIG. 34 is a graph showing the relationship between the ratios of the peak intensities at positions of diffraction angles of 36.0° to 36.6° to that at a position of the diffraction angle of 35.0° to 36.0° and the peak wavelength.

FIG. 34 shows a graph showing the relationship between the ratio of the intensity of a peak existing at the position of the angle of diffraction of 36.0° to 36.6° to that of a peak existing at the position of the angle of diffraction of 35.0° to 36.0° and the peak wavelength. It is seen from FIG. 34 that the peak wavelength shifts to the short wavelength side approximately in direct proportion to the ratio of the intensity of the peak existing at the position of the angle of diffraction of 36.0° to 36.6° to that of the peak existing at the position of the angle of diffraction of 35.0° to 36.0°.

Figure 35:
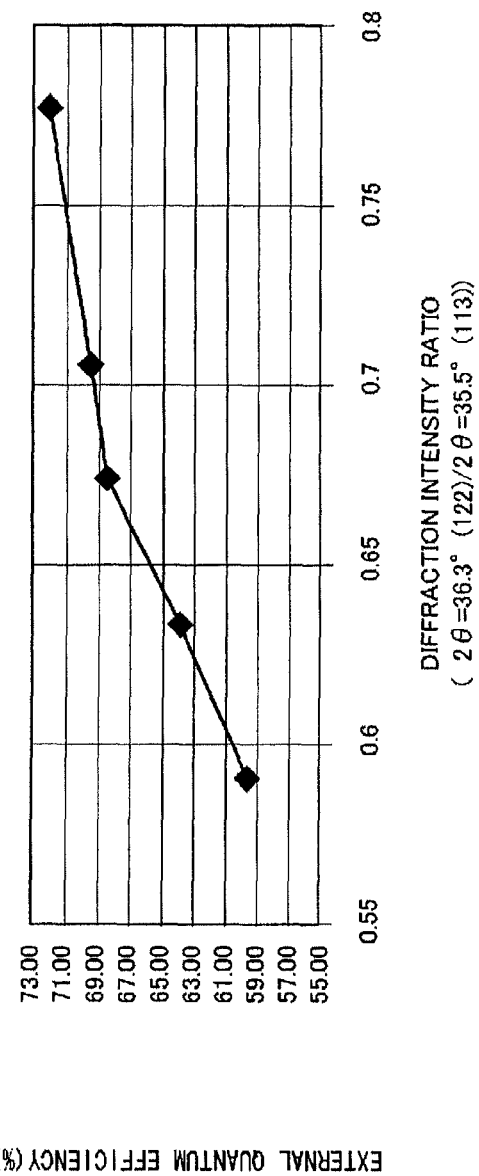
FIG. 35 is a graph showing the relationship between the ratios of the peak intensities at positions of diffraction angles of 36.0° to 36.6° to that at a position of the diffraction angle of 35.0° to 36.0° and the external quantum efficiency.

FIG. 35 shows the relationship between the ratio of the intensity of a peak existing at the position of the angle of diffraction of 36.0° to 36.6° to that of a peak existing at the position of the angle of diffraction of 35.0° to 36.0° and the external quantum efficiency. It is seen that the external quantum efficiency is improved in direct proportion to the ratio of the intensity of the peak existing at the position of the angle of diffraction of 36.0° to 36.6° to that of the peak existing at the position of the angle of diffraction of 35.0° to 36.0°. It is also seen that, for a range of ca. 0.58 or higher of the ratio of the intensity of the peak existing at the position of the angle of diffraction of 36.0° to 36.6° to that of the peak existing at the position of the angle of diffraction of 35.0° to 36.0°, the external quantum efficiency exceeds 60%.

Figure 36:
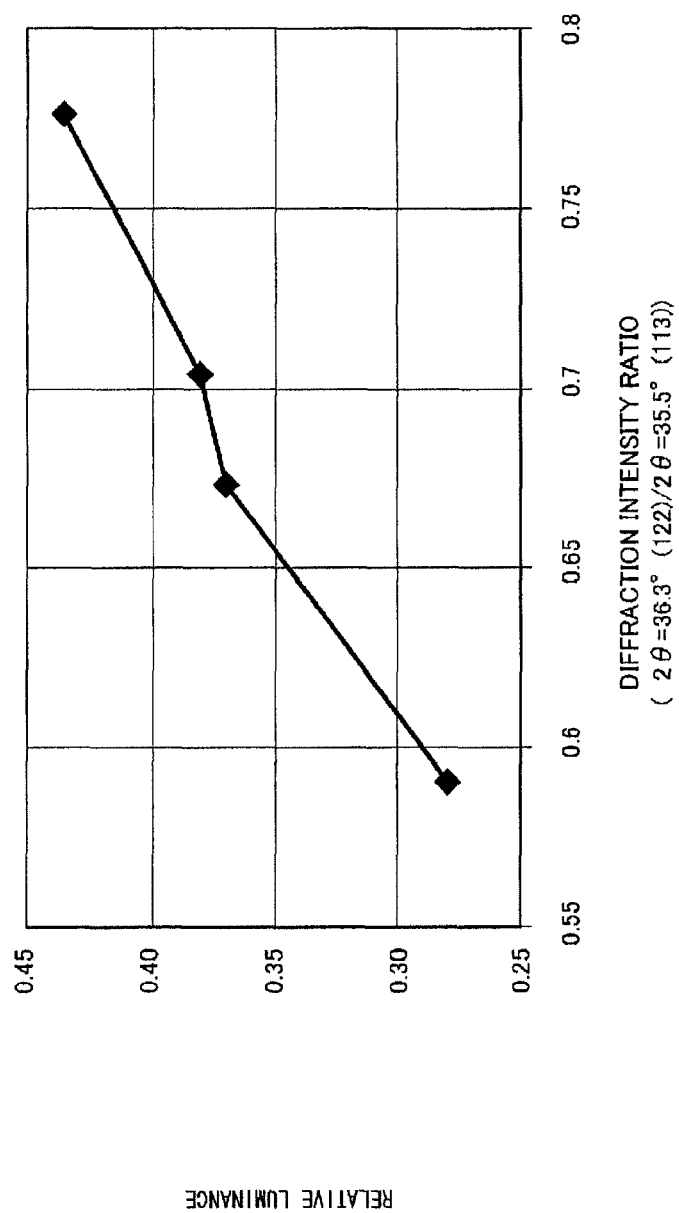
FIG. 36 is a graph showing the relationship between the ratios of the peak intensities at positions of diffraction angles of 36.0° to 36.6° to that at a position of the diffraction angle of 35.0° to 36.0° and the relative luminance.

FIG. 36 shows the relationship between the ratio of the intensity of a peak existing at the position of the angle of diffraction of 36.0° to 36.6° to that of a peak existing at the position of the angle of diffraction of 35.0° to 36.0° and relative luminance. It is seen that relative luminance is improved in direct proportion to the ratio of the intensity of the peak existing at the position of the angle of diffraction of 36.0° to 36.6° to that of the peak existing at the position of the angle of diffraction of 35.0° to 36.0°.

<Summary of Cases where the Calcium Content (($\alpha/(\alpha+\beta)$)=0, 0.1 and 0.2>

Figure 37:
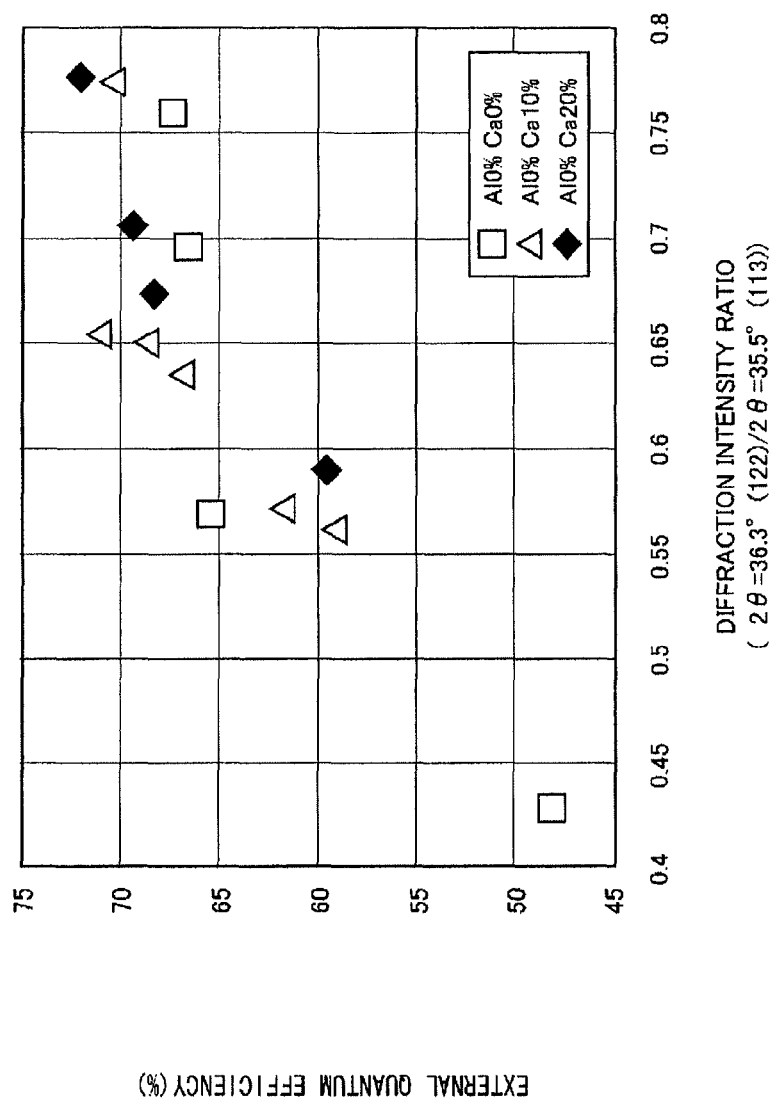
FIG. 37 is a graph showing the relationship between the ratios of the peak intensities at positions of diffraction angles of 36.0° to 36.6° to that at a position of the diffraction angle of 35.0° to 36.0° and the external quantum efficiency.

FIG. 37 shows the relationship between the ratio of the intensity of a peak existing at the position of the angle of diffraction of 36.0° to 36.6° to that of a peak existing at the position of the angle of diffraction of 35.0° to 36.0° and the external quantum efficiency.

It may be seen that, for a range of the calcium content $((\alpha/(\alpha+\beta))$ such that $0 \leq \alpha/(\alpha+\beta) \leq 0.3$, the external quantum efficiency is improved in direct proportion to the ratio of the intensity of the peak existing at the position of the angle of diffraction of 36.0° to 36.6° to that of the peak existing at the position of the angle of diffraction of 35.0° to 36.0°.

It may also be seen that, for a range of ca. 0.58 or higher of the ratio of the intensity of the peak existing at the position of the angle of diffraction of 36.0° to 36.6° to that of the peak existing at the position of the angle of diffraction of 35.0° to 36.0°, the external quantum efficiency exceeds 60%.

It may likewise be seen that, for a range of ca. 0.63 or higher of the ratio of the intensity of the peak existing at the position of the angle of diffraction of 36.0° to 36.6° to that of the peak existing at the position of the angle of diffraction of 35.0° to 36.0°, the external quantum efficiency exceeds 65%.

From the above results, it may be surmised that, in an X-ray diffraction pattern, such a crystal structure in which the ratio of the intensity of the peak existing at the position of the angle of diffraction of 36.0° to 36.6° to that of the peak existing at the position of the angle of diffraction of 35.0° to 36.0° is greater than a preset value contributes to the high quantum efficiency.

6.3 Example 3

Preparation of a Red Phosphor

A red phosphor sample containing the element A, europium (Eu), silicon (Si), carbon (C), oxygen (O) and nitrogen (N) in the following ratios of the numbers of atoms of the following compositional formula (1):

[Chemical formula 5]

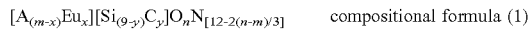

compositional formula (1)

was prepared in the following way in accordance with a sequence of operations explained using the flowchart shown in FIG. 1.

It is observed that, in the compositional formula (1), the element A is the element(s) of the group II at least containing magnesium (Mg), calcium (Ca), strontium (Sr) and barium (Ba). Also, in the compositional formula (1), m, x, y and n satisfy the relationship: $3<m<5$, $0<x<1$, $0<y<9$ and $0<n<10$. Also, with a ratio $\alpha$ of the numbers of atoms of Ca, a ratio $\beta$ of the numbers of atoms of Sr and with a ratio $\gamma$ of the numbers of atoms of another atom of the group II, $m=\alpha+\beta+\gamma$ is to be satisfied.

Initially, the 'raw material mixing step' S1 was carried out. Here, calcium carbonate ($CaCO_3$), strontium carbonate ($SrCO_3$), europium nitride (EuN), silicon nitride ($Si_3N_4$) and melamine ($C_3H_6N_6$) were readied. The raw compounds, thus readied, were weighed and mixed together in an agate mortar in a glove box maintained in a nitrogen atmosphere.

The 'first heat-treatment step' S2 was then carried out. Here, the above mentioned mixture was charged into a crucible of boron nitride and heat-treated at 1400° C. for two hours in a hydrogen ($H_2$) atmosphere to a first sintered product.

The 'first pulverizing step" S3 was then carried out. Here, the above mentioned first sintered product was pulverized in the glove box, maintained in the nitrogen atmosphere, using an agate mortar. The resulting pulverized mass was then passed through a #100 mesh screen, with an opening of ca. 200 μm, to powders of the first sintered product with an average particle size not greater than 3 μm.

The 'second heat-treatment step' S4 was then carried out. Here, the powders of the first sintered product were charged into a crucible of boron nitride and heat-treated at 1800° C. for two hours in an atmosphere of nitrogen ($N_2$) at 0.85 MPa to a second sintered product.

The 'second pulverizing step" S5 was then carried out. Here, the above mentioned second sintered product was pulverized in the glove box, maintained in the nitrogen atmosphere, using an agate mortar. The resulting pulverized mass was then passed through a #420 mesh screen, with an opening of ca. 26 μm, to fine powders with an average particle size of ca. 3.5 μm.

A red phosphor sample in the form of fine powders with an average particle size of ca. 3.5 μm could be obtained by the above process. The red phosphor sample obtained was analyzed in an ICP (Inductively Coupled Plasma) emission analyzer. As a result, it was confirmed that the elements of the compositional formula (1) contained in the compounds of the raw materials were contained in the red phosphor sample in approximately the same molar ratios (ratios of the numbers of atoms).

[Relationship Between the C Content (y) and PLE]

The PLE (Photoluminescence Excitation) spectrum is such a spectrum that indicates how a particular PL emission intensity of interest, at a specific energy, is varied when an excitation wavelength is changed. The present inventors have arrived at the information that the content of carbon (C) that is to be contained in the phosphor in order to obtain the satisfactory emission efficiency has to do with a preset emission characteristic of the PLE spectrum.

Figure 38:
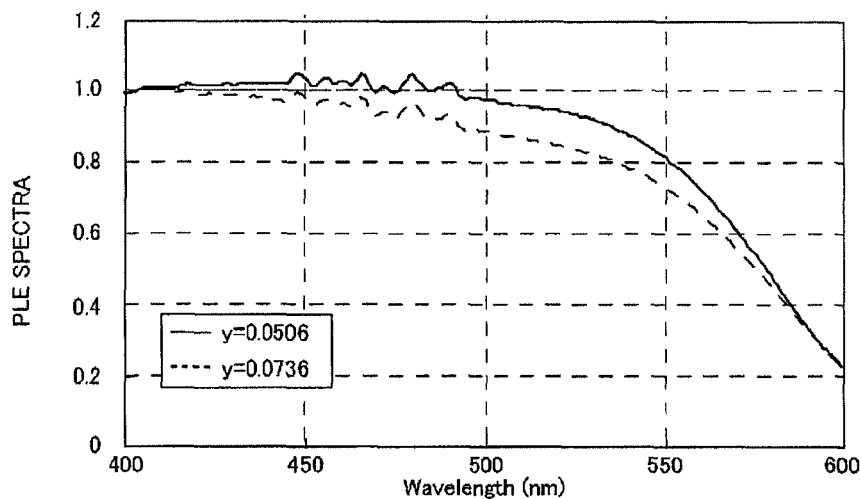
FIG. 38 is a graph showing PLE spectra with the emission intensities at an excitation wavelength of 400 nm of a red phosphor sample of a Ca content of 0% set at 1.
Figure 39:
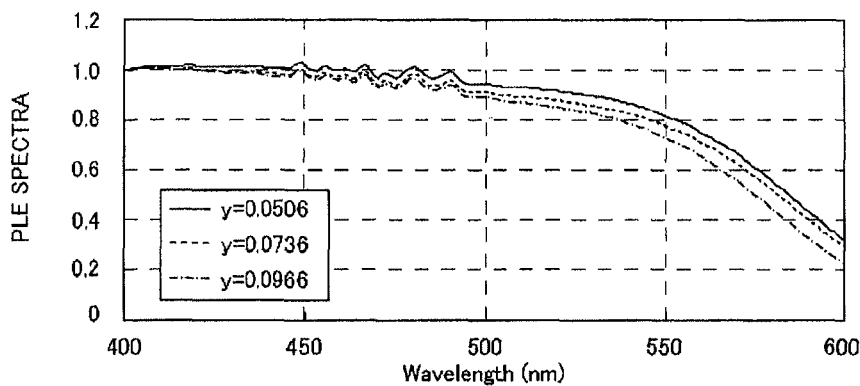
FIG. 39 is a graph showing PLE spectra with the emission intensities at an excitation wavelength of 400 nm of a red phosphor sample of a Ca content of 10% set at 1.
Figure 40:
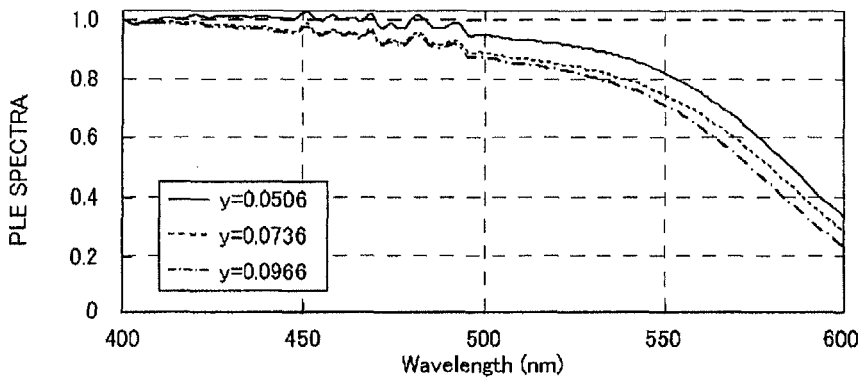
FIG. 40 is a graph showing PLE spectra with the emission intensities at an excitation wavelength of 400 nm of a red phosphor sample of a Ca content of 20% set at 1.

FIG. 38 shows PLE spectra in which the emission intensities at an excitation wavelength of 400 nm of red phosphor samples (m=3.6, x=0.135 and γ=0) are set at 1, with the content of calcium (Ca) ($\alpha/(\alpha+\beta)$) of the red phosphor samples being 0%. Specifically, FIG. 38 shows the PLE spectra of red phosphor samples with the contents of the carbon (C) correlated with the amounts of melamine being 0.0506 and 0.0736. FIG. 39 shows PLE spectra in which the emission intensities at an excitation wavelength of 400 nm of red phosphor samples (m=3.6, x=0.135 and γ=0), with the content of calcium (Ca) ($\alpha/(\alpha+\beta)$) of the red phosphor samples being 10%, are set at 1. Specifically, FIG. 39 shows the PLE spectra of the red phosphor samples with the contents of the carbon (C) correlated with the amounts of melamine being 0.0440, 0.0658 and 0.0875. FIG. 40 shows PLE spectra in which the emission intensities at an excitation wavelength of 400 nm of the red phosphor samples (m=3.6, x=0.135 and γ=0), with the content of calcium (Ca) ($\alpha/(\alpha+\beta)$) of the red phosphor samples being 20%, are set at 1. Specifically, FIG. 40 shows the PLE spectra of red phosphor samples with the contents (y) of carbon (C) correlated with the amounts of melamine being 0.0506, 0.0736 and 0.0966.

The ratio y of the numbers of atoms of carbon (C) was found by fitting, to a straight regression line, the amount of melamine addition R used at the time of preparation of each red phosphor sample. The straight regression line was prepared from the result of analysis of the content (y) of carbon (C) in the red phosphor samples by an ICP emission analyzer and by an in-oxygen-stream combustion-NDIR detection system (a device EMIA-U511 manufactured by HORIBA Ltd.) and from the amount of melamine addition R used at the time of preparation.

It has been confirmed that, in the PLE spectra shown in FIGS. 38 to 40, the relative values of emission intensity at an excitation wavelength of 550 nm, with the emission intensity at an excitation wavelength of 400 nm set at 1, tend to decrease with increase in the content (y) of carbon (C) correlated with the amounts of melamine.

[Evaluation of the Quantum Efficiency Against Eu Content]

For red phosphor samples (m=3.6, ($\alpha/(\alpha+\beta)$)=0 and $\gamma$=0), with the content (x) of europium (Eu) of 0.045, 0.090, 0.135 and 0.180, the quantum efficiency in case of varying the content (y) of carbon (C) was measured using a spectrofluorometer manufactured by JASCO Corporation under the trade name of FP-6500. In measuring the quantum efficiency of a phosphor sample, the fluorescence spectrum was measured as phosphor powders were charged into a dedicated cell and as blue excitation light with a wavelength of 450 nm was irradiated. From the measured result, the quantum efficiency for red light was calculated using the quantum efficiency measurement software annexed to the spectrofluorometer.

The phosphor efficiency is expressed in three ways, that is, in terms of the efficiency in absorbing the excitation light (absorbance), the efficiency of converting the excitation light absorbed into phosphorescent light (internal quantum efficiency) and the efficiency which is the product of the above two efficiencies, that is, the efficiency of converting the excitation light into phosphorescent light (external quantum efficiency). Here, the efficiency of utmost importance, that is, the external quantum efficiency, was calculated.

FIGS. 42, 44, 46 and 48 show, for red phosphor samples (m=3.6, ($\alpha/(\alpha+\beta)$)=0.1 and $\gamma$=0), with the content (x) of europium (Eu) of 0.045, 0.090, 0.135 and 0.180, the external quantum efficiency to the excitation light in case of changing the content (y) of carbon (C), respectively.

FIGS. 43, 45, 47 and 49 show, for red phosphor samples (m=3.6, ($\alpha/(\alpha+\beta)$)=0.1 and $\gamma$=0), with the content (x) of europium (Eu) of 0.045, 0.090, 0.135 and 0.180, respectively, the relative values of emission intensities at an excitation wavelength of 550 nm against changes in the content (y) of carbon (C) in the PLE spectra, provided that the emission intensity at an excitation wavelength of 400 nm is set at 1.

Figure 50:
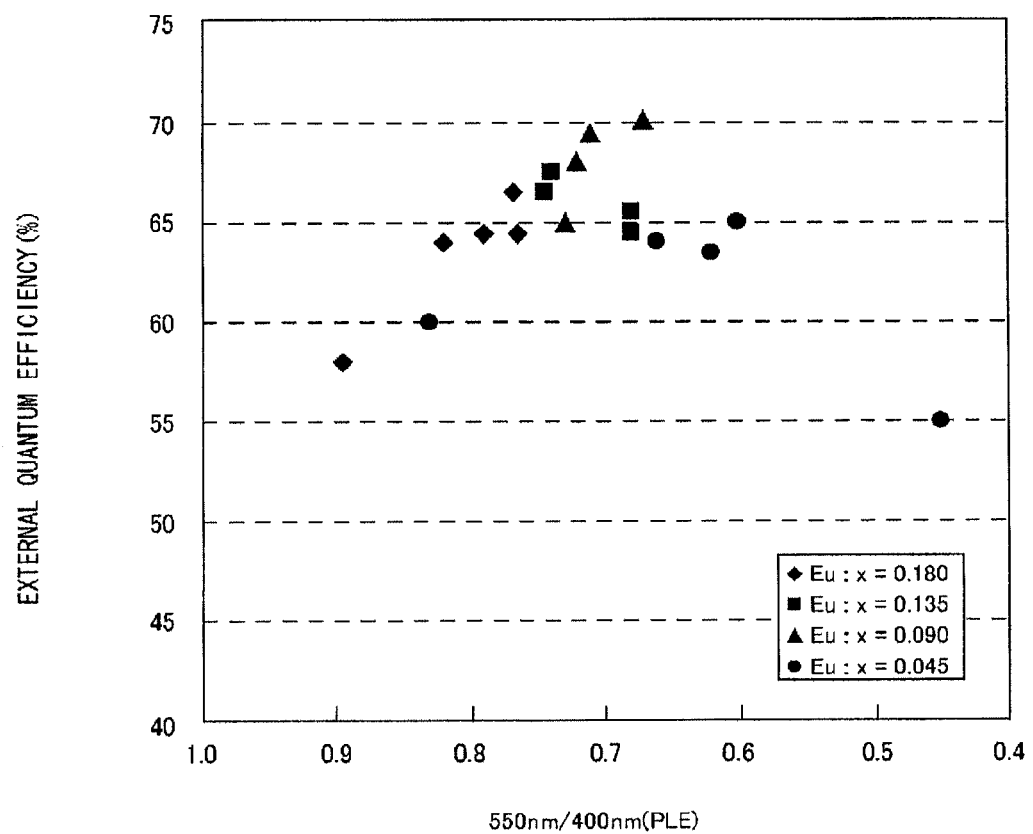
FIG. 50 is a graph showing the relationship between the emission intensities at an excitation wavelength of 550 nm of red phosphor samples (x=0.045, 0.090, 0.135 and 0.180), with the emission intensities thereof at an excitation wavelength of 400 nm set at 1, and the external quantum efficiency.

FIG. 50 shows, for red phosphor samples (m=3.6, ($\alpha/(\alpha+\beta)$)=0.1 and $\gamma$=0), with the content (x) of europium (Eu) of 0.045, 0.090, 0.135 and 0.180, the external quantum efficiency against the relative values of emission intensities at an excitation wavelength of 550 nm in the PLE spectra, provided that the emission intensity at an excitation wavelength of 400 nm is set to 1.

From the results shown in FIGS. 42 to 50, it has been found that the red phosphor samples (m=3.6, ($\alpha/(\alpha+\beta)$)=0.1 and $\gamma$=0), with the content (x) of europium (Eu) of 0.045 to 0.180, exhibit high quantum efficiency if, in the PLE spectra, in which the emission intensity at an excitation wavelength of 400 nm is set at 1, the relative value of the emission intensity at an excitation wavelength of 550 nm ranges from 0.85 or less to 0.46 or more. It has also been found that the external quantum efficiency exceeds 65% in case the relative value of emission intensity ranges from 0.80 or less to 0.65 or more.

[Evaluation of the Quantum Efficiency Against Ca Content]

For red phosphor samples (m=3.6, ($\alpha/(\alpha+\beta)$)=0.135 and $\gamma$=0), with the content of calcium (Ca) ($\alpha/(\alpha+\beta)$) being 0%, 10% and 20%, the quantum efficiency in case of varying the content (y) of carbon (C) was measured using a spectrofluorometer manufactured by JASCO Corporation under the trade name of FP-6500. In measuring the quantum efficiency of the phosphor samples, the fluorescence spectrum was measured as phosphor powders were charged into a dedicated cell and as blue excitation light with a wavelength of 450 nm was irradiated. From the measured result, the quantum efficiency was calculated using the quantum efficiency measurement software annexed to the spectrofluorometer.

Figure 51:
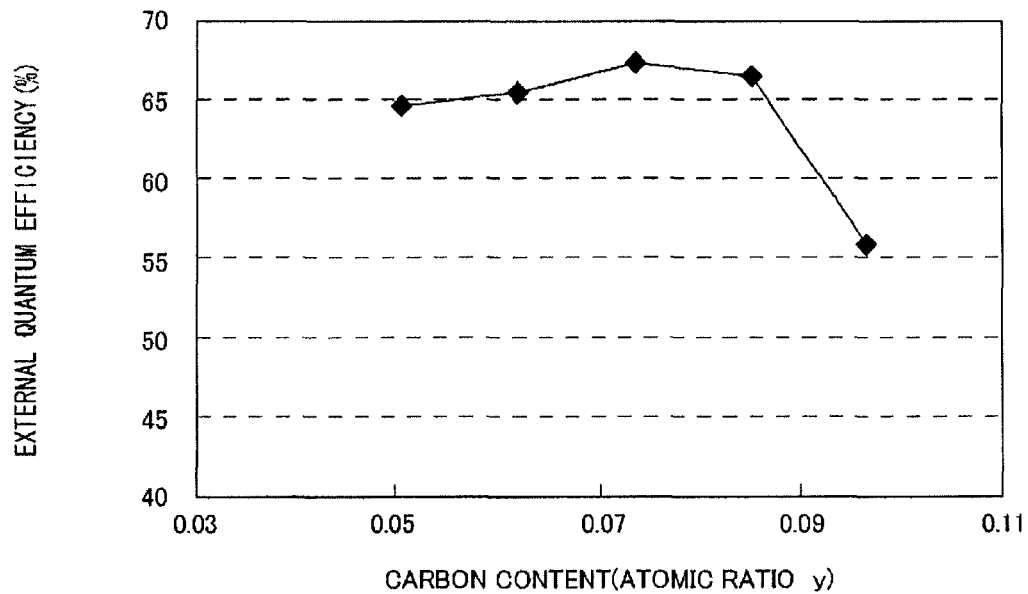
FIG. 51 is a graph showing the external quantum efficiency against changes in the carbon content (y) of red phosphor samples (Ca/(Ca+Sr)=0).
Figure 53:
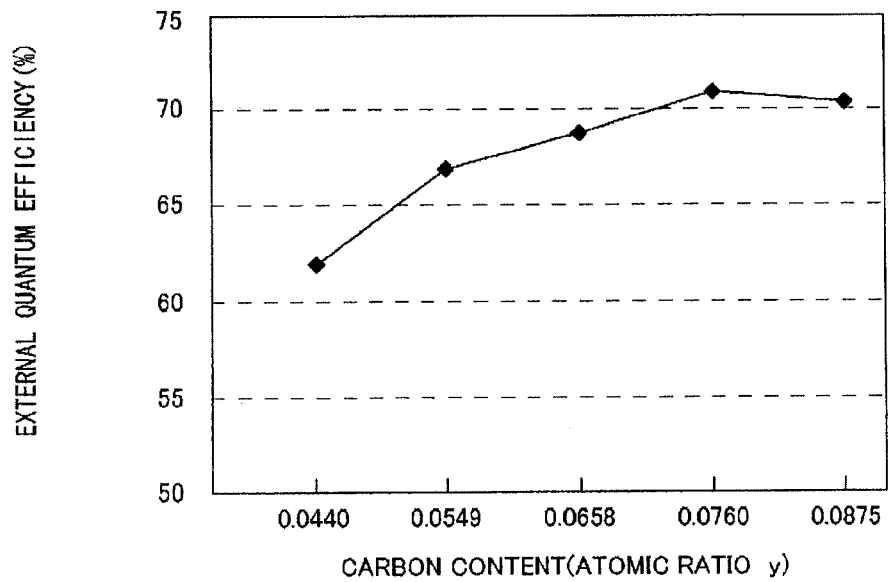
FIG. 53 is a graph showing the external quantum efficiency against changes in the carbon content (y) of red phosphor samples (Ca/(Ca+Sr)=0.1).
Figure 55:
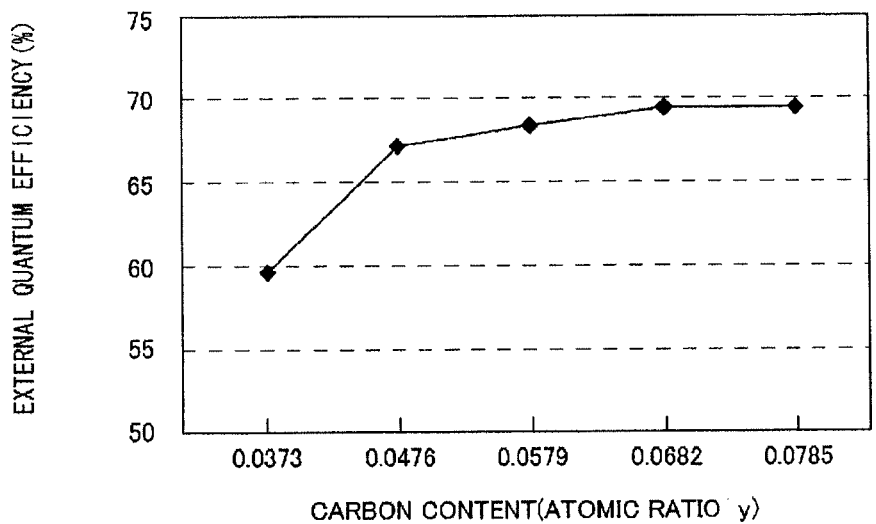
FIG. 55 is a graph showing the external quantum efficiency against changes in the carbon content (y) of red phosphor samples (Ca/(Ca+Sr)=0.2).

FIGS. 51, 53 and 55 show the external quantum efficiency to the excitation light against changes in the content (y) of carbon (C), for red phosphor samples (m=3.6, x=0.135, ($\alpha/(\alpha+\beta)$)=0.1 and $\gamma$=0), with the content ($\alpha/(\alpha+\beta)$) of calcium (Ca) being 0%, 10% and 20%, respectively.

Figure 52:
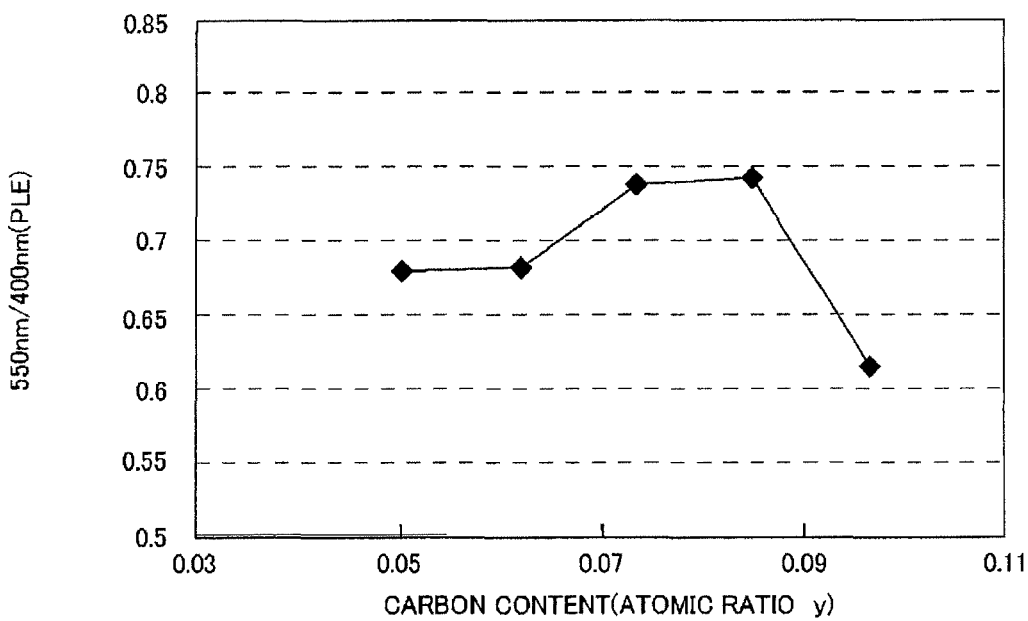
FIG. 52 is a graph showing, in a PLE spectrum, with the emission intensity at an excitation wavelength of 400 nm of a red phosphor sample (Ca/(Ca+Sr)=0) set at 1, the emission intensities thereof at an excitation wavelength of 550 nm against changes in the carbon content (y).
Figure 54:
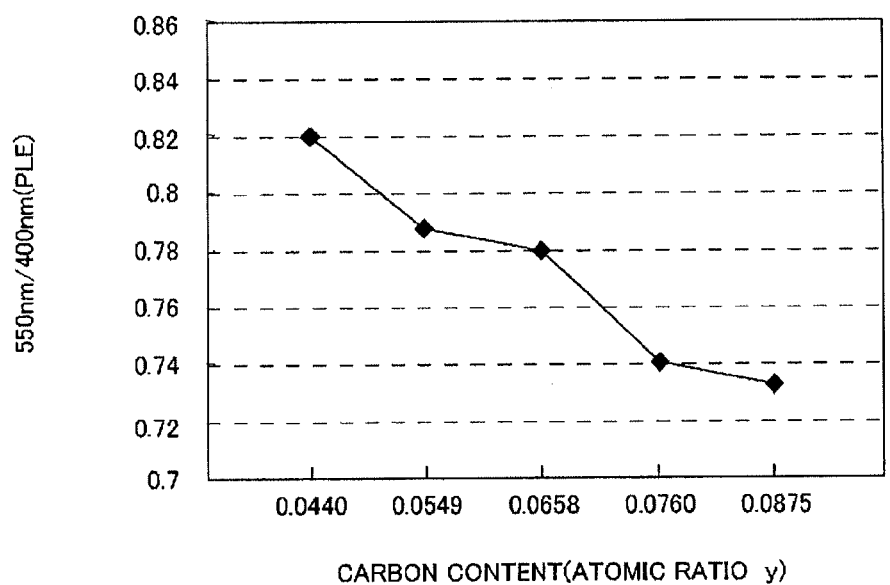
FIG. 54 is a graph showing, in a PLE spectrum, with the emission intensity at an excitation wavelength of 400 nm of a red phosphor sample (Ca/(Ca+Sr)=0.1) set at 1, the emission intensities thereof at an excitation wavelength of 550 nm against changes in the carbon content (y).
Figure 56:
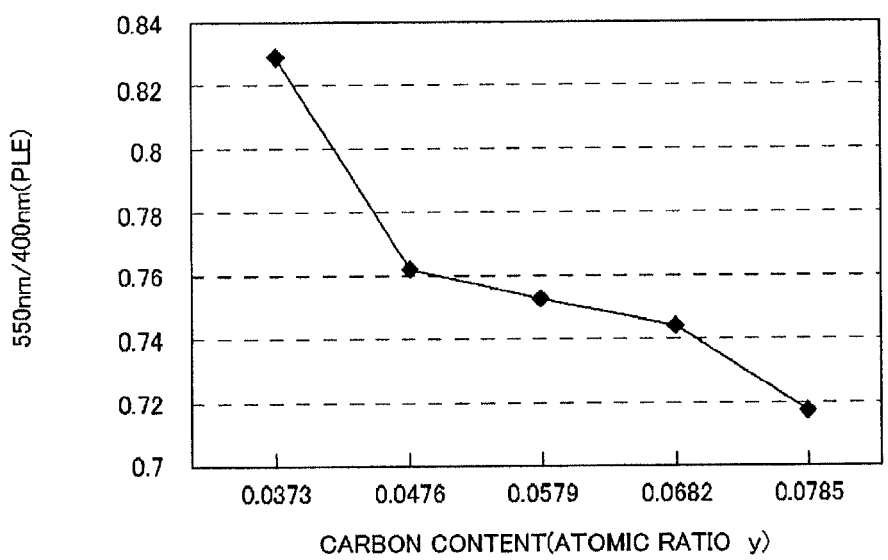
FIG. 56 is a graph showing, in a PLE spectrum, with the emission intensity at an excitation wavelength of 400 nm of a red phosphor sample (Ca/(Ca+Sr)=0.2) set at 1, the emission intensities thereof at an excitation wavelength of 550 nm against changes in the carbon content (y).

FIGS. 52, 54 and 56 respectively show the relative values of emission intensities at an excitation wavelength of 550 nm against changes in the content (y) of carbon (C) in PLE spectra, for red phosphor samples (m=3.6, x=0.135, ($\alpha/(\alpha+\beta)$)=0.1 and $\gamma$=0), with the content ($\alpha/(\alpha+\beta)$) of calcium (Ca) being 0%, 10% and 20%, provided that the emission intensity at an excitation wavelength of 400 nm is set at 1.

Figure 57:
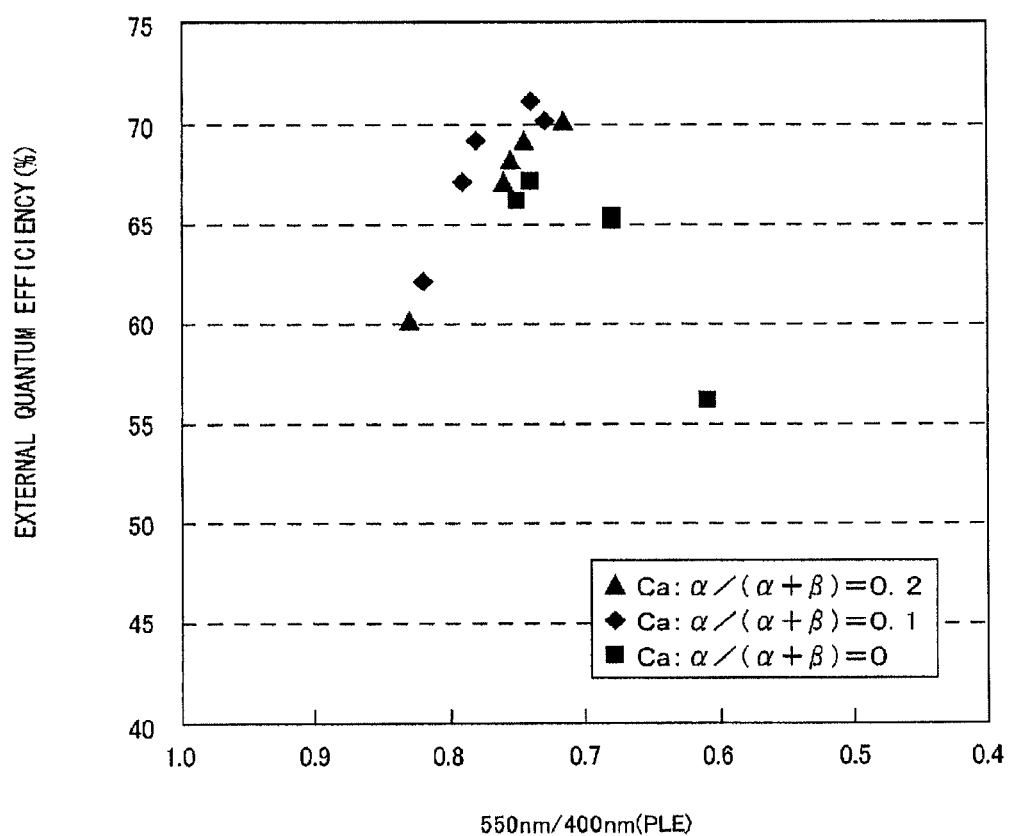
FIG. 57 is a graph showing, with the emission intensity of red phosphor samples (Ca/Ca+Sr)=0, 0.1, 0.2) at an excitation wavelength of 400 nm set at 1, the relationship between the emission intensities thereof at an excitation wavelength of 550 nm and the external quantum efficiency.

FIG. 57 shows the external quantum efficiency against the relative values of emission intensities at an excitation wavelength of 550 nm in PLE spectra for red phosphor samples (m=3.6, x=0.135, ($\alpha/(\alpha+\beta)$)=0 and $\gamma$=0), with the content ($\alpha/(\alpha+\beta)$) of calcium (Ca) being 0%, 10% and 20%, provided that the emission intensity at an excitation wavelength of 400 nm is set at 1.

From the results shown in FIGS. 51 to 57, it has been found that the red phosphor samples (m=3.6, ($\alpha/(\alpha+\beta)$)=0 and $\gamma$=0), with the content ($\alpha/(\alpha+\beta)$) of calcium (Ca) being 0%, 10% and 20%, exhibit high quantum efficiency if, in the PLE spectra, the relative value of emission intensity at an excitation wavelength of 550 nm ranges from 0.85 or less to 0.55 or more. It is noted that, in the PLE spectra, the emission intensity at an excitation wavelength of 400 nm is set at 1. It has also been found that the external quantum efficiency exceeds 65% in case the relative value of the emission intensity ranges from 0.80 or less to 0.65 or more.

From the results shown in FIGS. 51, 53 and 55, it has been found that a red phosphor sample containing calcium (Ca) as the element A has the external quantum efficiency higher than with the red phosphor sample not containing calcium (Ca) as the element A.

From FIGS. 53 and 55, it has also been found that, with the red phosphor sample containing calcium (Ca) as the element A, the external quantum efficiency exceeding 65% may be obtained by increasing the content (y) of carbon (C) with increase in the content of calcium (Ca) by 10%, 20% and so on. It is presumably because the content of carbon (C) to be included in the phosphor to achieve the satisfactory emission efficiency increases with increase in the content ($\alpha/(\alpha+\beta)$) of calcium (Ca).

6.4 Example 4

A red phosphor sample containing the element A, europium (Eu), silicon (Si), carbon (C), oxygen (O) and nitrogen (N) in the following ratios of the numbers of atoms in the following compositional formula (1):

[Chemical formula 6]

$$[A_{(m-x)}Eu_x][Si_{(9-y)}C_y]O_nN_{[12-2(n-m)/3]}$$   compositional formula (1)

was prepared in the following manner in accordance with a sequence of operations explained using the flowchart shown in FIG. 1.

It is observed that, in the compositional formula (1), the element A is the element(s) of the group II at least including calcium (Ca) and strontium (Sr). Also, in the compositional formula (1), m, x, y and n satisfy the relationship: 3<m<5, 0<x<1, 0<y<9 and 0<n<10. Also, with a ratio α of the numbers of atoms of Ca, a ratio β of the numbers of atoms of Sr and with a ratio γ of the numbers of atoms of another atom of the group II, m=α+β+γ is to be satisfied.

Initially, the 'raw material mixing step' S1 was carried out. Here, calcium carbonate ($CaCO_3$), strontium carbonate ($SrCO_3$), europium nitride (EuN), silicon nitride ($Si_3N_4$) and melamine ($C_3H_6N_6$) were readied. The raw compounds, thus readied, were weighed and mixed together in an agate mortar in a glove box maintained in a nitrogen atmosphere.

The 'first heat-treatment step' S2 was then carried out. Here, the above mentioned mixture was charged into a crucible of boron nitride and heat-treated at 1400° C. for two hours in a hydrogen ($H_2$) atmosphere to a first sintered product.

The 'first pulverizing step" S3 was then carried out. Here, the above mentioned first sintered product was pulverized in the glove box, maintained in the nitrogen atmosphere, using an agate mortar. The resulting pulverized mass was then passed through a #100 mesh screen, with an opening of ca. 200 μm, to powders of the first sintered product with an average particle size not greater than 3 μm.

The 'second heat-treatment step' S4 was then carried out. Here, the powders of the first sintered product were charged into a crucible of boron nitride and heat-treated at 1800° C. for two hours in an atmosphere of nitrogen ($N_2$) at 0.85 MPa to a second sintered product.

The 'second pulverizing step" S5 was then carried out. Here, the above mentioned second sintered product was pulverized in the glove box, maintained in the nitrogen atmosphere, using an agate mortar. The resulting pulverized mass was then passed through a #420 mesh screen, with an opening of ca. 26 μm, to fine powders with an average particle size of ca. 3.5 μm.

A red phosphor sample in the form of fine powders with an average particle size of ca. 3.5 μm could be obtained by the above process. The red phosphor sample obtained was analyzed in an ICP (Inductively Coupled Plasma) emission analyzer. As a result, it was confirmed that the elements of the compositional formula (1) contained in the compounds of the raw materials were contained in the red phosphor in approximately the same molar ratios (ratios of the numbers of atoms).

[Evaluation of the Quantum Efficiency Against Ca Content]

For red phosphor samples (m=3.6, x=0.135 and γ=0), with the content of calcium (Ca) being 0%, 10% and 20%, the quantum efficiency in case of varying the content (y) of carbon (C) was measured using a spectrofluorometer manufactured by JASCO Corporation under the trade name of FP-6500. In measuring the quantum efficiency of the phosphor samples, the spectrum of fluorescent light was measured as phosphor powders were charged into a dedicated cell and as blue excitation light with a wavelength of 450 nm was irradiated. From the measured result, the quantum efficiency was calculated using the quantum efficiency measurement software annexed to the spectrofluorometer.

The efficiency of the phosphor is expressed in three ways, that is, in terms of the efficiency in absorbing the excitation light (absorbance), the efficiency of converting the excitation light absorbed into phosphorescent light (internal quantum efficiency) and the efficiency which is the product of the above two efficiencies, that is, the efficiency of converting the excitation light into phosphorescent light (external quantum efficiency). Of these, the external quantum efficiency is of utmost importance.

Figure 58:
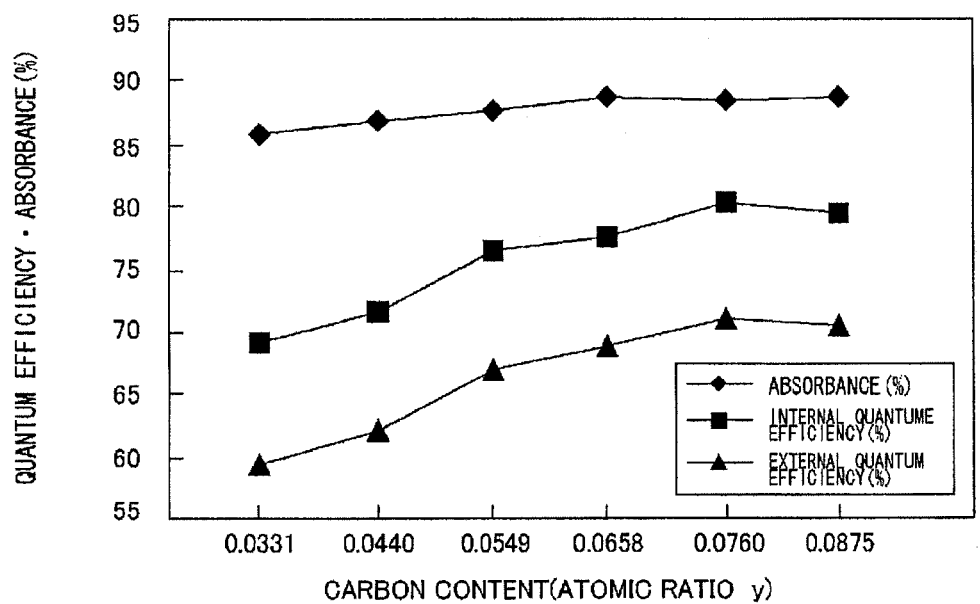
FIG. 58 is a graph showing the absorbance for the excitation light, internal quantum efficiency and the external quantum efficiency of red phosphor samples with the Ca content of 10%.
Figure 59:
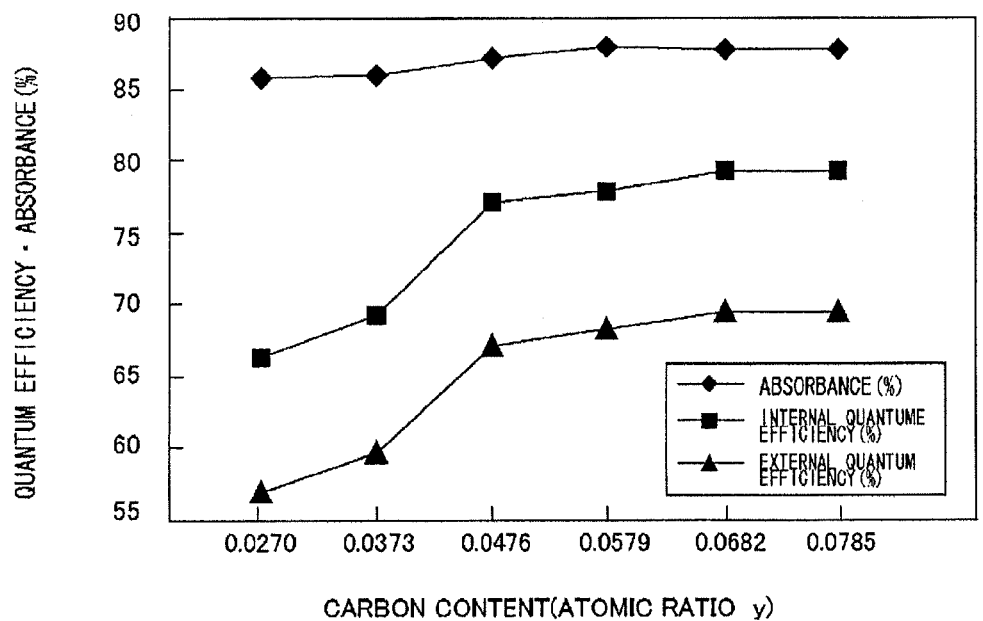
FIG. 59 is a graph showing the absorbance for the excitation light, internal quantum efficiency and the external quantum efficiency of red phosphor samples with the Ca content of 20%.

FIG. 58 shows the absorbance to the excitation light, internal quantum efficiency and the external quantum efficiency against changes in the content (y) of carbon (C) in red phosphor samples with the content of calcium (Ca) (α/(α+β)) being 10% (m=3.6, x=0.135, α/(α+β)=0.1 and γ=0). FIG. 59 shows the absorbance to the excitation light, internal quantum efficiency and the external quantum efficiency against changes in the content (y) of carbon (C) in red phosphor samples with the content (ratio of the numbers of atoms α/(α+β)) of calcium (Ca) being 20% (m=3.6, x=0.135, α/(α+β)=0.2 and γ=0). Also, FIG. 60 shows the absorbance to the excitation light, internal quantum efficiency and the external quantum efficiency against changes in the content (y) of carbon (C) in red phosphor samples with the content (α/(α+β)) of calcium (Ca) being 0% (m=3.6, x=0.135, α/(α+β)=0 and γ=0).

Figure 41:
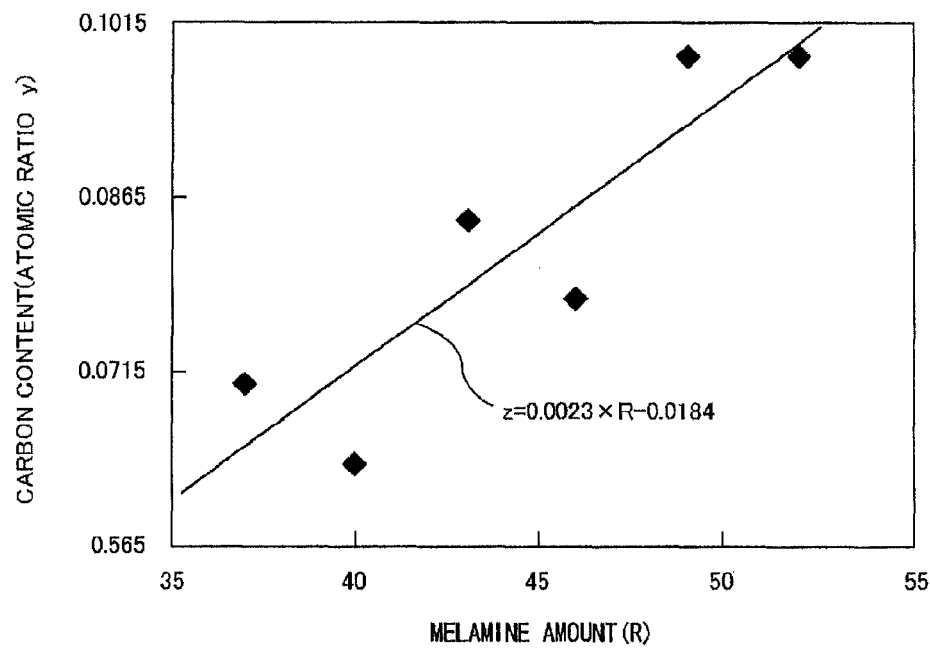
FIG. 41 is a graph showing the relationship between the results of analysis of the content (y) of carbon (C) of red phosphor samples by an ICP emission analyzer and the amount of addition of melamine R used at the time of preparation of the red phosphor samples.
Figure 42:
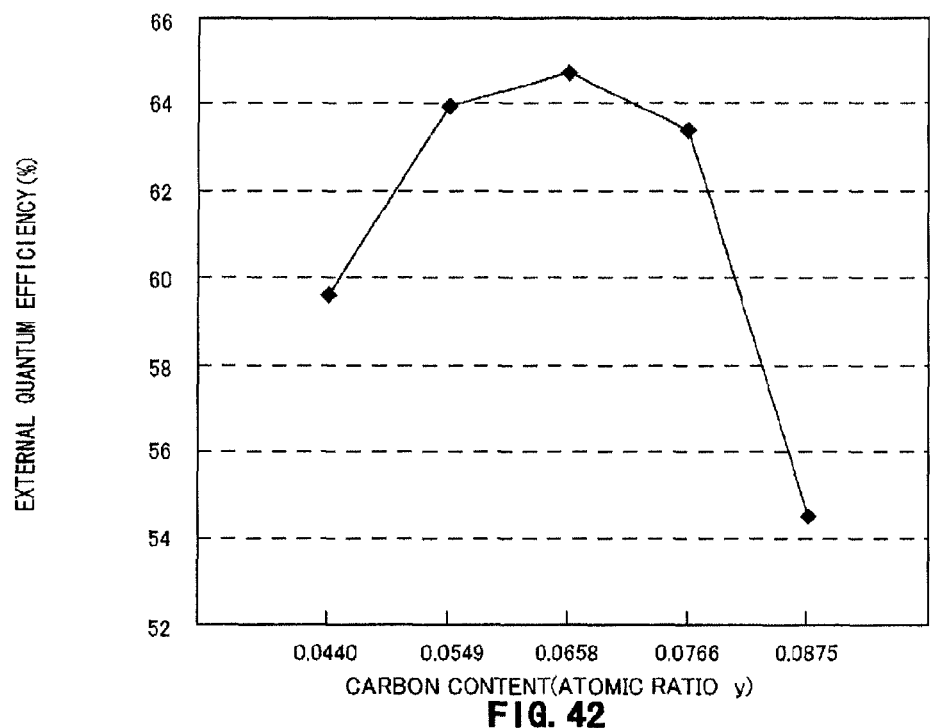
FIG. 42 is a graph showing the external quantum efficiency against changes in the carbon content (y) for red phosphor samples (x=0.045).
Figure 43:
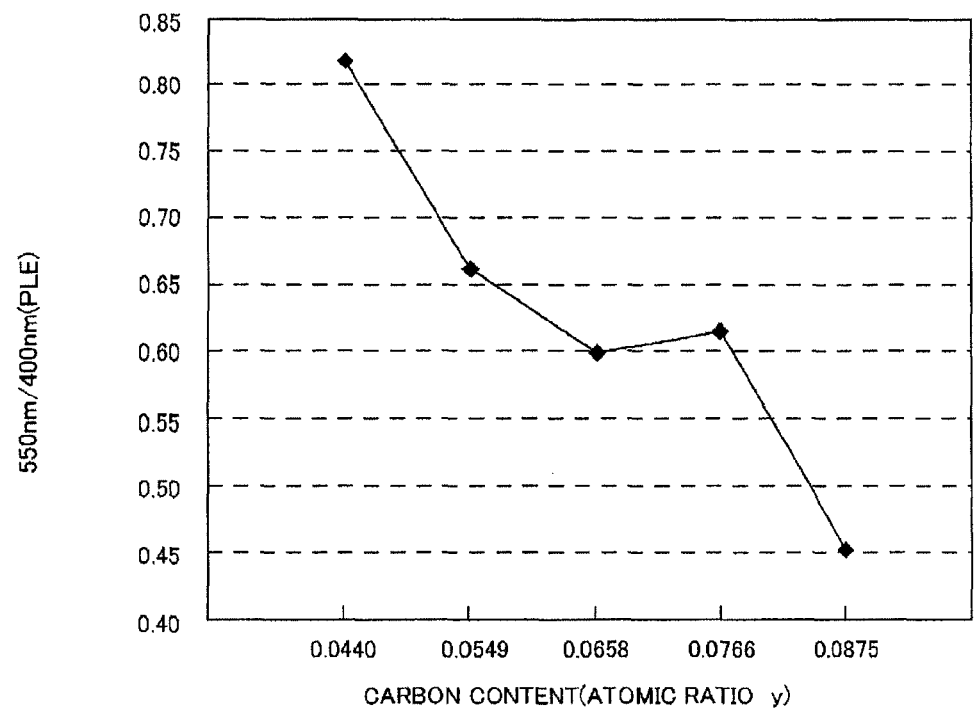
FIG. 43 is a graph showing, in a PLE spectrum, with the emission intensity at an excitation wavelength of 400 nm of a red phosphor sample (x=0.045) set at 1, the emission intensities thereof at an excitation wavelength of 550 nm against changes in the carbon content (y).
Figure 44:
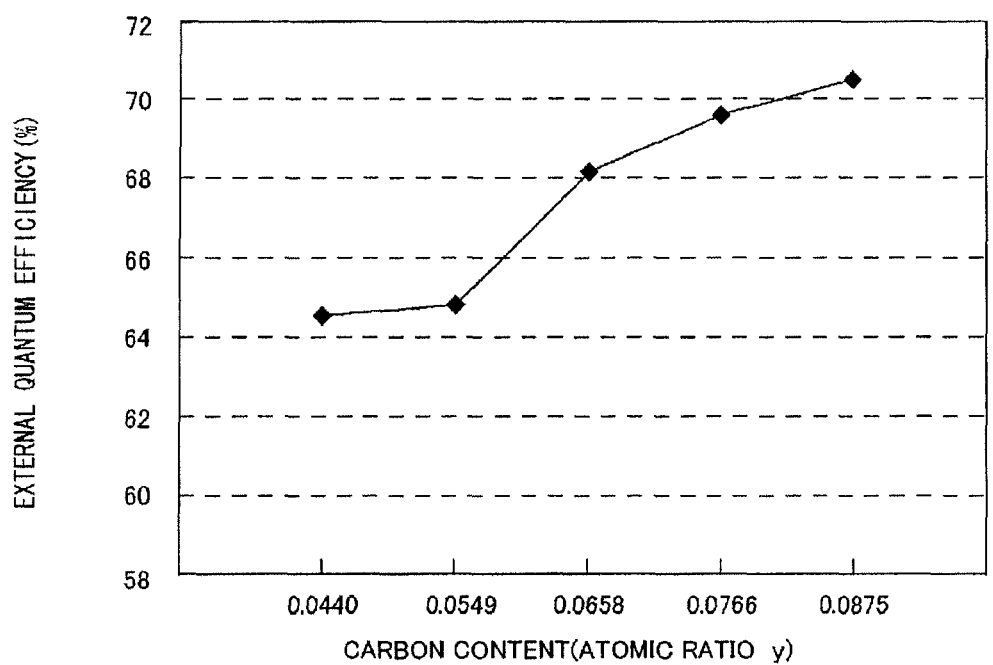
FIG. 44 is a graph showing the external quantum efficiency against changes in the carbon content (y) of red phosphor samples (x=0.090).
Figure 45:
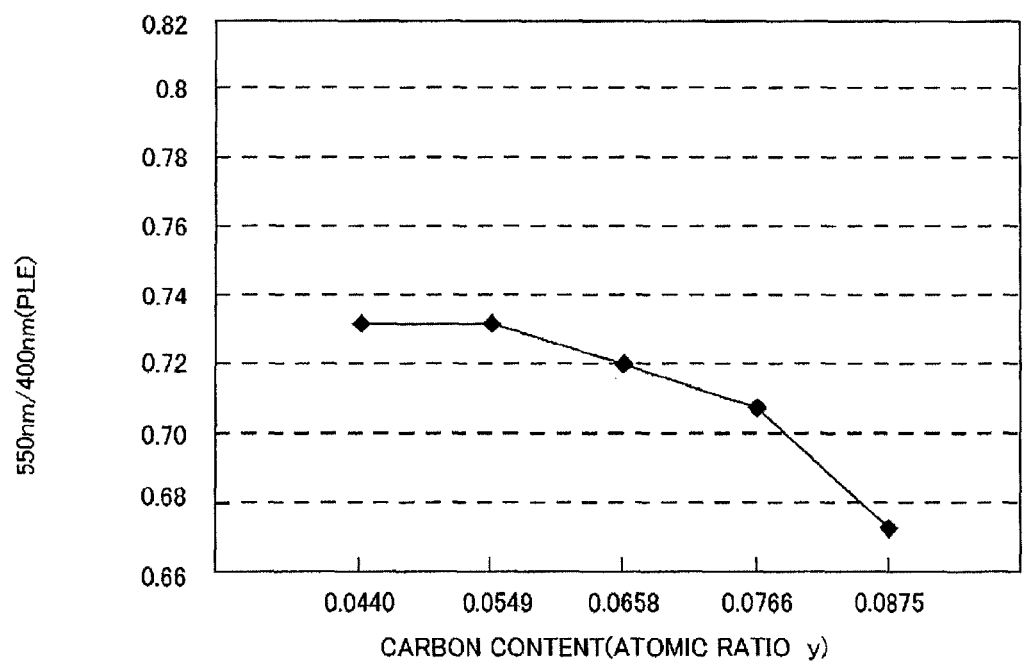
FIG. 45 is a graph showing, in a PLE spectrum, with the emission intensity at an excitation wavelength of 400 nm of a red phosphor sample (x=0.090) set at 1, the emission intensities thereof at an excitation wavelength of 550 nm against changes in the carbon content (y).
Figure 46:
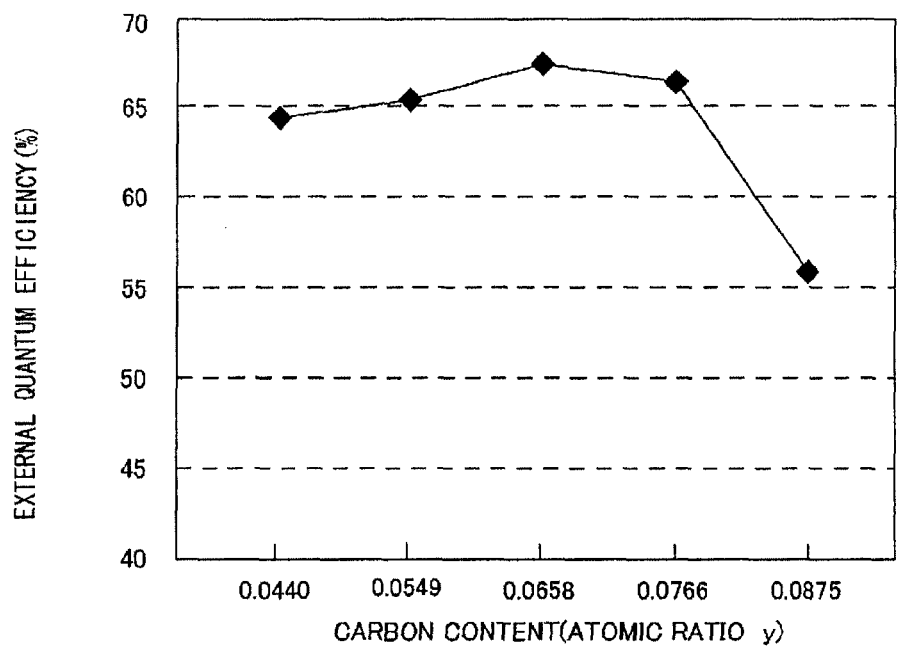
FIG. 46 is a graph showing the external quantum efficiency against changes in the carbon content (y) of red phosphor sample samples (x=0.135).
Figure 47:
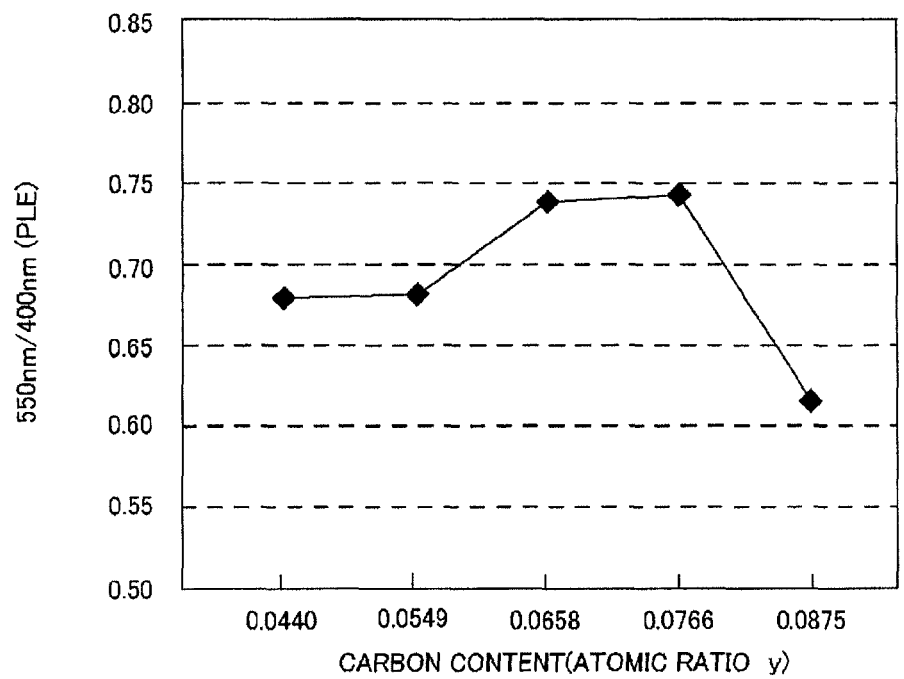
FIG. 47 is a graph showing, in a PLE spectrum, with the emission intensity at an excitation wavelength of 400 nm of a red phosphor sample (x=0.135) set at 1, the emission intensities thereof at an excitation wavelength of 550 nm against changes in the carbon content (y).
Figure 48:
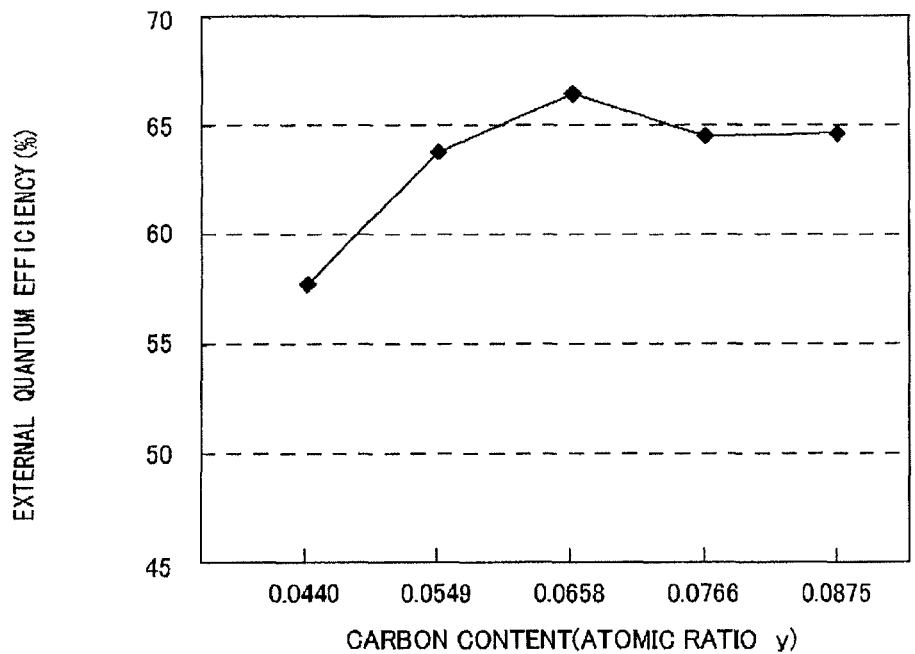
FIG. 48 is a graph showing the external quantum efficiency against changes in the carbon content (y) of red phosphor samples (x=0.180).
Figure 49:
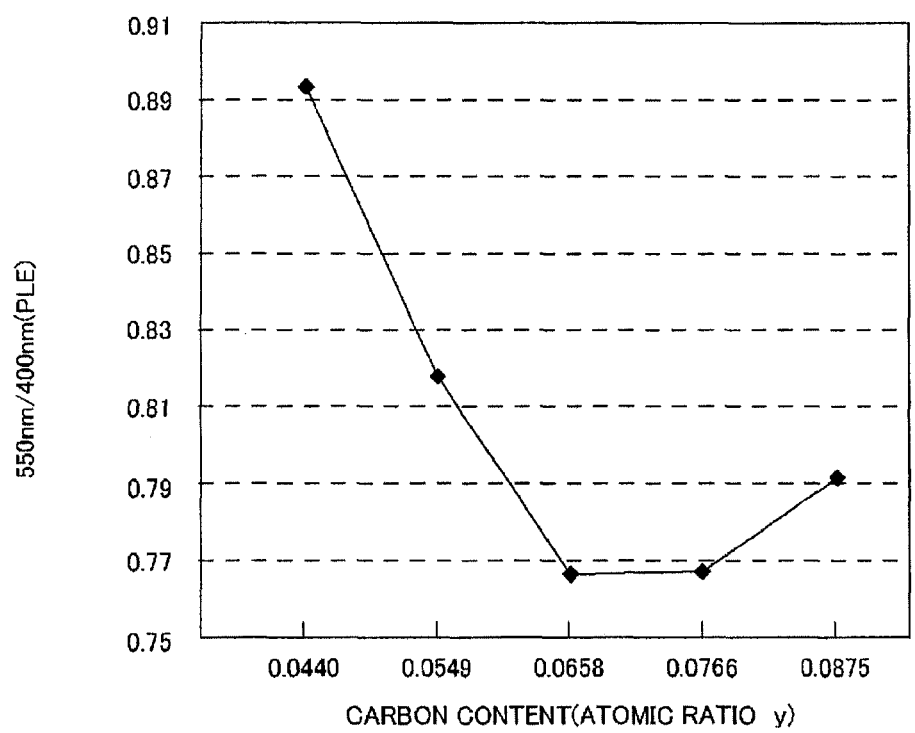
FIG. 49 is a graph showing, in a PLE spectrum with the emission intensity at an excitation wavelength of 400 nm of a red phosphor sample (x=0.180) set at 1, the emission intensities thereof at an excitation wavelength of 550 nm against changes in the carbon content (y).
Figure 61:
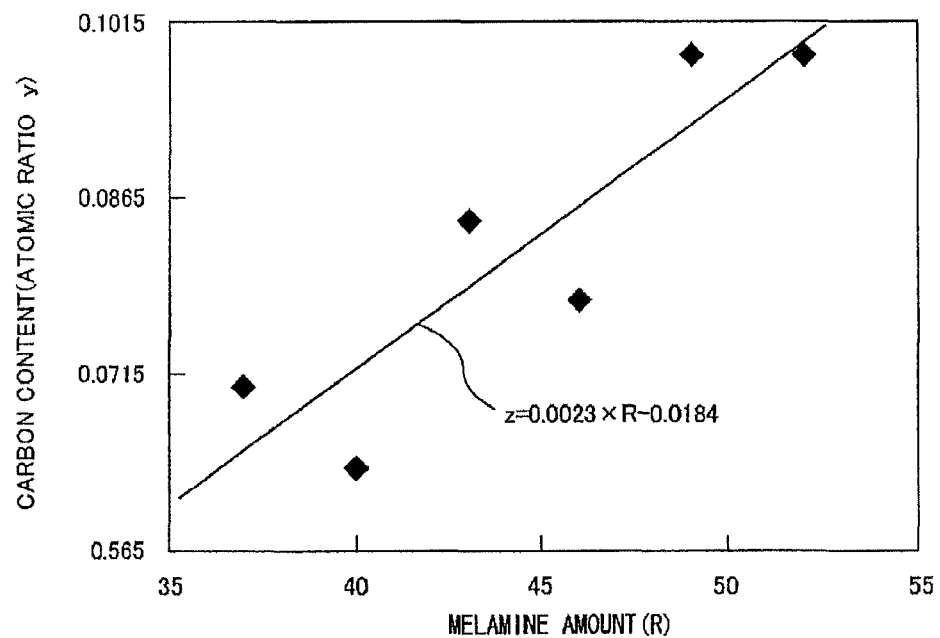
FIG. 61 is a graph showing the relationship between the result of analysis by an ICP emission analyzer of the content of carbon (C) in red phosphor samples and the amount of addition of melamine used at the time of preparation of the red phosphor samples.

The ratio y of the numbers of atoms of carbon (C) in the Example was found by fitting to a straight regression line the amount of melamine addition R used at the time of preparing each red phosphor sample. The regression line was drawn from the result of analysis of the content (y) of carbon (C) in the red phosphor sample by an ICP emission analyzer and by an in-oxygen-stream combustion-NDIR detection system (a device EMIA-U511 manufactured by), and from the amount of melamine addition R at the time of preparation, as shown in FIG. 61 It is noted that FIG. 61 corresponds to FIG. 41.

Figure 60:
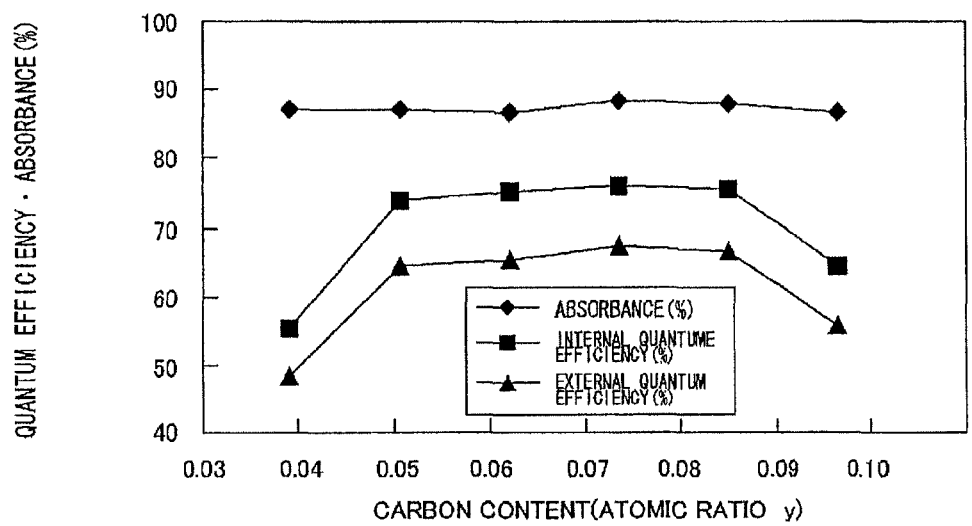
FIG. 60 is a graph showing the absorbance for the excitation light, internal quantum efficiency and the external quantum efficiency of red phosphor samples with the Ca content of 0%.

From the results shown in FIGS. 58 to 60, it has been found that a red phosphor sample containing calcium (Ca) as the element A has the external quantum efficiency higher than with the red phosphor sample not containing calcium (Ca) as the element A.

From FIGS. 58 and 59, it has also been found that, with the red phosphor sample containing calcium (Ca) as the element A, the external quantum efficiency exceeding 65% may be obtained by increasing the content (y) of carbon (C) with increase in the content of calcium (Ca) (α/(α+β) by 10%, 20% and so on. It is presumably because the content of carbon (C) to be included in the phosphor to achieve the satisfactory emission efficiency increases with increase in the content (α/(α+β)) of calcium (Ca).

Conversely, with the red phosphor not containing calcium (Ca) as the element A (α/(α+β)=0), shown in FIG. 60, the external quantum efficiency exceeding 65% could not be obtained even if the content (y) of carbon (C) is increased. This is presumably due to removal of oxygen (O) without change in the content of carbon (C) which is to be contained in the phosphor sample to obtain the satisfactory emission efficiency.

[Evaluation of Integrated Emission, Peak Wavelength and Emission Spectrum Against Ca Content]

The integrated emission, peak wavelength and the emission spectra of red phosphor samples with differing Ca contents (m=3.6, x=0.135 and γ=0) were measured using a spectrophotometer manufactured by JOBIN YVON under the trade name of SPEC Fuorolog-3, as an excitation light of 450 nm was irradiated.

Figure 62:
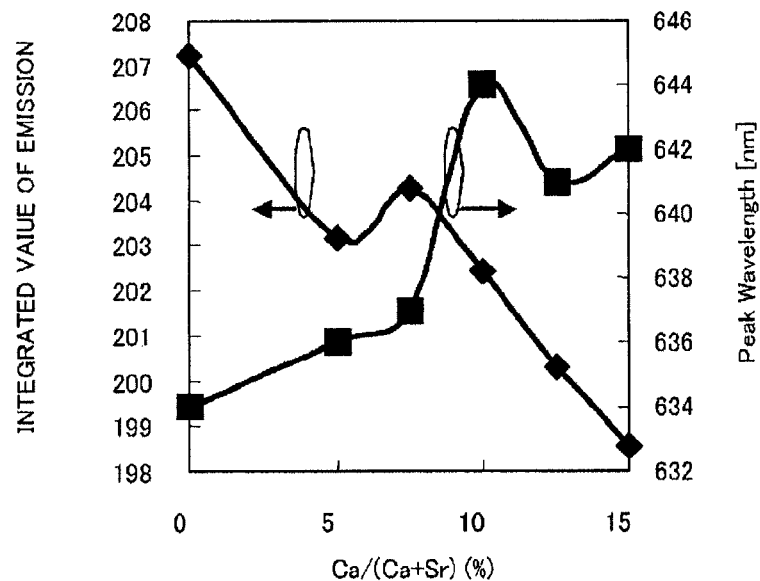
FIG. 62 is a graph showing integrated emission and the peak wavelength of red phosphor samples in case the content of C is fixed and that of Ca is varied.
Figure 63:
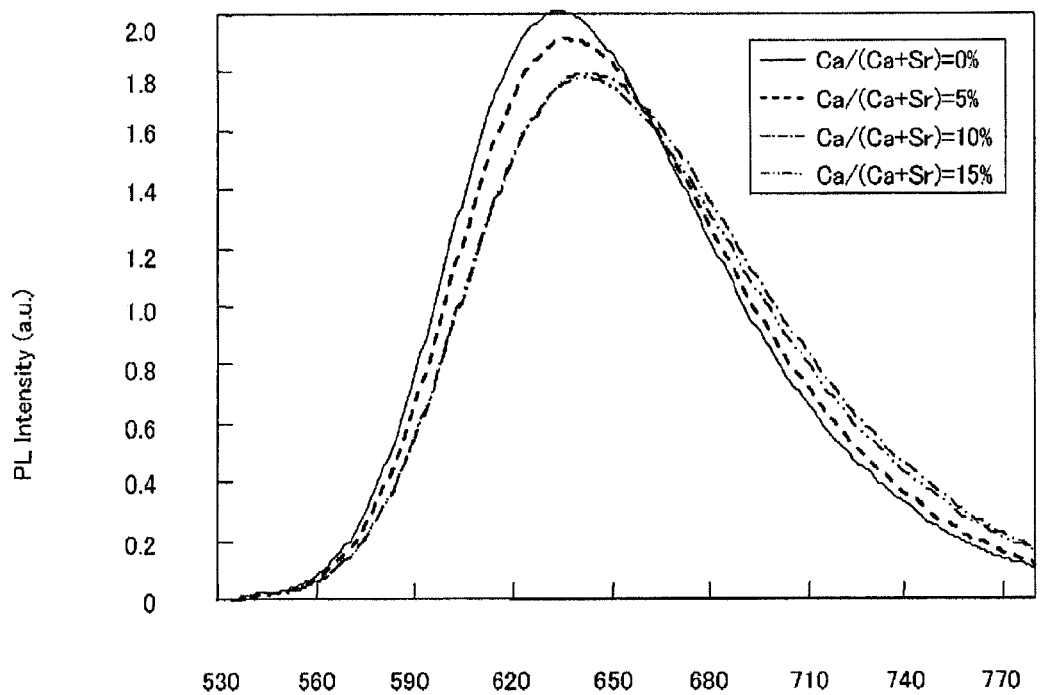
FIG. 63 is a graph showing emission spectra of red phosphor samples in case the content of C is fixed and that of Ca is varied.

FIG. 62 shows integrated emission and the peak wavelength of red phosphor samples in which the amount of melamine (y=0.0739) is fixed and in which the content (α/(α+β)) of calcium (Ca) is changed from 0% through 5%, 7.5%, 10% and 12.5% to 15%. FIG. 63 shows emission spectra of the red phosphor samples.

Figure 64:
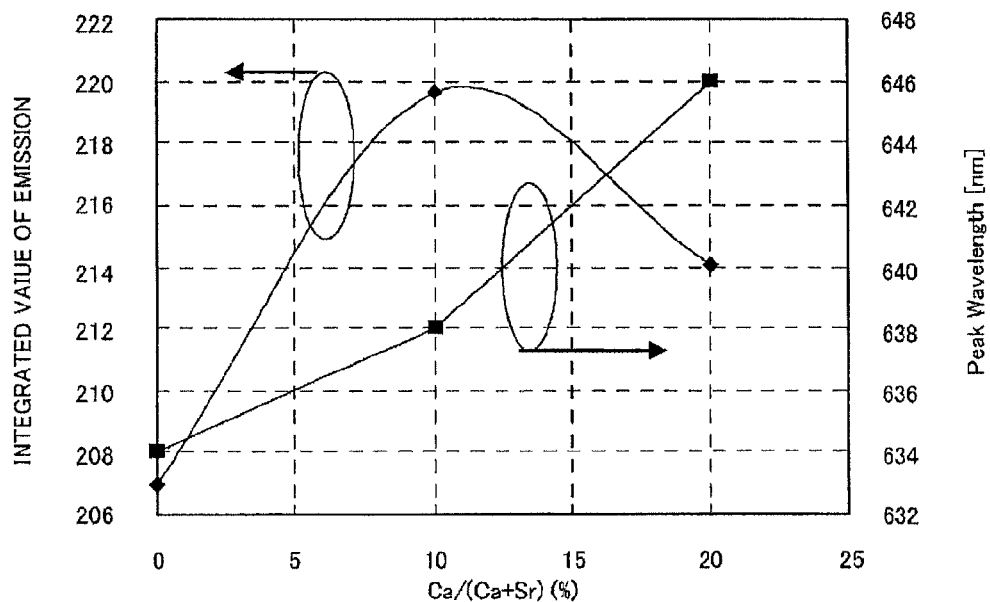
FIG. 64 is a graph showing integrated emission and the peak wavelength of red phosphor samples for the Ca content of 0% (y=0.0739), 10% (y=0.0851) and 20% (y=0.0851).
Figure 65:
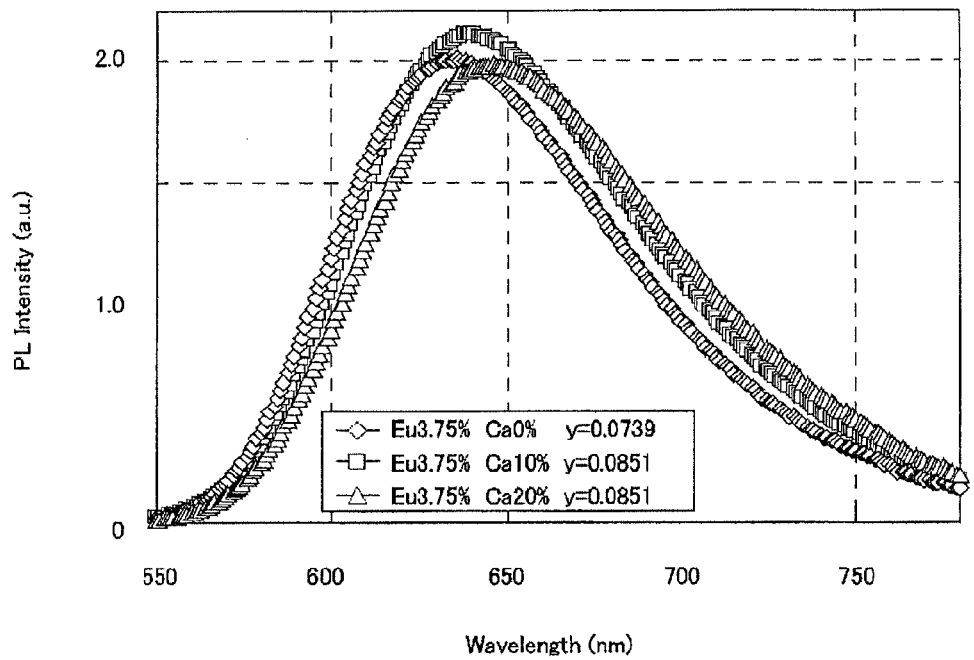
FIG. 65 is a graph showing emission spectra of red phosphor samples for the Ca content of 0% (y=0.0739), 10% (y=0.0851) and 20% (y=0.0851).

FIG. 64 shows integrated emission and the peak wavelength of red phosphor samples in which the contents of calcium (Ca) ($\alpha/(\alpha+\beta)$) are 0% (y=0.0739), 10% (y=0.0776) and 20% (y=0.0785). FIG. 65 shows emission spectra of these red phosphor samples.

It is seen from FIGS. 62 and 63 that, if the amount of melamine (y=0.0739) is fixed and the value of the content of calcium (Ca) is increased, the integrated emission tends to be decreased. However, it has been found that, if the amount of melamine is increased with increase in the content ($\alpha/(\alpha+\beta)$) of calcium (Ca) (y=0.0739→0.0785), the integrated emission is increased.

[Evaluation of the Peak Wavelength and Luminance Against the C Content (y)]

The peak wavelength and the luminance of red phosphor samples with the contents ($\alpha/(\alpha+\beta)$) of calcium (Ca) of 0%, 10% and 20% (m=3.6, x=0.135 and γ=0) were measured against changes in the amount of melamine, using a spectrophotometer manufactured by JOBIN YVON under the trade name of SPEC Fuorolog-3, as excitation light of 450 nm was irradiated.

Figure 66:
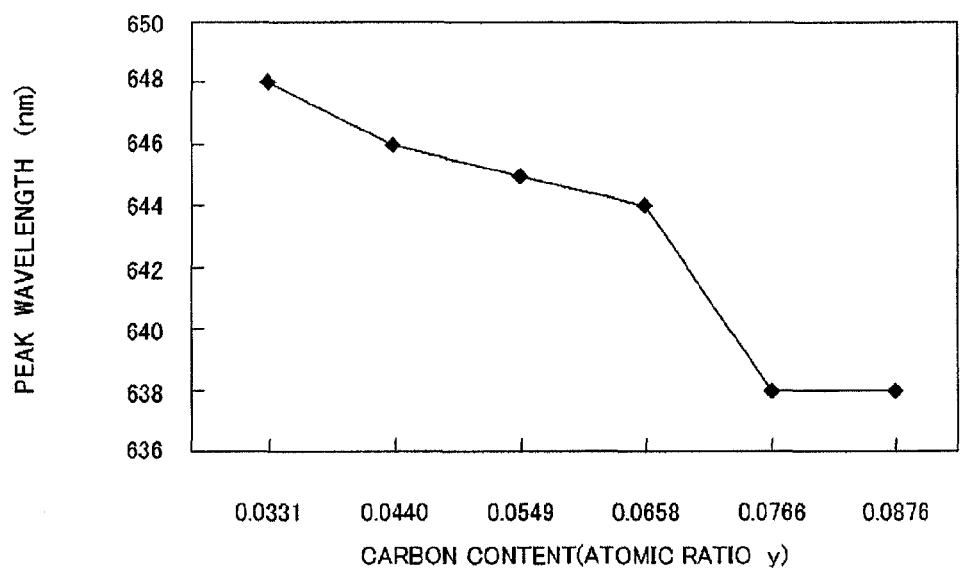
FIG. 66 is a graph showing peak wavelengths of red phosphor samples with Ca content of 10% against changes in the content (y) of carbon (C).
Figure 67:
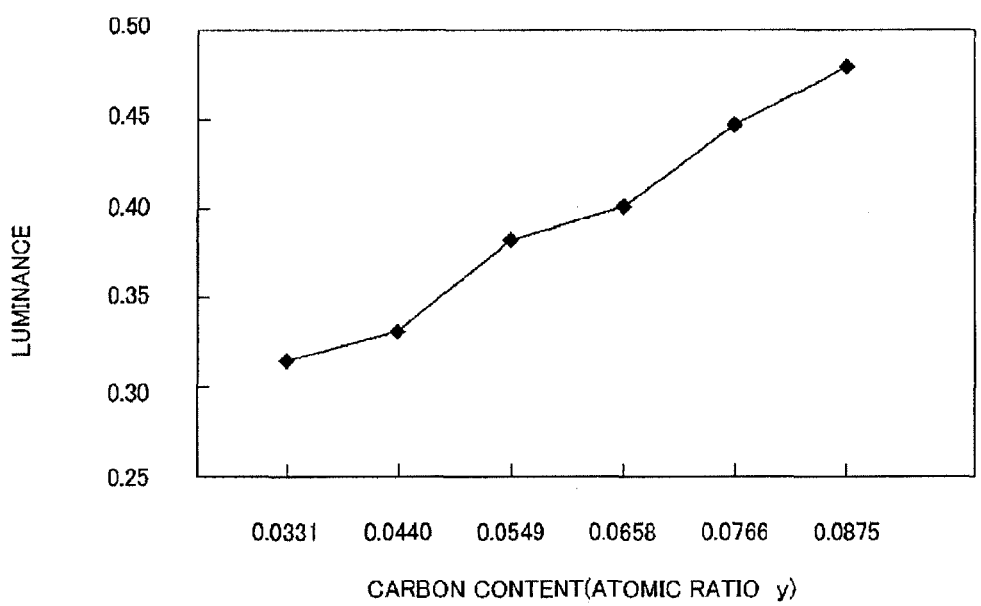
FIG. 67 is a graph showing the luminance of red phosphor samples with Ca content of 10% against changes in the content (y) of carbon (C).
Figure 68:
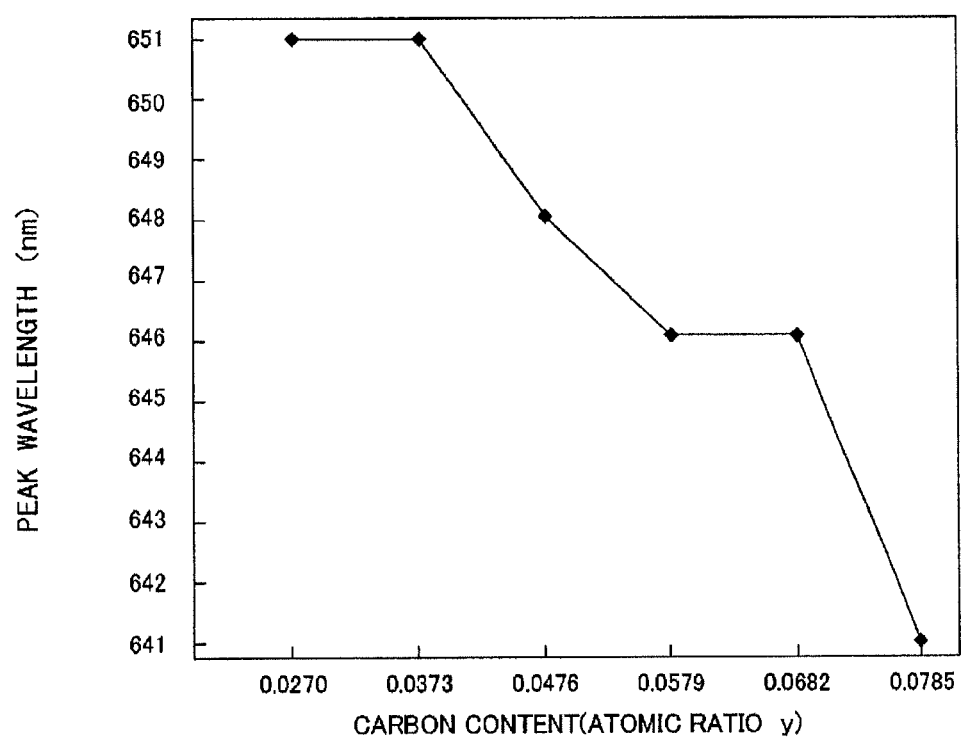
FIG. 68 is a graph showing the peak wavelengths of red phosphor samples with Ca content of 20% against changes in the content (y) of carbon (C).
Figure 69:
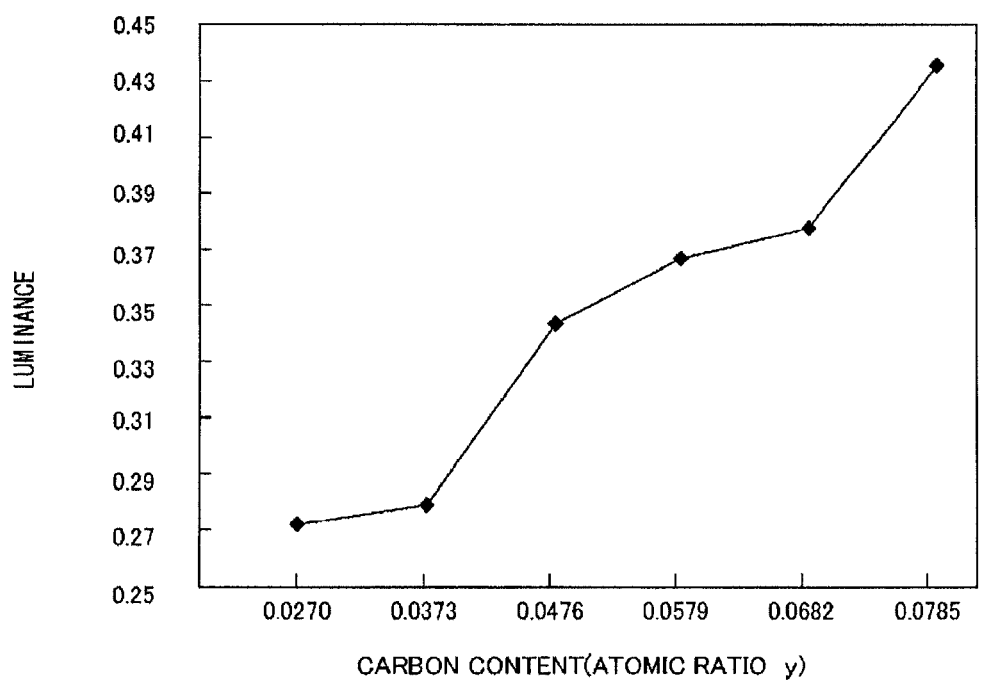
FIG. 69 is a graph showing the luminance of red phosphor samples with Ca content of 20% against changes in the content (y) of carbon (C).
Figure 70:
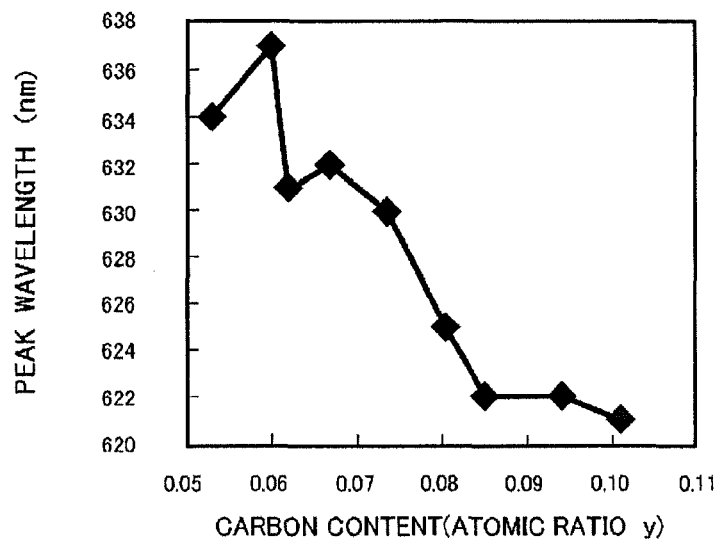
FIG. 70 is a graph showing peak wavelengths of red phosphor samples with Ca content of 0% against changes in the content (y) of carbon (C).
Figure 71:
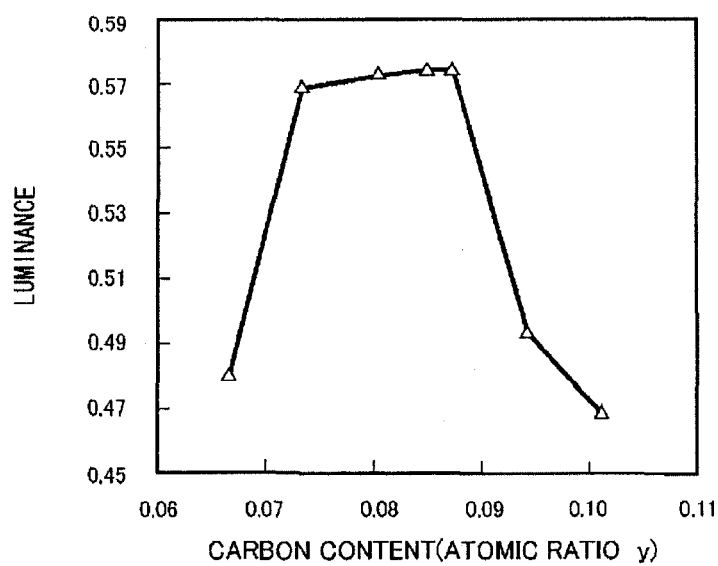
FIG. 71 is a graph showing the luminance of red phosphor samples with Ca content of 0% against changes in the content (y) of carbon (C).

FIGS. 66 and 67 show the peak wavelength and luminance of red phosphor samples, with the content ($\alpha/(\alpha+\beta)$) of calcium (Ca) of 10%, against changes in the amounts of melamine addition, respectively. FIGS. 68 and 69 show the peak wavelength and luminance of the red phosphor samples, with the content ($\alpha/(\alpha+\beta)$) of calcium (Ca) of 20%, against changes in the amounts of melamine addition, respectively. FIGS. 70 and 71 show the peak wavelength and luminance of the red phosphor samples, with the content ($\alpha/(\alpha+\beta)$) of calcium (Ca) of 0%, against changes in the amounts of melamine addition, respectively. It is observed that FIGS. 70, 71 correspond to FIGS. 7(A) and 7(B), respectively.

Referring to FIGS. 66, 68 and 70, the tendency for the peak wavelength to shift to the longer wavelength side with increase in the content ($\alpha/(\alpha+\beta)$) of calcium (Ca) is apparent. Also, the tendency for the peak wavelength to shift to the shorter wavelength side with increase in the content (y) of carbon (C) correlated with the amount of melamine is apparent. It may thus be seen that the peak wavelength may be adjusted by varying the content ($\alpha/(\alpha+\beta)$) of calcium (Ca) and the content (y) of carbon (C).

Referring to FIGS. 67, 69 and 71, the tendency for the luminance to decrease with increase in the content of calcium (Ca) is apparent. Likewise, the tendency for the luminance to increase with increase in the content (y) of carbon (C) correlated with the amount of melamine is apparent.

[Relationship Between the Content (y) of C and PLE]

The PLE (Photoluminescence Excitation) spectrum is such a spectrum that indicates how the PL emission intensity of interest, at a specific energy, is varied with changes in the excitation wavelength. The present inventors have arrived at the information that the content of carbon (C) that is to be contained in the phosphor to obtain the satisfactory emission efficiency has to do with a preset emission characteristic of the PLE spectrum.

Figure 72:
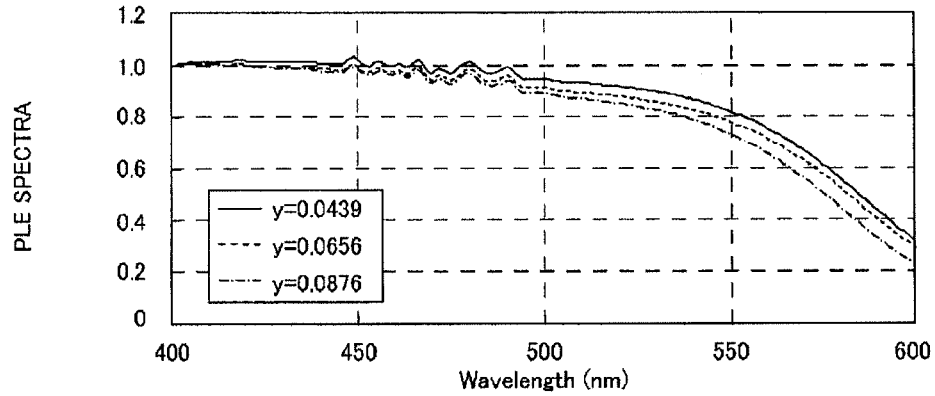
FIG. 72 is a graph showing PLE spectra with emission intensities at an excitation wavelength of 400 nm of red phosphor samples of Ca content of 10% set at 1.
Figure 73:
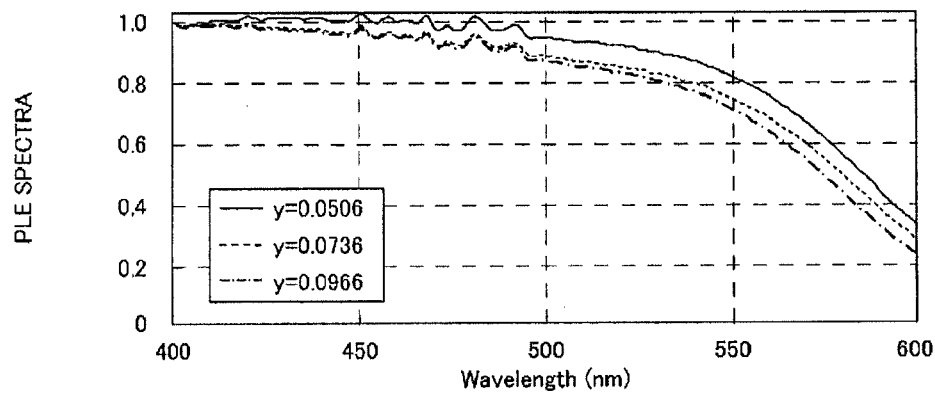
FIG. 73 is a graph showing PLE spectra with emission intensities at an excitation wavelength of 400 nm of red phosphor samples of Ca content of 20% set at 1.
Figure 74:
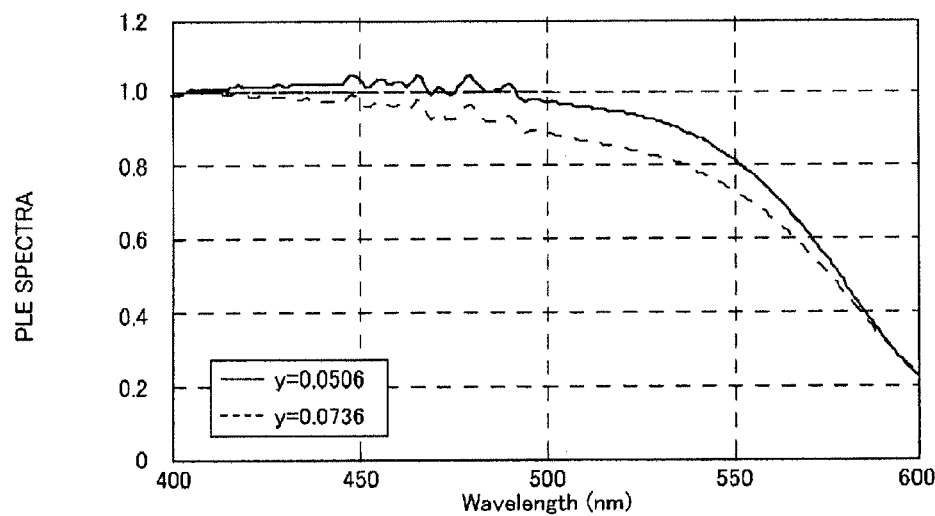
FIG. 74 is a graph showing PLE spectra with emission intensities at an excitation wavelength of 400 nm of red phosphor samples of Ca content of 0% set at 1.

FIG. 72 shows PLE spectra in which the emission intensities at an excitation wavelength of 400 nm of red phosphor samples (m=3.6, x=0.135 and γ=0), with the content of calcium (Ca) ($\alpha/(\alpha+\beta)$) of the red phosphor samples being 10%, are set at 1. Specifically, FIG. 72 shows the PLE spectra of the red phosphor samples with the contents of the carbon (C) correlated with the amounts of melamine being 0.0506, 0.0656 and 0.0876. FIG. 73 shows PLE spectra in which the emission intensities at an excitation wavelength of 400 nm of red phosphor samples (m=3.6, x=0.135 and γ=0), with the content of calcium (Ca) ($\alpha/(\alpha+\beta)$) of the red phosphor sample being 20%, are set at 1. Specifically, FIG. 73 shows the PLE spectra of the red phosphor samples, with the contents of carbon (C), correlated with the amounts of melamine, being 0.0506, 0.0579 and 0.0785. FIG. 74 shows PLE spectra in which the emission intensities at an excitation wavelength of 400 nm of red phosphor samples (m=3.6, x=0.135 and γ=0), with the content of calcium (Ca) ($\alpha/(\alpha+\beta)$) of the red phosphor sample being 0%, are set at 1. Specifically, FIG. 74 shows the PLE spectra of the red phosphor samples, with the contents of the carbon (C), correlated with the amounts of melamine, being 0.0506 and 0.0736. FIGS. 72 to 74, correspond to FIGS. 39, 40 and 38, respectively.

In the PLE spectra, shown in FIGS. 72 to 74, the relative values of the emission intensities at the excitation wavelength of 550 nm, for the emission intensities at the excitation wavelength of 400 nm set at 1, tend to decrease with increase in the content (y) of carbon (C) correlated with the amounts of melamine. That is, the range of the relative values of 0.82 or less to 0.70 or more at the emission intensities of 550 nm in the PLA spectra, with the emission intensities at the excitation wavelength of 400 nm set at 1, may be re-calculated into a range of the content (y) of carbon (C) correlated with the amounts of melamine of 0.012 or more to 0.10 or less.

In short, it has been seen that, with the emission intensities at the excitation wavelength of 400 nm set at 1, high integrated emission may be obtained in case the relative values of the emission intensities at the excitation wavelength of 550 nm are 0.82 or less, preferably in a range from 0.82 or less to 0.70 or more.

It should be understood by those skilled in the art that various modifications, combinations, sub-combinations and alterations may occur depending on design requirements and other factors insofar as they are within the scope of the appended claims or the equivalents thereof.

The invention claimed is:

1. A method for producing a red phosphor comprising:
   mixing a carbonate of an element A, europium nitride, silicon nitride and melamine to form a mixture so that the element A, europium (Eu), silicon (Si) and carbon (C) have the ratios of the numbers of atoms according to the compositional formula (1):

[Chemical Formula 2]

$$[A_{(m-x)}Eu_x][Si_{(9-y)}C_y]O_nN_{[12-2(n-m)/3]} \quad \text{compositional formula (1)}$$

where the element A is at least one of magnesium (Mg), calcium (Ca), strontium (Sr) and barium (Ba), and where m, x, y and n in the compositional formula (1) satisfy the relationships of 3<m<5, 0<x<1, 0<y<9 and 0<n<10;
   sintering the mixture to a sintered product; and
   pulverizing the sintered product,
   wherein the ratio of the intensity of a peak existing at a position of the diffraction angle of 36.0° to 36.6° to that at a position of the diffraction angle of 35.0° to 36.0° in an X-ray diffraction pattern is 0.58 or higher.

2. The method for producing a red phosphor according to claim 1, wherein the alkali earth metal element A includes at least calcium (Ca) and strontium (Sr) and wherein, with a ratio α of the number of atoms of Ca, a ratio β of the number of atoms of Sr and with a ratio γ of another element of the group II, the relationships (m=α+β+γ) and 0≤α/(α+β)≤0.3 are met.

3. A white light source comprising:
a blue light emitting diode provided on a device substrate; and
a kneaded mass arranged on the blue light emitting diode,
wherein the kneaded mass is a mass of a transparent resin obtained on kneading a red phosphor and a green phosphor together,
wherein the red phosphor containing an element A, europium (Eu), silicon (Si), carbon (C), oxygen (O) and nitrogen (N) in ratios of the numbers of atoms of the following compositional formula (1):

[Chemical Formula 1]

$$[A_{(m-x)}Eu_x][Si_{(9-y)}C_y]O_nN_{[12-2(n-m)/3]} \quad \text{compositional formula (1)}$$

where the element A is at least one of magnesium (Mg), calcium (Ca), strontium (Sr) and barium (Ba), and
where m, x, y and n in the compositional formula (1) satisfy the relationships of $3<m<5$, $0<x<1$, $0<y<9$ and $0<n<10$, and
wherein the ratio of the intensity of a peak existing at a position of the diffraction angle of 36.0° to 36.6° to that at a position of the diffraction angle of 35.0° to 36.0° in an X-ray diffraction pattern is 0.58 or higher.

4. The white light source according to claim 3, wherein the alkali earth metal element A includes at least calcium (Ca) and strontium (Sr) and wherein, with a ratio $\alpha$ of the number of atoms of Ca, a ratio $\beta$ of the number of atoms of Sr and with a ratio $\gamma$ of another element of the group II, the relationships $(m=\alpha+\beta+\gamma)$ and $0\leq\alpha/(\alpha+\beta)\leq0.3$ are met.

5. An illumination device comprising:
a plurality of white light sources arranged on an illumination substrate, each white light source including a blue light emitting diode provided or a device substrate; and
a kneaded mass arranged cm the blue light emitting diode,
wherein the kneaded mass is a mass of to transparent resin obtained on kneading a red phosphor and a green phosphor together,
wherein the red phosphor containing an element A, europium (Eu), silicon (Si), carbon (C), oxygen (O) and nitrogen (N) in ratios of the numbers of atoms of the following compositional formula (1):

[Chemical Formula 4]

$$[A_{(m-x)}Eu_x][Si_{(9-y)}C_y]O_nN_{[12-2(n-m)/3]} \quad \text{compositional formula (1)}$$

where the element A is at least one of magnesium (Mg), calcium (Ca), strontium (Sr) and barium (Ba), and
where m, x, y and n in the compositional formula (1) satisfy the relationships of $3<m<5$, $0<x<1$, $0<y<9$ and $0<n<10$, and
wherein the ratio of the intensity of a peak existing at a position of the diffraction angle of 36.0° to 36.6° to that at a position of the diffraction angle of 35.0° to 36.0° in an X-ray diffraction pattern is 0.58 or higher.

6. The illumination device according to claim 5, wherein the alkali earth metal element A includes at least calcium (Ca) and strontium (Sr) and wherein, with a ratio $\alpha$ of the number of atoms of Ca, a ratio $\beta$ of the number of atoms of Sr and with a ratio $\gamma$ of another element of the group II, the relationships $(m=\alpha+\beta+\gamma)$ and $0\leq\alpha/(\alpha+\beta)\leq0.3$ are met.

7. A liquid crystal display comprising:
a liquid crystal display panel; and
a backlight obtained using a plurality of white light sources, the backlight illuminating the liquid crystal display panel;
each white light source including a blue light emitting diode provided on a device substrate; and
a kneaded mass arranged on the blue light emitting diode,
wherein the kneaded mass is a mass of a transparent resin obtained on kneading a red phosphor and a green phosphor together,
wherein the red phosphor containing an element A, europium (Eu), silicon (Si), carbon (C), oxygen (O) and nitrogen (N) in ratios of the numbers of atoms of the following compositional formula (1):

[Chemical Formula 5]

$$[A_{(m-x)}Eu_x][Si_{(9-y)}C_y]O_nN_{[12-2(n-m)/3]} \quad \text{compositional formula (1)}$$

where the element A is at least one of magnesium (Mg), calcium (Ca), strontium (Sr) and barium (Ba), and
where m, x, y and n in the compositional formula (1) satisfy the relationships of $3<m<5$, $0<x<1$, $0<y<9$ and $0<n<10$, and
wherein the ratio of the intensity of a peak existing at a position of the diffraction angle of 36.0° to 36.6° to that at a position of the diffraction angle of 35.0° to 36.0° in an X-ray diffraction pattern is 0.58 or higher.

8. The liquid crystal display according to claim 7, wherein the alkali earth metal element A includes at least calcium (Ca) and strontium (Sr) and wherein, with a ratio $\alpha$ of the number of atoms of Ca, a ratio $\beta$ of the number of atoms of Sr and with a ratio $\gamma$ of another element of the group II, the relationships $(m=\alpha+\beta+\gamma)$ and $0\leq\alpha/(\alpha+\beta)\leq0.3$ are met.

* * * * *